(12) United States Patent
Yamazaki et al.

(10) Patent No.: US 10,115,631 B2
(45) Date of Patent: Oct. 30, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Kenichi Okazaki, Tochigi (JP); Masahiro Katayama, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/608,539

(22) Filed: May 30, 2017

(65) Prior Publication Data

US 2017/0263497 A1 Sep. 14, 2017

Related U.S. Application Data

(63) Continuation of application No. 15/151,539, filed on May 11, 2016, now Pat. No. 9,673,234, which is a continuation of application No. 14/564,156, filed on Dec. 9, 2014, now Pat. No. 9,349,751.

(30) Foreign Application Priority Data

Dec. 12, 2013 (JP) .................. 2013-257517

(51) Int. Cl.
*H01L 27/12* (2006.01)
*H01L 21/768* (2006.01)
(Continued)

(52) U.S. Cl.
CPC .. *H01L 21/76861* (2013.01); *H01L 21/76816* (2013.01); *H01L 23/373* (2013.01);
(Continued)

(58) Field of Classification Search
CPC ............ H01L 29/7869; H01L 27/1225; H01L 27/1214; H01L 27/1251; H01L 29/78696
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| (Continued) | | |

FOREIGN PATENT DOCUMENTS

| | | |
|---|---|---|
| CN | 101997005 A | 3/2011 |
| CN | 102473734 A | 5/2012 |
| CN | 102598282 A | 7/2012 |
| EP | 1737044 A | 12/2006 |
| (Continued) | | |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Jaehwan Oh
(74) *Attorney, Agent, or Firm* — Nixon Peabody LLP; Jeffrey L. Costellia

(57) ABSTRACT

A semiconductor device provided with a plurality of kinds of transistors with different device structures suitable for functions of circuits is provided. The semiconductor device includes first to third transistors with different device structures over one substrate. A semiconductor layer of the first transistor is an oxide semiconductor film with a stacked-layer structure, and a semiconductor layer of each of the second and third transistors is an oxide semiconductor film with a single-layer structure. Each of the first and second transistors includes a back gate electrode connected to its gate electrode.

20 Claims, 37 Drawing Sheets

(51) Int. Cl.
   *H01L 23/522*   (2006.01)
   *H01L 23/373*   (2006.01)
   *H01L 23/528*   (2006.01)
   *H01L 27/115*   (2017.01)

(52) U.S. Cl.
   CPC .......... *H01L 23/522* (2013.01); *H01L 23/528* (2013.01); *H01L 23/5226* (2013.01); *H01L 23/5283* (2013.01); *H01L 27/115* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,804,095 B2 | 9/2010 | Sato |
| 7,851,279 B2 | 12/2010 | Takano et al. |
| 8,067,775 B2 | 11/2011 | Miyairi et al. |
| 8,222,092 B2 | 7/2012 | Yamazaki et al. |
| 8,421,083 B2 | 4/2013 | Yamazaki et al. |
| 8,436,342 B2 | 5/2013 | Park et al. |
| 8,442,183 B2 | 5/2013 | Amano et al. |
| 8,513,661 B2 | 8/2013 | Takahashi et al. |
| 8,692,252 B2 | 4/2014 | Takata et al. |
| 8,937,306 B2 | 1/2015 | Yamazaki et al. |
| 8,952,377 B2 | 2/2015 | Yamazaki et al. |
| 9,029,851 B2 | 5/2015 | Miyairi et al. |
| 9,130,049 B2 | 9/2015 | Sano et al. |
| 9,196,745 B2 | 11/2015 | Yamazaki et al. |
| 9,318,512 B2 | 4/2016 | Miyairi et al. |
| 9,324,880 B2 | 4/2016 | Ono et al. |
| 9,419,146 B2 | 8/2016 | Yamazaki |
| 9,530,897 B2 | 12/2016 | Yamazaki et al. |
| 9,583,637 B2 | 2/2017 | Sano et al. |
| 9,601,603 B2 | 3/2017 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0250693 A1 | 10/2009 | Jeong et al. |
| 2009/0255995 A1 | 10/2009 | Shionoiri et al. |
| 2009/0278122 A1 | 11/2009 | Hosono et al. |
| 2009/0280600 A1 | 11/2009 | Hosono et al. |
| 2010/0012940 A1 | 1/2010 | Sato |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0024751 A1 | 2/2011 | Yamazaki et al. |
| 2011/0031497 A1 | 2/2011 | Yamazaki et al. |
| 2011/0037068 A1* | 2/2011 | Yamazaki ........... H01L 27/1225 257/43 |
| 2011/0109351 A1 | 5/2011 | Yamazaki et al. |
| 2011/0266542 A1 | 11/2011 | Ryu et al. |
| 2012/0058598 A1* | 3/2012 | Yamazaki ......... H01L 21/02554 438/104 |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0193432 A1 | 8/2013 | Yamazaki |
| 2013/0228777 A1 | 9/2013 | Yamazaki et al. |
| 2013/0334523 A1 | 12/2013 | Yamazaki |
| 2013/0334533 A1 | 12/2013 | Yamazaki |
| 2014/0001465 A1 | 1/2014 | Yamazaki |
| 2014/0042433 A1 | 2/2014 | Yamazaki |
| 2014/0239293 A1* | 8/2014 | Yamazaki ............... H01L 29/78 257/43 |

(56) References Cited

U.S. PATENT DOCUMENTS

2016/0351598 A1 12/2016 Yamazaki
2017/0069765 A1 3/2017 Yamazaki et al.

FOREIGN PATENT DOCUMENTS

| | | |
|---|---|---|
| EP | 2207206 A | 7/2010 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-096055 A | 4/2007 |
| JP | 2007-123861 A | 5/2007 |
| JP | 2009-176865 A | 8/2009 |
| JP | 2010-027851 A | 2/2010 |
| JP | 2010-123938 A | 6/2010 |
| JP | 2010-161327 A | 7/2010 |
| JP | 2011-049539 A | 3/2011 |
| JP | 2011-054946 A | 3/2011 |
| JP | 2011-119714 A | 6/2011 |
| JP | 2011-124360 A | 6/2011 |
| JP | 2011-233889 A | 11/2011 |
| JP | 2011-243745 A | 12/2011 |
| JP | 2012-059860 A | 3/2012 |
| JP | 2013-008990 A | 1/2013 |
| JP | 2013-038399 A | 2/2013 |
| JP | 2013-041945 A | 2/2013 |
| JP | 2013-084735 A | 5/2013 |
| JP | 2013-175715 A | 9/2013 |
| JP | 2013-175716 A | 9/2013 |
| JP | 2013-197150 A | 9/2013 |
| JP | 2013-239521 A | 11/2013 |
| KR | 2011-0015374 A | 2/2011 |
| KR | 2012-0051720 A | 5/2012 |
| KR | 2012-0091293 A | 8/2012 |
| KR | 2013-0086979 A | 8/2013 |
| TW | 201117356 | 5/2011 |
| TW | 201133858 | 10/2011 |
| TW | 201140844 | 11/2011 |
| TW | 201338169 | 9/2013 |
| TW | 201401516 | 1/2014 |
| WO | WO-2004/114391 | 12/2004 |
| WO | WO-2006/051993 | 5/2006 |
| WO | WO-2009/093722 | 7/2009 |
| WO | WO-2010/047217 | 4/2010 |
| WO | WO-2011/013596 | 2/2011 |
| WO | WO-2011/055631 | 5/2011 |
| WO | WO-2013/172236 | 11/2013 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Kurokawa.Y et al., "UHR RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID DIGEST '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2209, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Later", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philisophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2002, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280
Oba.F et al., "Defect energetics in ZnO: A hybrid Hartree-Fock density functional study", Phys. Rev. B. (Physical Review. B), 2008, vol. 77, pp. 245202-1-245202-6.
Kim.S et al., "High-Performance amorphous oxide thin film transistors passivated by various gas plasmas", 2214th ECS Meeting, 2008, No. 2317, ECS.
Hayashi.R et al., "42.1: Invited Paper: Improved Amorphous In—Ga—Zn-O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness using single-crystalline InGaO3(ZnO)5 films", App. Phys. Lett. (Applied Physics Letters), Sep. 13, 2004, vol. 85, No. 11, pp. 1993-1995
International Search Report (Application No. PCT/IB2014/066282) dated Mar. 10, 2015.
Written Opinion (Application No. PCT/IB2014/066282) dated Mar. 10, 2015.

\* cited by examiner

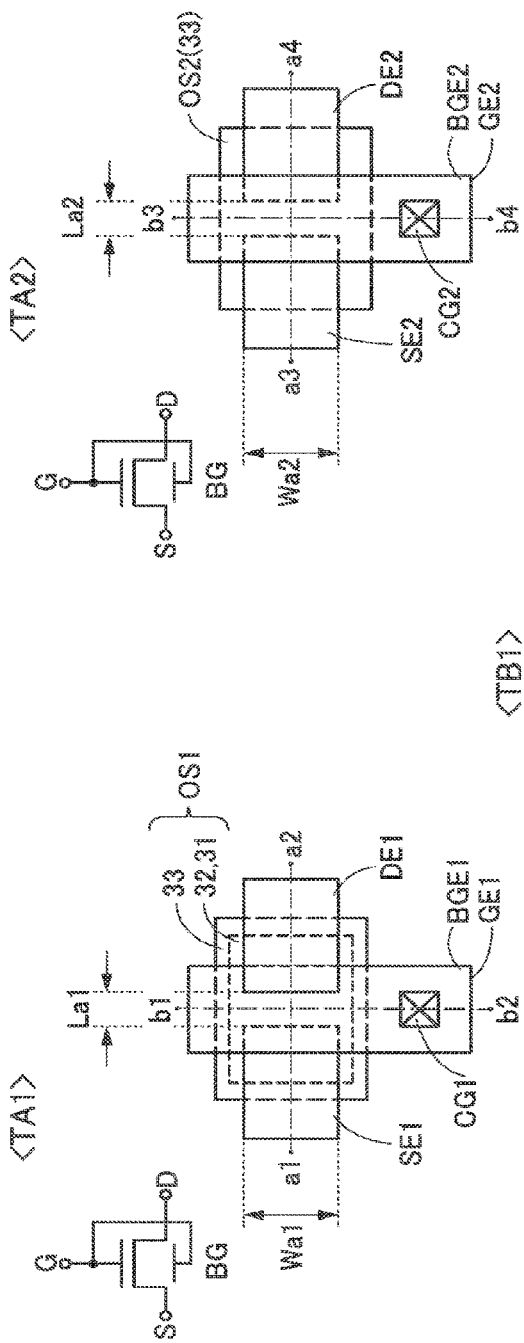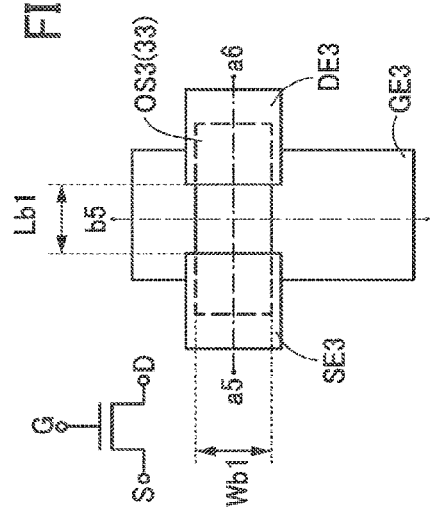
FIG. 1A
FIG. 1B
FIG. 1C

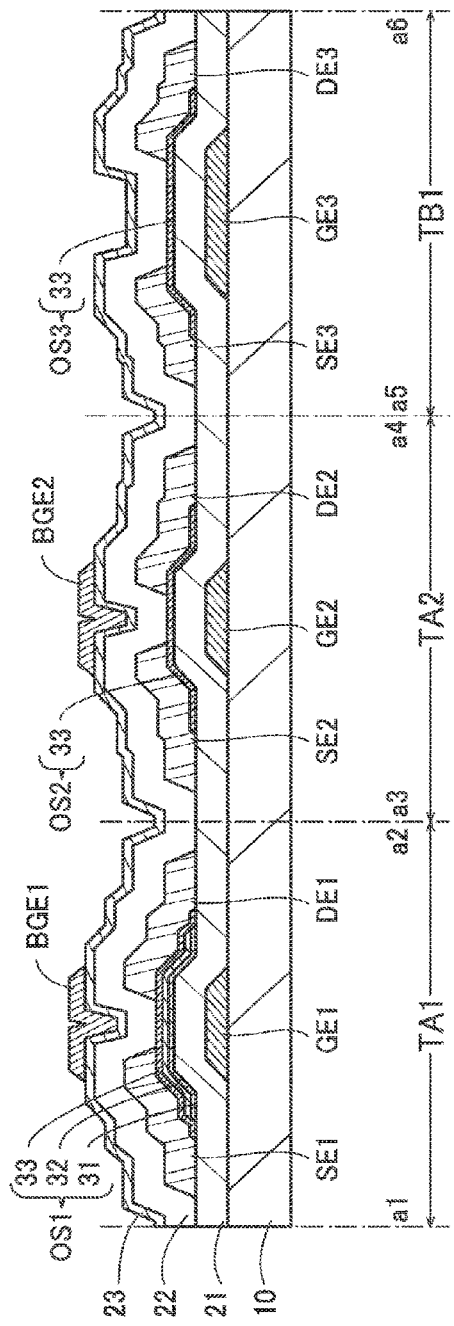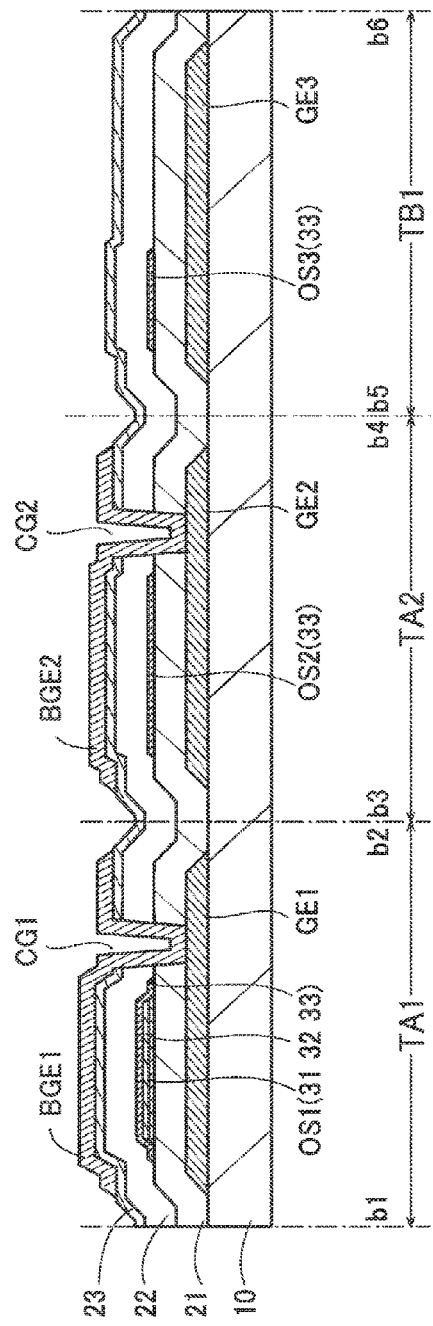
FIG. 2A
FIG. 2B

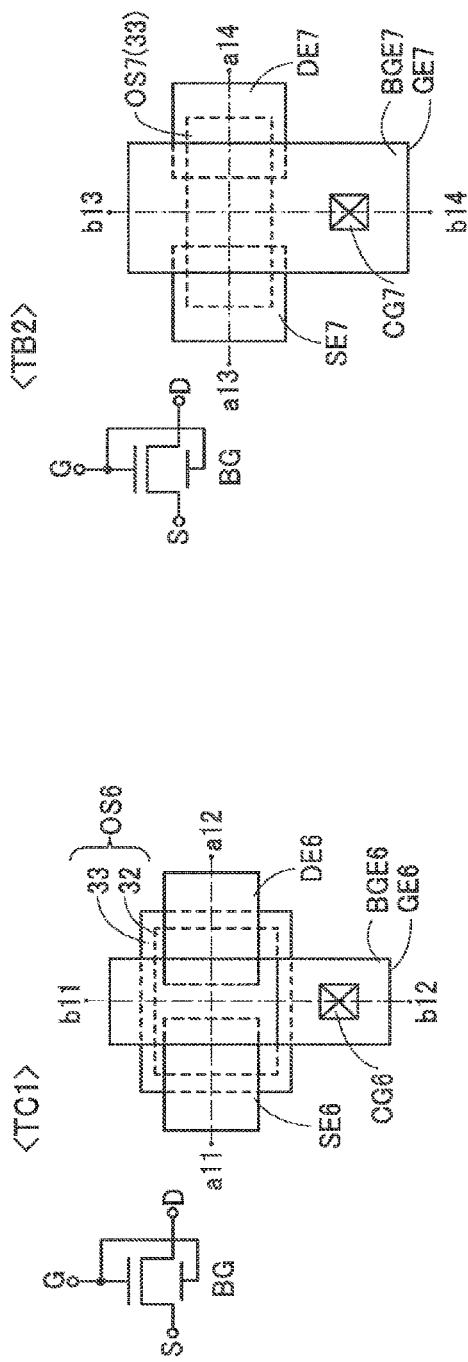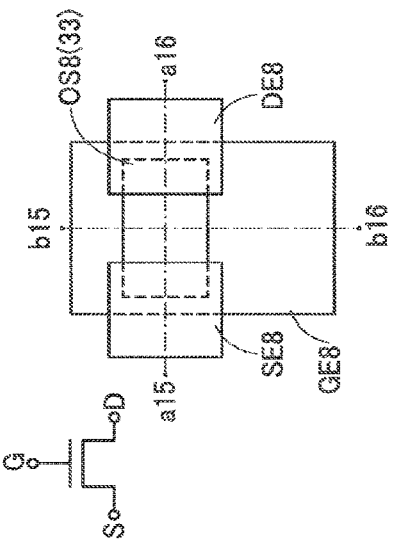
FIG. 5A  FIG. 5B  FIG. 5C

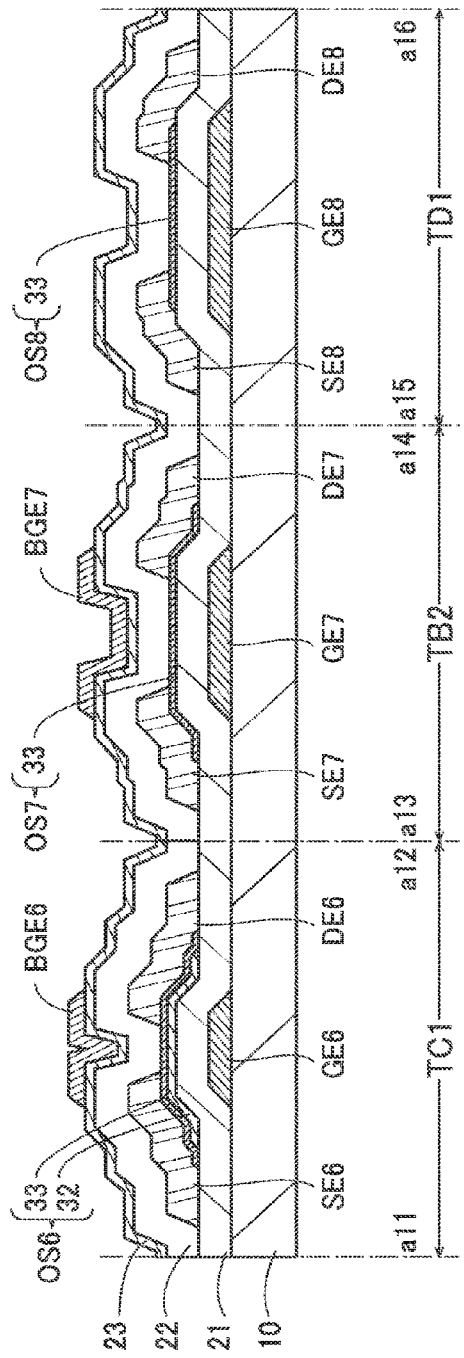
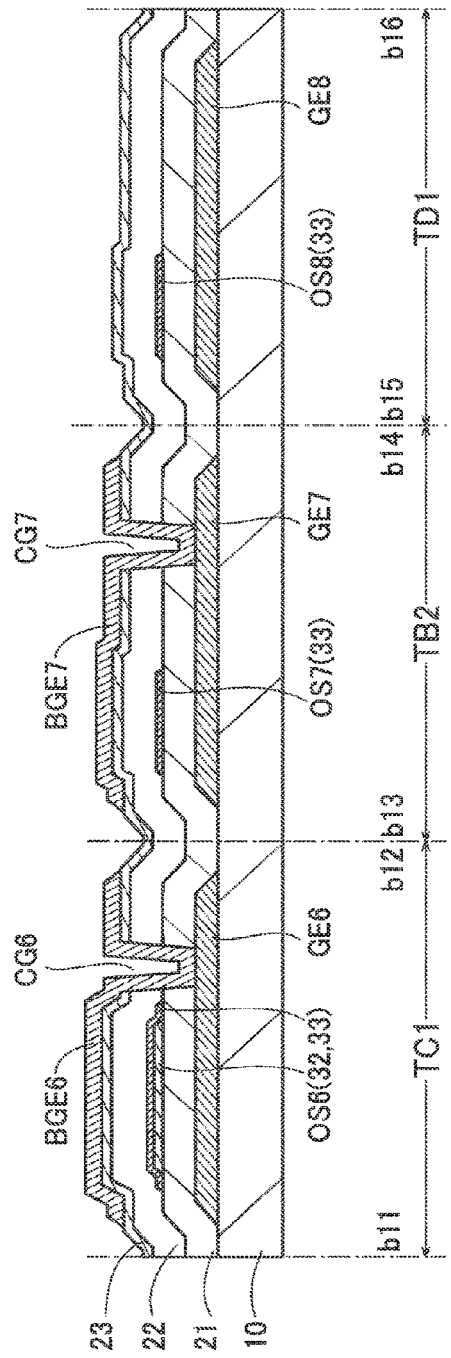
FIG. 6A
FIG. 6B

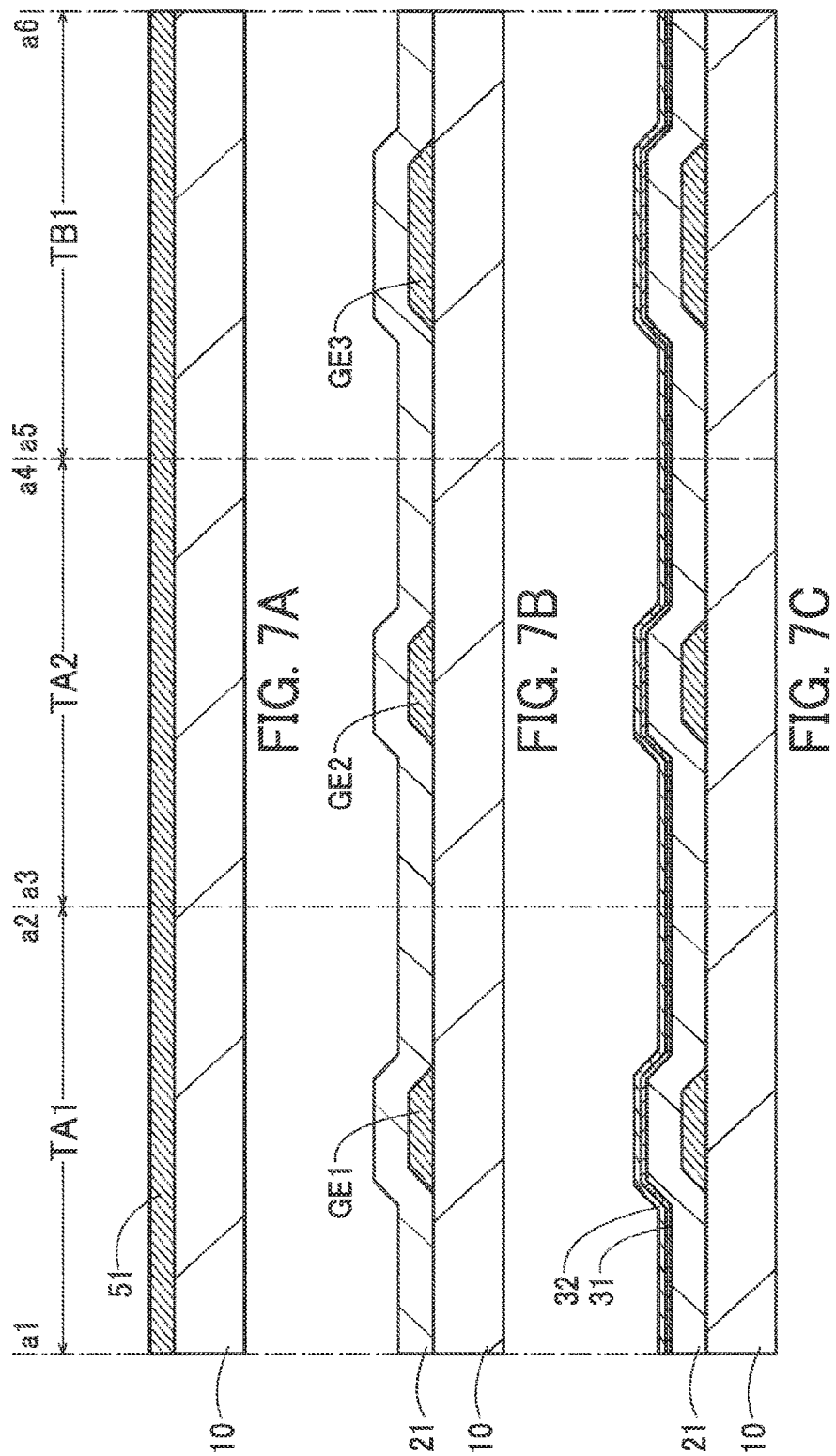

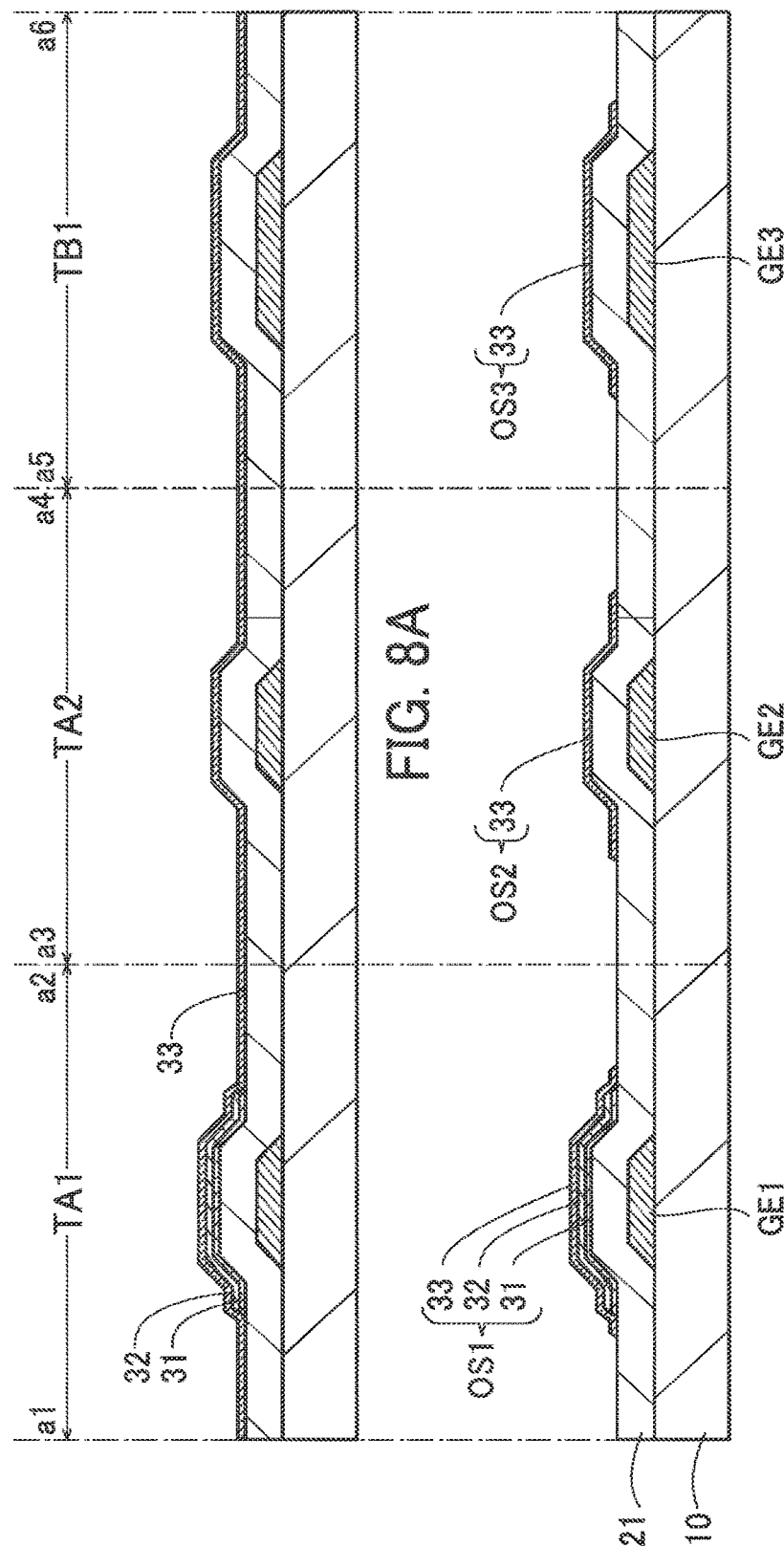

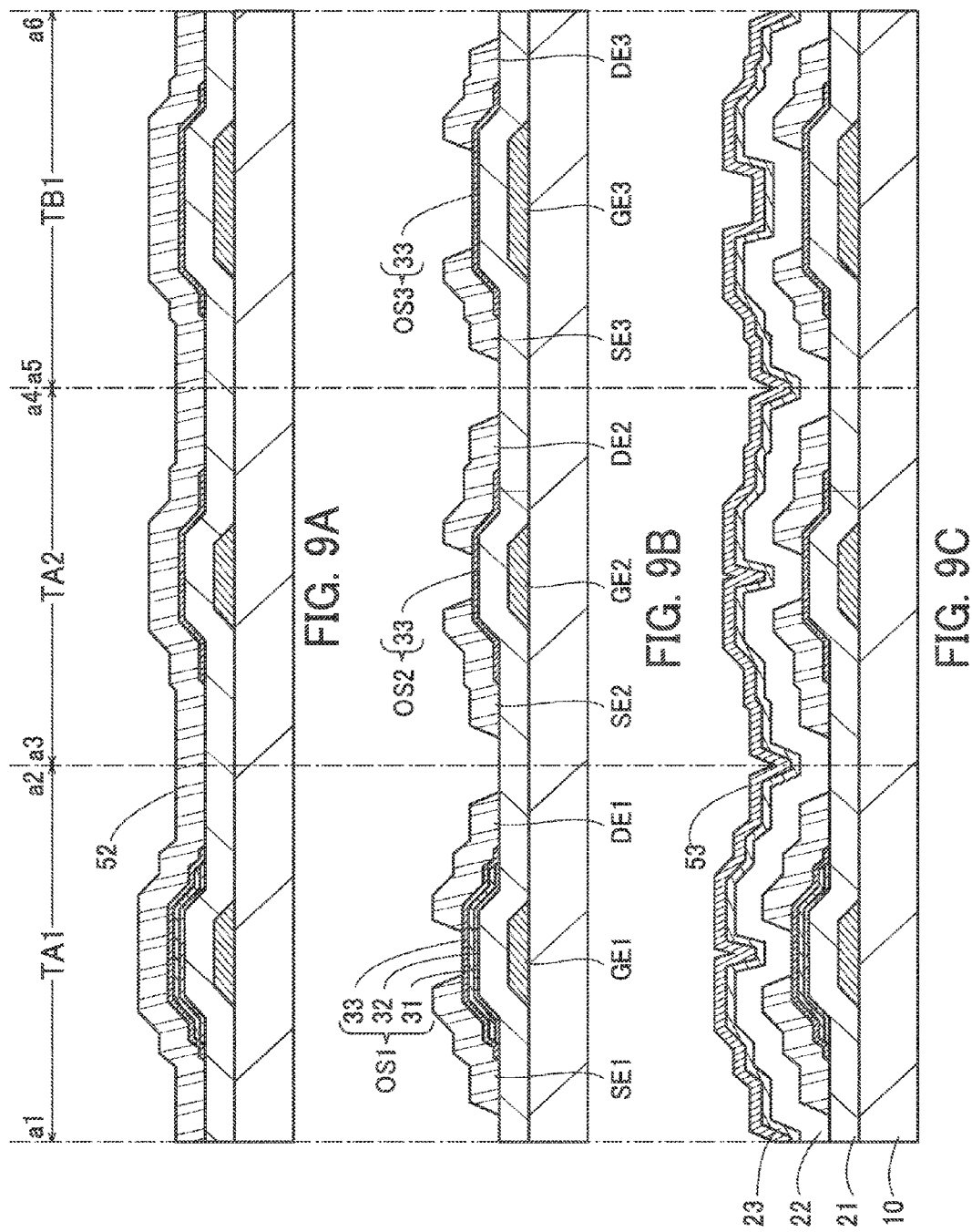

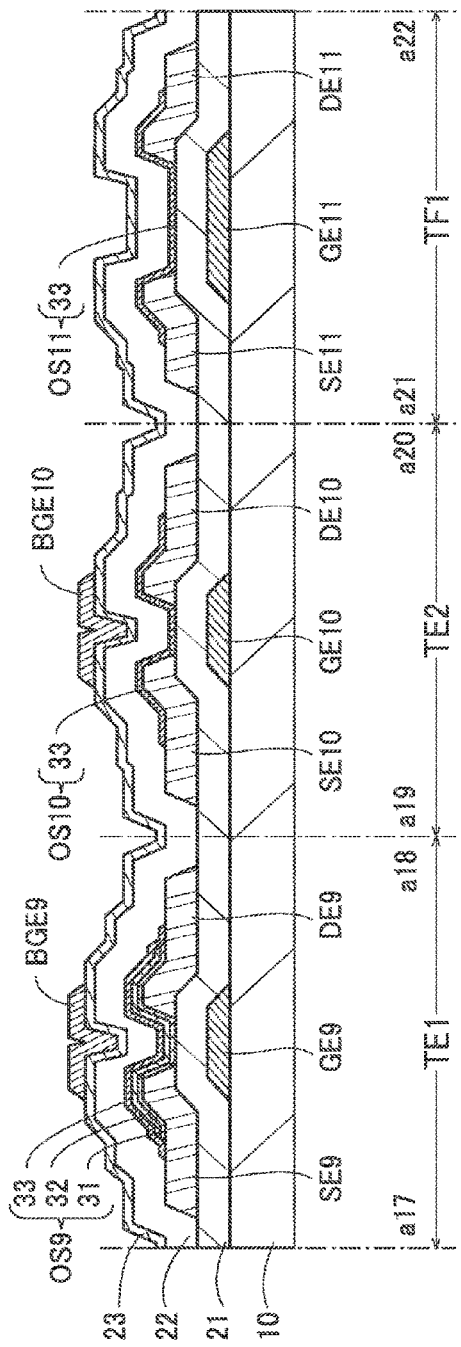
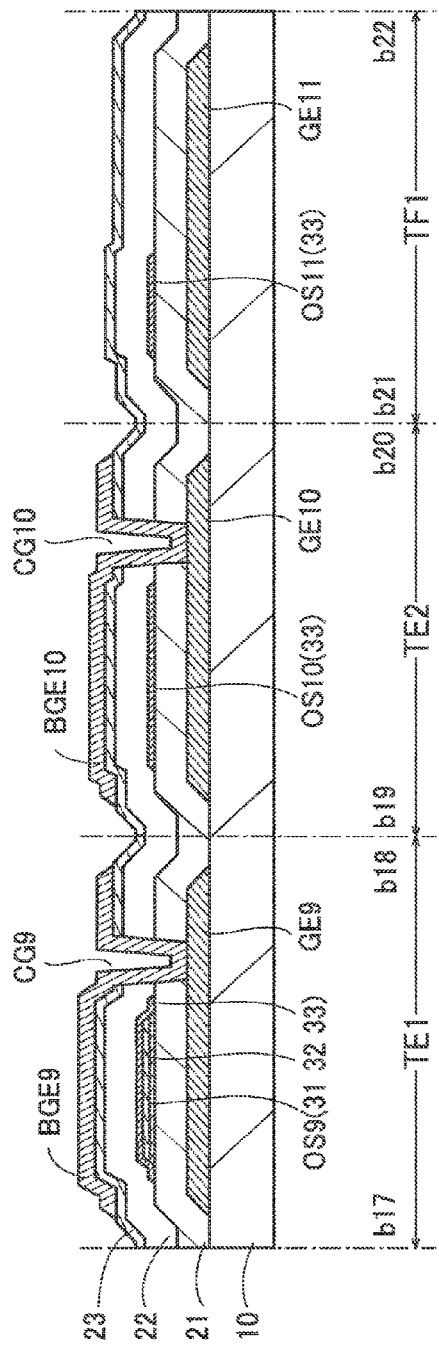
FIG. 11A
FIG. 11B

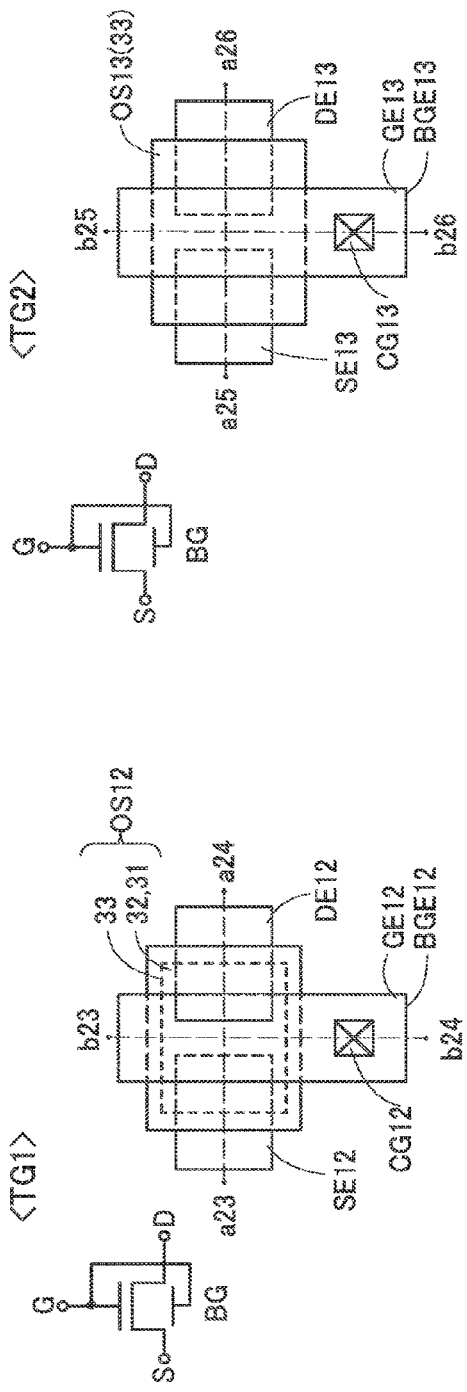
FIG. 12A
FIG. 12B
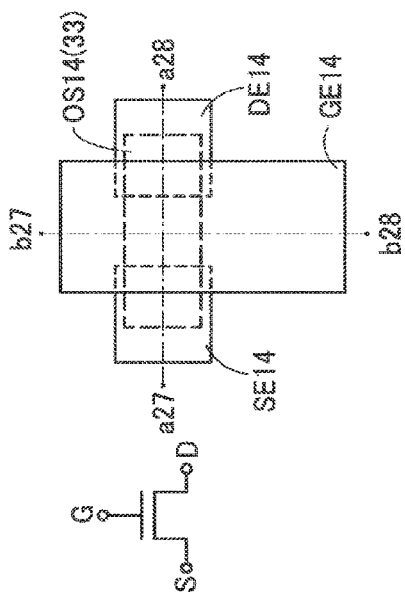
FIG. 12C

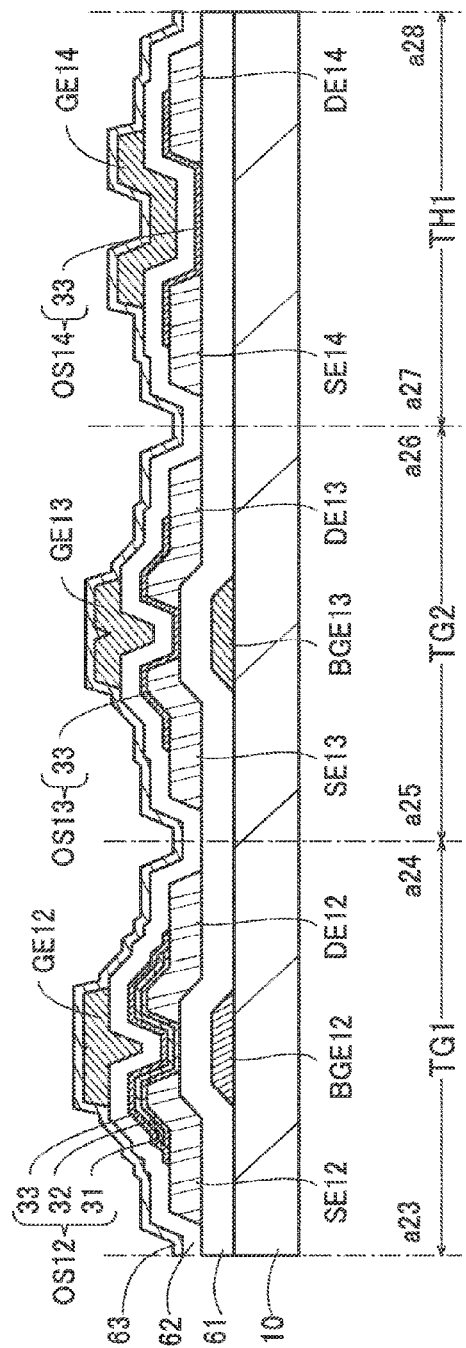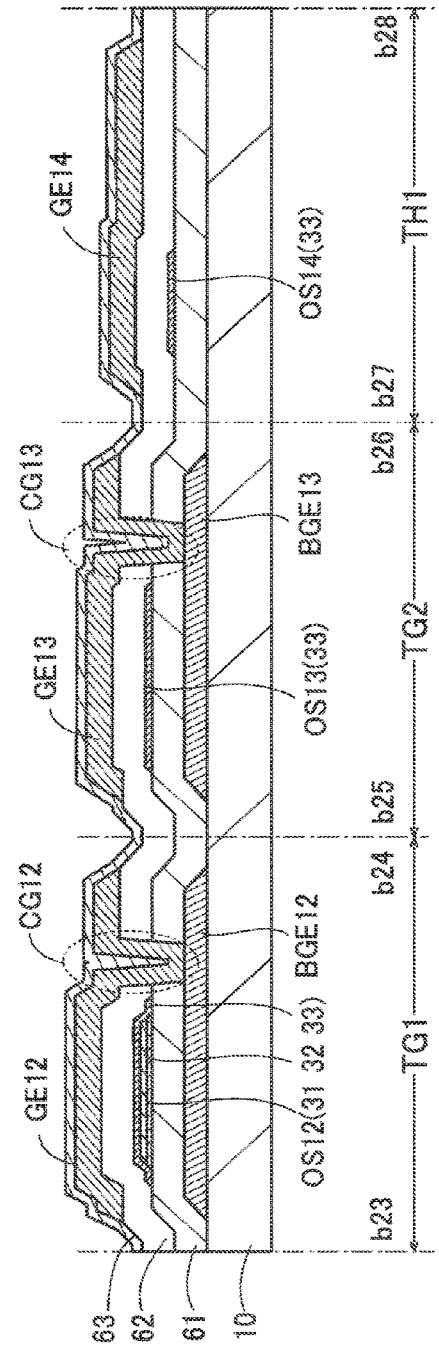

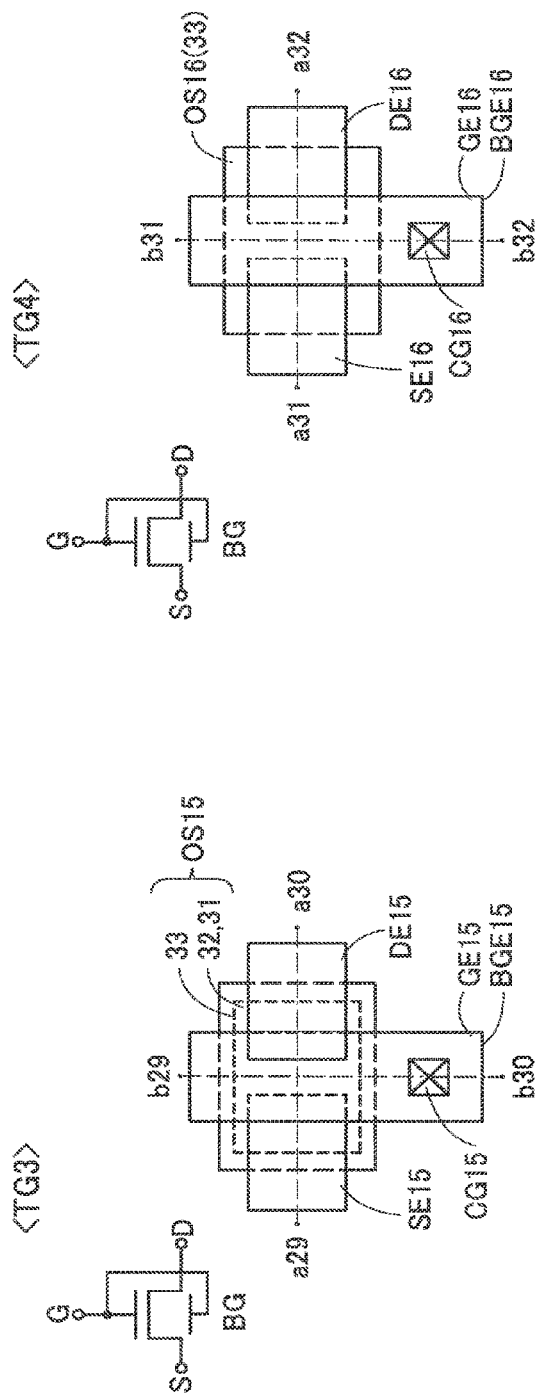

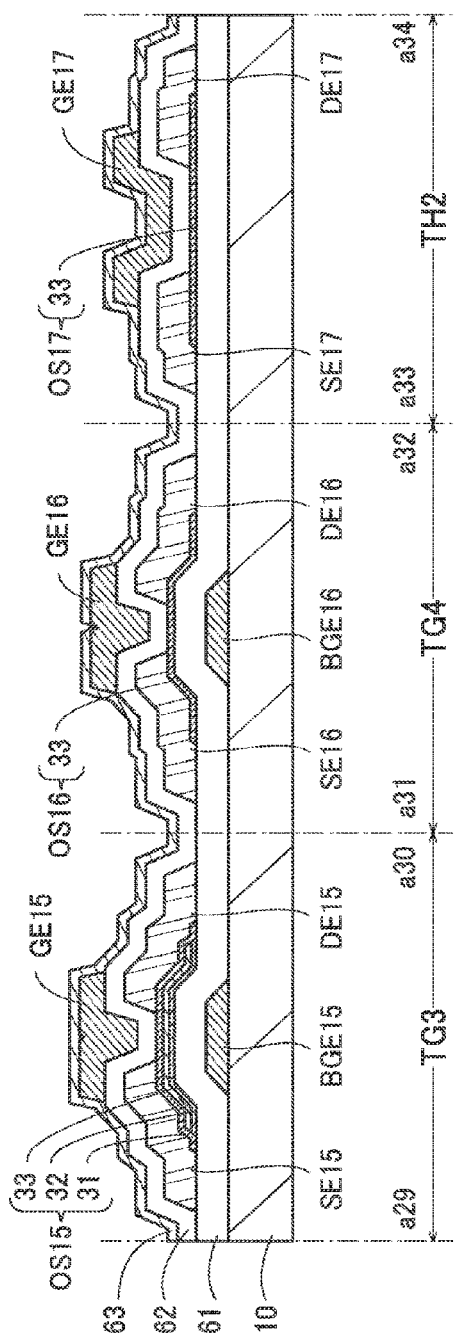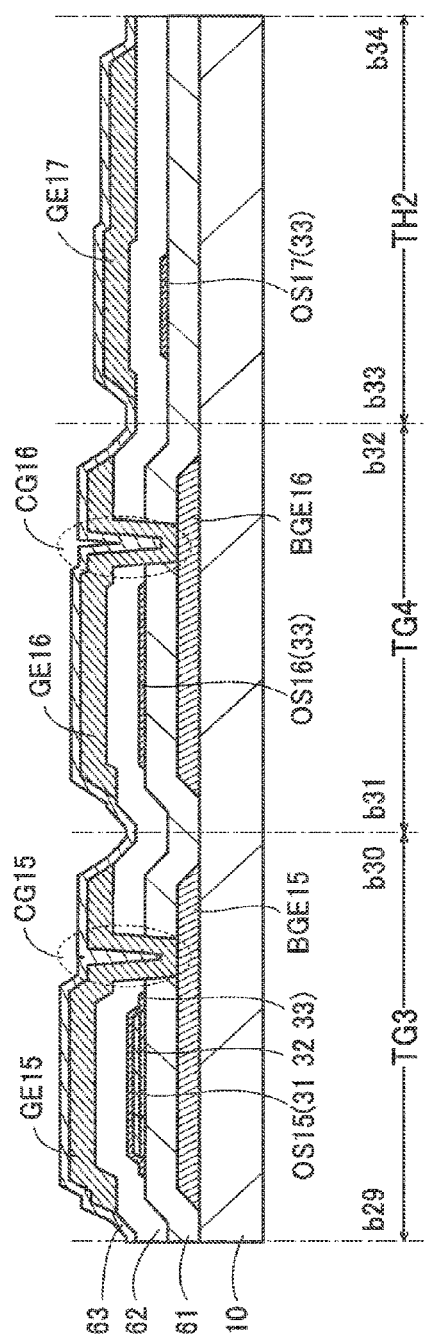

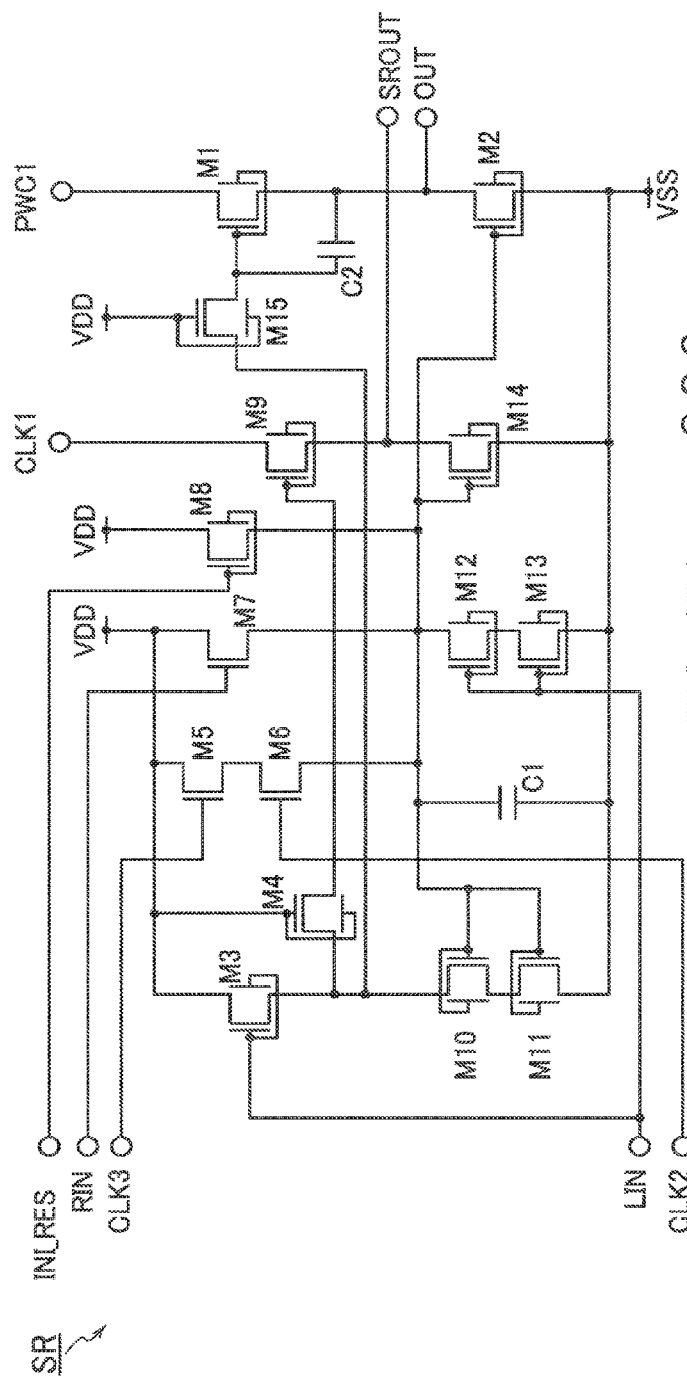
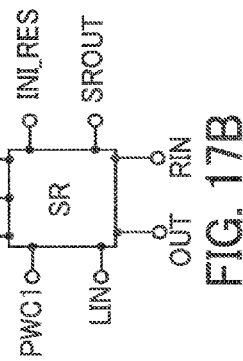
FIG. 17A
FIG. 17B

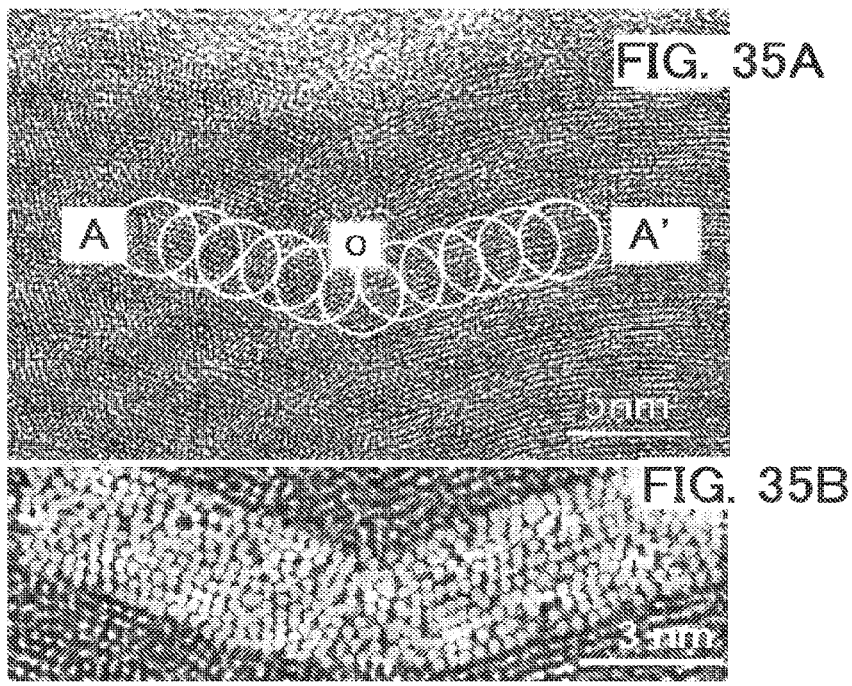
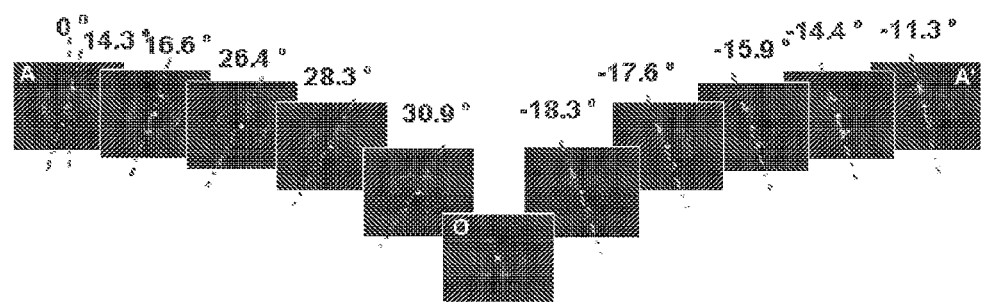
FIG. 35C

CAAC-OS nc-OS

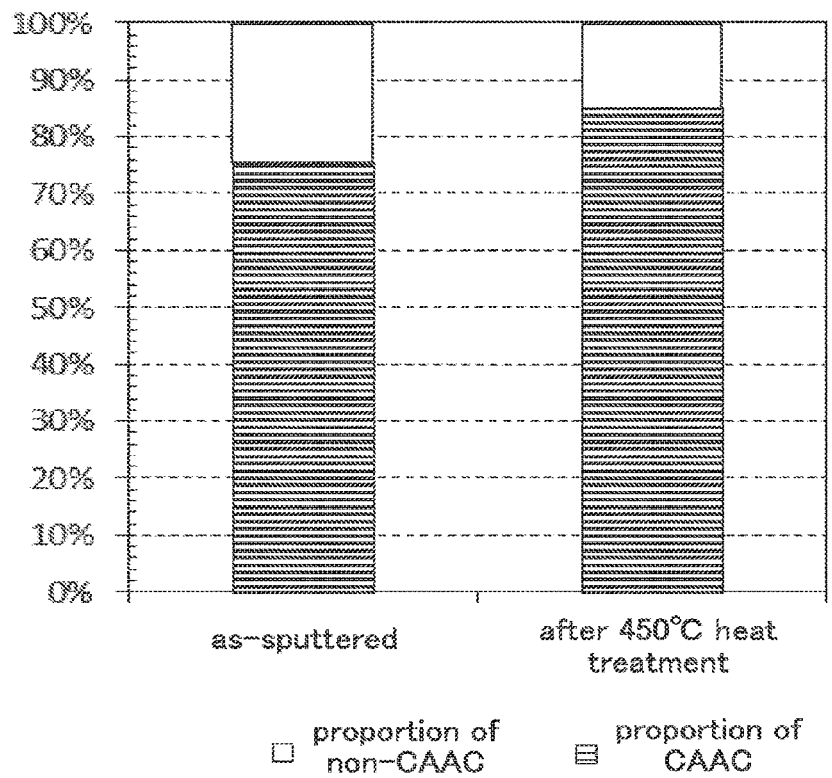
FIG. 37A
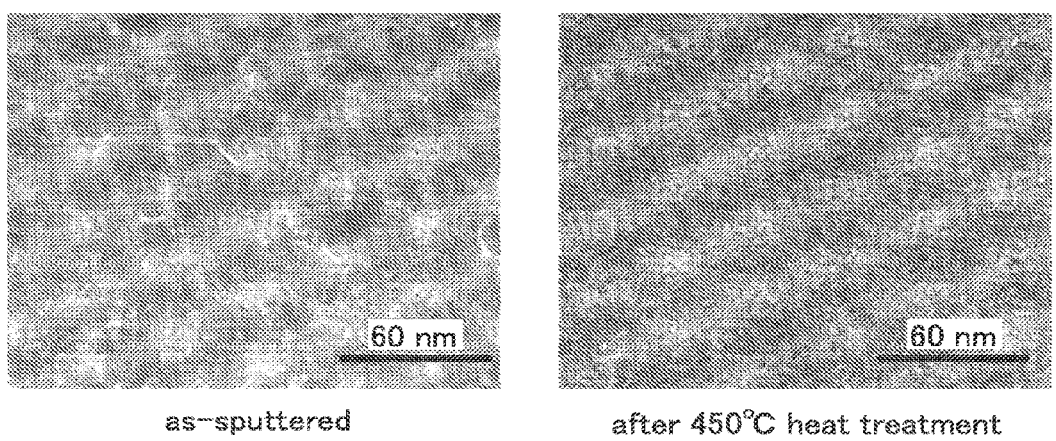
FIG. 37BFIG. 37C

SEMICONDUCTOR DEVICE

BACKGROUND OF THE INVENTION

1. Field of the Invention

One embodiment of the present invention relates to a semiconductor device including a transistor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

Various metal oxides are used for a variety of applications. For example, indium oxide, which is a well-known metal oxide, is used as a transparent electrode material in liquid crystal display devices and the like.

Some metal oxides have semiconductor characteristics. Metal oxides having semiconductor characteristics are a kind of compound semiconductor. The compound semiconductor is a semiconductor formed by two or more kinds of atoms bonded together. In general, metal oxides serve as insulators; however, it is known that metal oxides serve as semiconductors depending on the combination of elements included in the metal oxides. For example, it is known that tungsten oxide, tin oxide, indium oxide, zinc oxide, and the like have semiconductor characteristics. A technique is disclosed in which a transistor manufactured using zinc oxide or an In—Ga—Zn-based oxide is used as a switching element or the like of a pixel of an active matrix display device (see Patent Documents 1 and 2).

Transistors including oxide semiconductors have higher field-effect mobility than transistors including amorphous silicon. Therefore, driver circuits of display devices and the like can be formed using the transistors including oxide semiconductors.

Display devices include electroluminescent (EL) display devices, electronic paper, and liquid crystal display devices. Among these, active matrix EL display devices capable of displaying high-resolution images are particularly attracting attention. In an active matrix EL display device, where a plurality of switching elements are arranged in pixels, voltage is applied to a light-emitting element electrically connected to at least one of the switching elements, whereby electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The range of uses of an active matrix display device is expanding, and demands for larger screen size, higher definition, and higher aperture ratio are increasing. In addition, it is demanded that a production method of the active matrix display device offer high productivity and reduced production cost.

REFERENCE

Patent Document

[Patent Document 1] Japanese Published Patent Application No. 2007-123861
[Patent Document 2] Japanese Published Patent Application No. 2007-096055

SUMMARY OF THE INVENTION

In the case where a plurality of different circuits are formed over an insulating surface, characteristics needed for a transistor of each circuit depend on a function or the like of the circuit. In an active matrix display device, excellent switching characteristics (e.g., a high on-off ratio of current), for example, are needed for a transistor in a pixel portion, and high operation speed, for example, is needed for a transistor in a driver circuit. As the definition of the display device is increased, writing time of image data is reduced; therefore, it is preferable that the transistor in the driver circuit operate at high speed.

An object of one embodiment of the present invention is to provide a novel semiconductor device, a manufacturing method thereof, a driving method thereof, and the like. For example, an object of one embodiment of the present invention is to provide a semiconductor device with improved operation speed, to provide a semiconductor device that is unlikely to deteriorate, or to provide a semiconductor device provided with a plurality of kinds of transistors suitable for functions of a plurality of kinds of circuits.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including, over a substrate, a first circuit including a first transistor and a second transistor and a second circuit including a third transistor. The first transistor includes a first semiconductor layer in which a first oxide semiconductor film and a second oxide semiconductor film are stacked in this order. The second transistor includes a second semiconductor layer including the second oxide semiconductor film. The third transistor includes a third semiconductor layer including the second oxide semiconductor film. The first transistor includes a back gate connected to a gate.

Another embodiment of the present invention is a semiconductor device including, over a substrate, a first circuit including a first transistor and a second transistor and a second circuit including a third transistor. The first transistor includes a first semiconductor layer in which a first oxide semiconductor film, a second oxide semiconductor film, and a third oxide semiconductor film are stacked in this order. The second transistor includes a second semiconductor layer including the third oxide semiconductor film. The third transistor includes a third semiconductor layer including the third oxide semiconductor film. The first transistor includes a back gate connected to a gate.

In the above embodiments, a channel length of the first transistor can be less than 2.5 μm. The second transistor can be provided with a back gate connected to a gate.

One embodiment of the present invention makes it possible to provide a novel semiconductor device, a manufacturing method thereof, a driving method thereof, and the like. For example, one embodiment of the present invention makes it possible to provide a semiconductor device with improved operation speed, a semiconductor device that is unlikely to deteriorate, or a display device with high image quality and fewer external connection terminals.

Note that the description of these effects does not disturb the existence of other effects. In one embodiment of the present invention, there is no need to obtain all the effects. In one embodiment of the present invention, an object other than the above objects, an effect other than the above effects, and a novel feature will be apparent from the description of the specification and the drawings.

BRIEF DESCRIPTION OF THE DRAWINGS

FIGS. 1A to 1C illustrate structure examples of semiconductor devices.

FIGS. 2A and 2B illustrate structure examples of semiconductor devices.

FIGS. 5A to 5C illustrate structure examples of semiconductor devices.

FIGS. 6A and 6B illustrate structure examples of semiconductor devices.

FIGS. 7A to 7C illustrate an example of manufacturing a semiconductor device.

FIGS. 8A and 8B illustrate an example of manufacturing a semiconductor device.

FIGS. 9A to 9C illustrate an example of manufacturing a semiconductor device.

FIGS. 11A and 11B illustrate structure examples of semiconductor devices.

FIGS. 12A to 12C illustrate structure examples of semiconductor devices.

FIGS. 13A and 13B illustrate structure examples of semiconductor devices.

FIGS. 14A to 14C illustrate structure examples of semiconductor devices.

FIGS. 15A and 15B illustrate structure examples of semiconductor devices.

FIGS. 17A and 171 illustrate a configuration example of a sequential circuit.

FIGS. 21A and 211B illustrate a configuration example of a protective circuit.

FIGS. 35A to 35C are cross-sectional TEM images and a local Fourier transform image of an oxide semiconductor.

FIG. 37A shows an example of structural analysis by transmission electron diffraction measurement and FIGS. 37B and 37C show plan-view TEM images.

DETAILED DESCRIPTION OF THE INVENTION

Figure 3B:
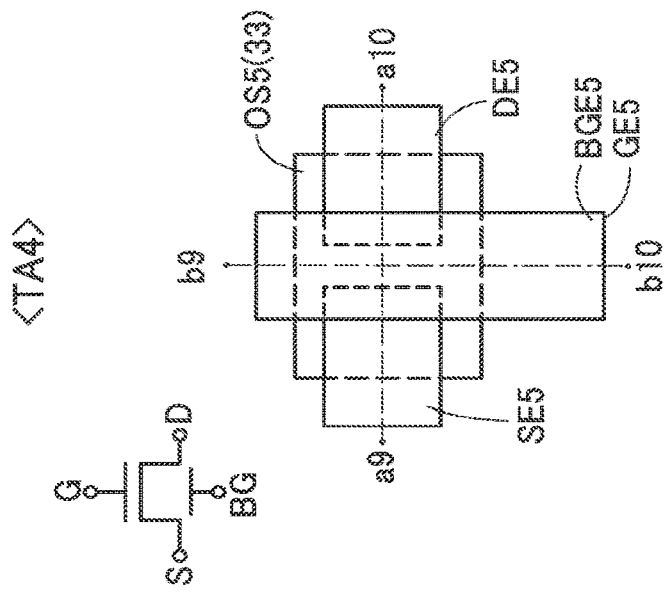
FIGS. 3A and 3B illustrate structure examples of semiconductor devices.

In this specification and the like, a semiconductor device generally means a device that can function by utilizing semiconductor characteristics. A semiconductor element such as a transistor or a diode, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), an electronic device, an electrical appliance, a mechanical device, and the like may each include a semiconductor device.

The ordinal numbers such as "first", "second", and "third" represent the order in some cases, and in other cases, they are used to avoid confusion among components. In such a case, the ordinal numbers do not limit the number of the components. For example, it is possible to replace the term "first" with the term "second", "third", or the like as appropriate in describing one embodiment of the present invention.

In this specification, the term "parallel" indicates that the angle formed between two straight lines is greater than or equal to −10° and less than or equal to 100, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Functions of a "source" and a "drain" of a transistor might be interchanged with each other in the case where the direction of a current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics. A transistor in which an oxide semiconductor film is used for a channel formation region (hereinafter referred to as an OS transistor) is an n-channel transistor in most cases.

The channel length of an OS transistor refers to, for example, a distance between a source (source region or source electrode) and a drain (drain region or drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width of an OS transistor refers to, for example, the length of a portion where a source electrode and a drain electrode face each other in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on OS transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

Therefore, in this specification, in a top view (layout) of a transistor, an apparent channel width that is a length of a portion where a source and a drain face each other in a region where an oxide semiconductor film and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like of a transistor.

Note that in the case where field-effect mobility, a current value per channel width, and the like of a transistor are obtained by calculation, a surrounded channel width may be used for the calculation. In that case, the values may be different from those calculated using an effective channel width in some cases.

In the following embodiments and examples, the same portions or portions having similar functions are denoted by the same reference numerals or the same hatching patterns in different drawings in some cases, and description of such portions is not repeated in some cases. The size (e.g., thickness of a film, thickness of a substrate, length of a member, or size of a region) of a component that is shown in a drawing referred to in this specification is exaggerated for clarity in some cases. Therefore, embodiments of the present invention are not limited to such a scale.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments.

A plurality of embodiments of the present invention are described below, and any of the embodiments can be combined as appropriate. In addition, in the case where structure examples are given in one embodiment, any of the structure examples can be combined as appropriate.

Embodiment 1

In this embodiment, a transistor whose channel formation region is formed using an oxide semiconductor film (OS transistor), which is an example of a semiconductor device, a manufacturing method thereof, and the like are described. Furthermore, in this embodiment, a semiconductor device including a plurality of transistors with different device structures over one insulating surface is described.

FIGS. 1A, 1B, and 1C respectively show top views (layouts) and circuit symbols of three transistors TA1, TA2, and TB1 with different device structures. FIGS. 2A and 2B are cross-sectional views of the transistors TA1 along line a1-a2 and b1-b2, TA2 along line a3-a4 and b3-b4, and TB1 along line a5-a6 and b5-b6. FIGS. 2A and 2B show cross-sectional structures of the transistors in the channel length direction and the channel width direction, respectively.

As shown in FIGS. 2A and 2B, the transistors TA1, TA2, and TB1 are formed over the same insulating surface and can be formed in the same process. Note that for clarity of the device structures, a wiring for supplying a signal or potential to a gate (G), a source (S), and a drain (D) of each transistor is not shown.

The transistor TA1 in FIG. 1A and the transistor TA2 in FIG. 1B each include a gate (G) and a back gate (BG). The back gate of each of the transistors TA1 and TA2 is connected to the gate. In contrast, the transistor TB1 in FIG. 1C does not include a back gate. As shown in FIGS. 2A and 2B, these transistors TA1, TA2, and TB1 are formed over a substrate 10. The structures of the transistors will be described with reference to FIGS. 1A to 1C and FIGS. 2A and 2B.

<Transistor TA1>

The transistor TA1 includes a gate electrode GE1, a source electrode SE1, a drain electrode DE1, a back gate electrode BGE1, and an oxide semiconductor layer OS1.

In the description below, elements and components of the elements may be abbreviated; for example, the transistor TA1 is referred to as TA1, the back gate is BG, the oxide semiconductor layer OS1 is OS1 or a layer OS1. Potentials, signals, circuits, and the like may also be similarly abbreviated.

The channel length of an OS transistor corresponds to the distance between a source electrode and a drain electrode in this embodiment. The channel width of the OS transistor corresponds to the length of the source electrode or the drain electrode in a region where an oxide semiconductor layer and a gate electrode overlap with each other. For example, as shown in FIG. 1A, the channel length and the channel width of the transistor TA1 are represented by La1 and Wa1, respectively.

The layer OS1 overlaps with the electrode GE1 with an insulating layer 21 provided therebetween. The pair of electrodes (SE1 and DE1) is formed in contact with the upper surface and the side surfaces of the layer OS1. As shown in FIG. 1A, the layer OS1 includes a region overlapping with neither the electrode GE1 nor the pair of electrodes (SE1 and DE1). The length in the channel length direction of the layer OS1 is longer than the channel length La1, and the length in the channel width direction is longer than the channel width Wa1.

An insulating layer 22 and an insulating layer 23 are formed to cover the layer OS1 and the electrodes GE1, SE1, and DE1. The electrode BGE1 is formed over the insulating layer 23. The electrode BGE1 overlaps with the layer OS and the electrode GE1. Here, in the layout, the electrode BGE1 has the same shape as the electrode GE1 and is located in the same position as the electrode GE1. The electrode BGE1 is in contact with the electrode GE1 through an opening CG1 in the insulating layers 21 to 23. With this structure, the gate (G) of the transistor TA1 is electrically connected to the back gate (BG).

As shown in the cross-sectional view in the channel width direction of FIG. 2B, the transistor TA1 has a device structure in which a channel formation region (channel) is surrounded by the electrode GE1 and the electrode BGE1. Accordingly, the channel formation region of the transistor TA1 is influenced by an electric field formed by the electrode BGE1 in addition to an electric field formed by the electrode GE1. Therefore, when the back gate electrode BGE1 is connected to the gate electrode GE1, the on-state current of the transistor TA1 can be increased. In addition, the field-effect mobility of the transistor TA1 can be improved. Alternatively, variation in electrical characteristics such as the threshold voltage of the transistor TA1 can be reduced.

The strength of the transistor TA1 can be increased with the back gate electrode BGE1. When the substrate 10 is deformed like bending, the electrode BGE1 serves as a reinforcement member to prevent the transistor TA1 from being broken.

The layer OS1 including a channel formation region has a multilayer structure; here, three oxide semiconductor films 31, 32, and 33 are stacked as an example. The oxide semiconductor films forming the layer OS1 are preferably metal oxide films containing at least one metal element that is the same, more preferably containing In. As metal oxide containing In which can be used for the semiconductor layer of the transistor, an In—Ga oxide and an In-M-Zn oxide (M is Al, Ga, Y, Zr, La, Ce, or Nd) are typical examples. Another element or material may be added to these metal oxides.

The oxide semiconductor film 32 includes a channel formation region of the transistor TA1. The oxide semiconductor film 33 includes channel formation regions of the transistors TA2 and TB1 which are described later. Accordingly, the atomic ratio of metal elements contained as main components in the oxide semiconductor films 31 to 33 is preferably adjusted so that a channel is formed in the oxide semiconductor film 32 in the transistor TA1 and a channel is formed in the oxide semiconductor film 33 in the transistors TA2 and TB1.

Since a channel is formed in the oxide semiconductor film 32 of the transistor TA1, the channel formation region is not in contact with the insulating layers 21 and 22. When the oxide semiconductor films 31 to 33 are metal oxide films containing at least one common metal element, interface scattering is unlikely to occur at the interface between the oxide semiconductor film 32 and the oxide semiconductor film 31 and the interface between the oxide semiconductor film 32 and the oxide semiconductor film 33. The field-effect mobility of the transistor TA1 can be thus higher than those of the transistor TA2 and TB1, and in addition, the drain current in an on-state (on-state current) can be increased.

<Transistor TA2>

The transistor TA2 includes a gate electrode GE2, a source electrode SE2, a drain electrode DE2, a back gate electrode BGE2, and an oxide semiconductor layer OS2. The electrode BGE2 is in contact with the electrode GE2 through an opening CG2 formed in the insulating layers 21 to 23. The transistor TA2 is a variation of the transistor TA1; unlike in the transistor TA1, the layer OS2 of the transistor TA2 is a single layer of the oxide semiconductor film 33, and other points are the same. A channel length La2 and a channel width Wa2 of the transistor TA2 are equal to the channel length La1 and the channel width Wa1 of the transistor TA1 respectively.

<Transistor TB1>

The transistor TB1 includes a gate electrode GE3, a source electrode SE3, a drain electrode DE3, and an oxide semiconductor layer OS3. The transistor TB1 is a variation of the transistor TA2. Like in the transistor TA2, the layer OS3 of the transistor TB1 is formed with a single-layer structure of the oxide semiconductor film 33. Unlike the transistor TA2, the transistor TB1 does not include a back gate electrode. In addition, the transistor TB1 differs from the transistor TA2 in the layout and size of the layer OS3 and the electrodes GE3, SE3, and DE3. As shown in FIG. 1C, regions of the layer OS3 not overlapping with the electrode GE3 overlap with the electrode SE3 or DE3. A channel width Wb1 of the transistor TB1 is thus determined by the width of the layer OS3. A channel length Lb1 is determined by the distance between the electrodes SE3 and DE3 like in the transistor TA2, and is longer than the channel length La2 of the transistor TA2.

[Insulating Layer]

The insulating layers 21, 22, and 23 are formed over the entire regions over the substrate 10 where the transistors TA1, TA2, and TB1 are formed. Each of the insulating layers 21, 22, and 23 is a single film or multilayer film. The insulating layer 21 serves as a gate insulating layer of the transistors TA1, TA2, and TB1. The insulating layers 22 and 23 each serve as a gate insulating layer on the backchannel side of the transistors TA1 TA2, and TB1. The insulating layer 23, which is the uppermost film, is preferably formed using a material that allows it to serve as a protective film of a transistor over the substrate 10. The insulating layer 23 is provided if necessary. In order to insulate the electrode BGE1 in the third layer from the electrodes SE1 and DE1 in the second layer, at least one insulating film is formed therebetween.

Examples of the insulating film used for the insulating layers 21 to 23 include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method.

[Oxide Semiconductor Film]

In this embodiment, an oxide semiconductor film used for a semiconductor layer of an OS transistor is described. In the case where the semiconductor layer is multilayer like the layer OS1, the oxide semiconductor films forming the multilayer semiconductor layer are preferably metal oxide films containing at least one metal element that is the same, more preferably containing In.

When the oxide semiconductor film 31 is an In—Ga oxide film, for example, the atomic proportion of In is set smaller than that of Ga. When the oxide semiconductor film 31 is an In-M-Zn oxide film (M is Al, Ga, Y, Zr, La, Ce, or Nd), the atomic proportion of In is set smaller than the atomic proportion of M, and the atomic proportion of Zn can be the largest among the three.

When the oxide semiconductor film 32 is an In—Ga oxide film, for example, the atomic proportion of In is set larger than the atomic proportion of Ga. When the oxide semiconductor film 32 is an In-M-Zn oxide film, the atomic proportion of In is set larger than the atomic proportion of M. In the case of an In-M-Zn oxide film, the atomic proportion of In is preferably larger than the atomic proportions of M and Zn.

When the oxide semiconductor film 33 is an In—Ga oxide film, for example, the atomic proportion of In is set equal to or smaller than the atomic proportion of Ga. When the oxide semiconductor film 33 is an In-M-Zn oxide film, the atomic proportion of In is set equal to the atomic proportion of M, and the atomic proportion of Zn can be larger than those of In and M. Here, the oxide semiconductor film 33 is a film including channel formation regions of the transistors TA2 and TB1.

When the oxide semiconductor films 31 to 33 are formed by sputtering, the atomic proportions of the films can be adjusted by adjusting the atomic proportions or the like of the target compositions. When the oxide semiconductor films 31 to 33 are formed by CVD, the atomic proportions of the films can be adjusted by adjusting the flow rates of source gases or the like. A deposition target for forming In-M-Zn oxide films by sputtering as the oxide semiconductor films 31 to 33 will be described below as an example.

When the atomic ratio of metal elements of a target for the oxide semiconductor film 31 is In:M:Zn=$x_1$:$y_1$:$z_1$, $x_1/y_1$ is preferably greater than or equal to ⅙ and less than 1; $z_1/y_1$ is preferably greater than or equal to ⅓ and less than or equal to 6, further preferably greater than or equal to 1 and less than or equal to 6.

Typical examples of the atomic ratio of the metal elements in the target are In:M:Zn=1:3:2, In:M:Zn=1:3:4, In:M:Zn=1:3:6, In:M:Zn=1:3:8. In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

When the atomic ratio of metal elements of a target for the oxide semiconductor film 32 is In:M:Zn=$x_2$:$y_2$:$z_2$, $x_2/y_2$ is preferably greater than 1 and less than or equal to 6; $z_2/y_2$ is preferably greater than 1 and less than or equal to 6. Typical examples of the atomic ratio of the metal elements in the target are In:M:Zn=2:1:1.5, In:M:Zn=2:1:2.3, In:M:Zn=2:1:3, In:M:Zn=3:1:2, In:M:Zn=3:1:3, and In:M:Zn=3:1:4.

When the atomic ratio of metal elements of a target for the oxide semiconductor film 33 is In:M:Zn=$x_3$:$y_3$:$z_3$, $x_3/y_3$ is preferably greater than or equal to ⅙ and less than or equal to 1; $z_3/y_3$ is preferably greater than or equal to ⅓ and less than or equal to 6, further preferably greater than or equal to 1 and less than or equal to 6. Typical examples of the atomic ratio of the metal elements in the target are In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6. In:M:Zn=1:5:7, In:M:Zn=1:5:8, and In:M:Zn=1:6:8.

When the atomic ratio of metal elements of an In-M-Zn oxide deposition target is In:M:Zn=x:y:z, $1 \le z/y \le 6$ is preferably satisfied because a CAAC-OS film is easily formed as an In-M-Zn oxide film. Note that the CAAC-OS film is described later.

Oxide semiconductor films with low carrier density are used as the oxide semiconductor films 31 to 33. For example, oxide semiconductor films each having a carrier density which is $1 \times 10^{17}/cm^3$ or lower, preferably $1 \times 10^{15}/cm^3$ or lower, further preferably $1 \times 10^{13}/cm^3$ or lower, particularly preferably $8 \times 10^{11}/cm^3$ or lower, still further preferably $1 \times 10^{11}/cm^3$ or lower, yet further preferably $1 \times 10^{10}/cm^3$ or lower, and is $1 \times 10^{-9}/cm^3$ or higher are used as the oxide semiconductor films 31 to 33.

Note that it is preferable to use, as the oxide semiconductor films 31 to 33, oxide semiconductor films in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film provides an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor that contains hydrogen is likely to be normally on.

It is thus preferable that hydrogen be reduced as much as possible as well as the oxygen vacancies in the oxide semiconductor films 31 to 33. Specifically, in each of the oxide semiconductor films 31 to 33, the concentration of hydrogen which is measured by secondary ion mass spectrometry (SIMS) is set to be lower than or equal to $5\times10^{19}$ atoms/cm$^3$, preferably lower than or equal to $1\times10^{19}$ atoms/cm$^3$, further preferably lower than $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still furthermore preferably lower than or equal to $1\times10^{16}$ atoms/cm$^3$.

When the oxide semiconductor films 31 to 33 contain silicon or carbon, which is an element belonging to Group 14, oxygen vacancies in the films are increased, so that the films become n-type. For this reason, the concentration of silicon or carbon (the concentration is measured by SIMS) of each of the oxide semiconductor films 31 to 33 is set to be lower than or equal to $2\times10^{18}$ atoms/cm$^3$, preferably lower than or equal to $2\times10^{17}$ atoms/cm$^3$.

The concentration of alkali metal or alkaline earth metal in each of the oxide semiconductor films 31 to 33, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 31 to 33.

When containing nitrogen, the oxide semiconductor films 31 to 33 easily become n-type by generation of electrons serving as carriers and an increase of carrier density. Thus, a transistor including an oxide semiconductor which contains nitrogen is likely to be normally on, and the content of nitrogen in the oxide semiconductor films 31 to 33 is preferably reduced as much as possible. For example, the nitrogen concentration which is measured by SIMS is preferably set to be, for example, lower than or equal to $5\times10^{18}$ atoms/cm$^3$.

Without limitation to the oxide semiconductor films 31 to 33 described above, other oxide semiconductor films with appropriate compositions can be used depending on required semiconductor characteristics and electrical characteristics (e.g., field-effect mobility and threshold voltage) of transistors. To obtain the required semiconductor characteristics and electrical characteristics of the transistor, it is preferable that the carrier density, the impurity concentration, the defect density, the atomic ratio of a metal element to oxygen, the interatomic distance, the density, and the like of each of the oxide semiconductor films 31 to 33 be set to appropriate values.

The transistor TA1 can have high field-effect mobility because a channel is formed in the oxide semiconductor film 32 in which the atomic proportion of In is larger than the atomic proportion of Ga or M (M is Al, Ga, Y, Zr, La, Ce, or Nd). For example, the field-effect mobility is higher than 10 cm$^2$/Vs and lower than 60 cm$^2$/Vs, preferably higher than or equal to 15 cm$^2$/Vs and lower than 50 cm$^2$/Vs. The transistor TA1 is thus preferably used in a driver circuit which needs to operate at high speed in an active matrix display device.

The field-effect mobility of the transistors TA2 and TB1 in which a channel formation region is formed in the oxide semiconductor film 33 is approximately 3 cm$^2$/Vs or higher and 10 cm$^2$/Vs or lower, which is lower than that of the transistor TA1. Because the transistors TA2 and TB1 do not include the oxide semiconductor film 32, they are less degraded by light than the transistor TA1 and thus the amount of off-state current increased by light irradiation is small. For this reason, the transistors TA2 and TB1 in which a channel formation region is formed in the oxide semiconductor film 33 are preferably used for a pixel portion, which is subjected to light irradiation. The transistors with a field-effect mobility of approximately 10 cm$^2$/Vs or lower can have a channel length of 2.5 μm or more.

The amount of off-state current increased by light irradiation is likely to be large in the transistor TA1 as compared to the transistor TA2 not including the oxide semiconductor film 32. This is the reason why the transistor TA1 is more suitable for a peripheral circuit of a pixel portion (e.g., a driver circuit), which is less influenced by light, than for the pixel portion, which cannot be sufficiently shielded from light. Needless to say, a transistor like the transistors TA2 and TB1 can be provided in a circuit outside the pixel portion, such as the driver circuit.

The structures of transistors are not limited to those of the transistors TA1, TA2, and TB1 described above, and the structure of the transistor can be changed depending on the required semiconductor characteristics and electrical characteristics of the transistor. For example, the presence or absence of a back gate electrode, a stacked-layer structure of an oxide semiconductor layer, the shapes and positions of an oxide semiconductor layer, a gate electrode, and source and drain electrodes, and the like can be appropriately changed. Other structure examples of transistors are described below.

<Transistors TA3 and TA4>

Figure 3A:
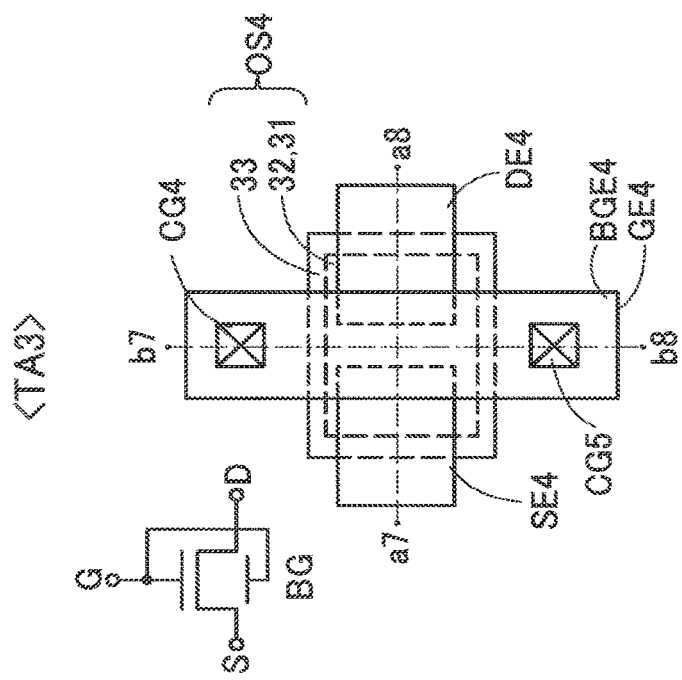
Figure 4A:
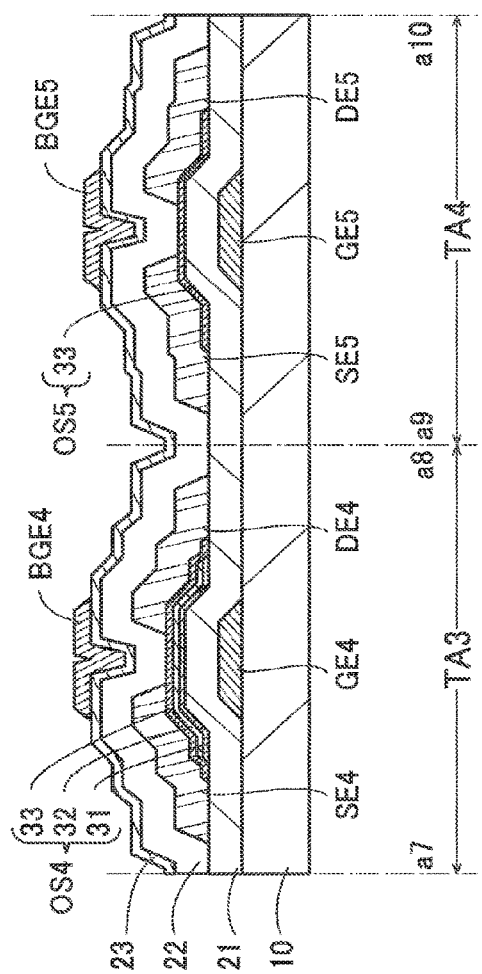
FIGS. 4A and 4B illustrate structure examples of semiconductor devices.
Figure 4B:
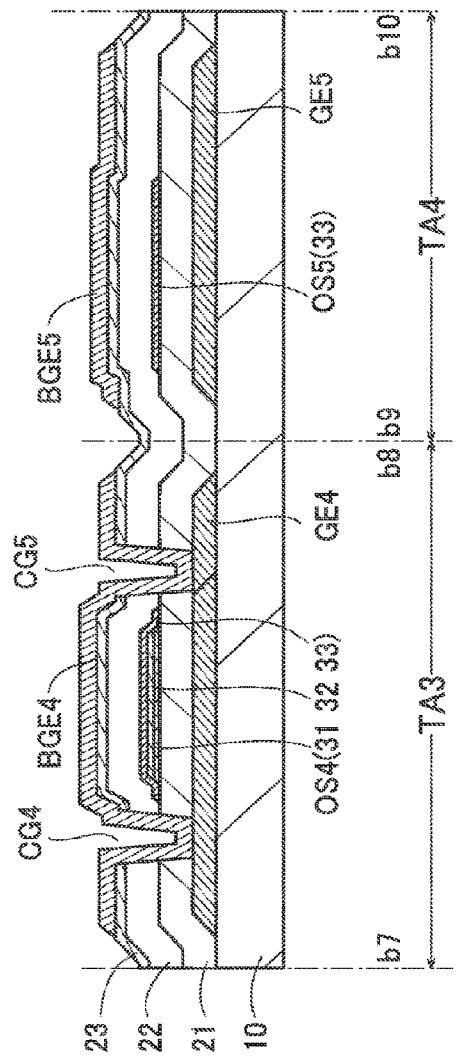

FIGS. 3A and 3B respectively show top views (layouts) and circuit symbols of transistors TA3 and TA4. FIGS. 4A and 4B are cross-sectional views of the transistors TA3 along line a7-a8 and b7-b8 and TA4 along line a9-a10 and b9-b10.

The transistor TA3 includes a gate electrode GE4, an oxide semiconductor layer OS4, a source electrode SE4, a drain electrode DE4, and a back gate electrode BGE4. The transistor TA3 is a variation of the transistor TA1. The transistor TA3 is similar to the transistor TA1 except that the electrode BGE4 is in contact with the electrode GE4 through two openings CG4 and CG5. As shown in FIG. 4B, the layer OS4 is surrounded by the electrodes GE4 and BGE4 in the channel width direction, which increases the strength of the transistor TA3.

The transistor TA4 includes a gate electrode GE5, an oxide semiconductor layer OS5, a source electrode SE5, a drain electrode DE5, and a back gate electrode BGE5. The transistor TA4 is a variation of the transistor TA2. Unlike in the transistor TA2, the electrode BGE5 is not connected to the electrode GE5 and thus different signals or potentials can be input to the electrode BGE5 and the electrode GE5. For example, a signal for controlling the on/off state of the transistor TA4 is input to the electrode GE5, whereas a signal or a potential for correcting the threshold voltage of the transistor TA4 is input to the electrode BGE5.

<Transistors TC1, TB2, and TD1>

FIGS. 5A, 5B, and 5C show top views (layouts) and circuit symbols of transistors TC1, TB2, and TD1, respectively. FIGS. 6A and 6R are cross-sectional views of the transistors TC1 along line a11-a12 and b11-b12. TB2 along line a13-a14 and b13-b14, and TD1 along line a15-a16 and b15-b16.

The transistor TC1 includes a gate electrode GE6, an oxide semiconductor layer OS6, a source electrode SE6, a drain electrode DE6, and a back gate electrode BGE6. The electrode BGE6 is in contact with the electrode GE6 through an opening CG6. The transistor TC1 is a variation of the transistor TA1, in which the layer OS6 has a two-layer structure of the oxide semiconductor film 32 and the oxide semiconductor film 33. A channel formation region of the transistor TC1 is formed in the oxide semiconductor film 32, like in the transistor TA1. The field-effect mobility of the transistor TC1 is thus as high as that of the transistor TA1, i.e., for example, greater than 10 $cm^2/Vs$ and less than 60 $cm^2/Vs$, preferably greater than or equal to 15 $cm^2/Vs$ and less than 50 $cm^2/Vs$. Like the transistor TA1, the transistor TC1 is also suitable as a high-speed transistor in a driver circuit.

The transistor TB2 includes a gate electrode GE7, an oxide semiconductor layer OS7, a source electrode SE7, a drain electrode DE7, and a back gate electrode BGE7. The electrode BGE7 is in contact with the electrode GE7 through an opening CG7. The transistor TB2 is a variation of the transistor TB1 and differs from the transistor TB1 in including the electrode BGE7. Since the transistor TB2 includes the electrode BGE7 connected to the electrode GE7, the transistor TB2 has higher on-state current, higher field-effect mobility, and higher mechanical strength than the transistor TB1.

The transistor TD1 includes a gate electrode GE8, an oxide semiconductor layer OS8, a source electrode SE8, and a drain electrode DE8. The transistor TD1 is a variation of the transistor TB1 and differs from the transistor TB1 in that the entire layer OS8 overlaps with the electrode GE8 and the layer OS8 does not exist outside the end portion of the electrode GE8. With this structure, the transistor TD1 is suitable for a pixel portion because the layer OS8 in the transistor TD1 is less exposed to light than in the transistor TB1.

<<Example of Manufacturing Method of Transistors>>

An example of a method for manufacturing a semiconductor device is described below. Here, an example of a method for forming the transistor TA1, the transistor TA2, and the transistor TB1 in the same process is described. Note that another transistor (e.g., the transistor TA3) can be manufactured in a similar manner. Here, the method for forming the transistors is described with reference to FIGS. 7A to 7C, FIGS. 8A and 8B, and FIGS. 9A to 9C which show, like FIG. 2A, cross-sections of the transistors in the channel length direction.

Films of the transistors TA1, TA2, and TB1 (e.g., an insulating film, an oxide semiconductor film, a metal oxide film, and a conductive film) can be formed by sputtering, chemical vapor deposition (CVD), vacuum vapor deposition, or pulsed laser deposition (PLD). Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

The variety of films such as the metal film, the semiconductor film, and the inorganic insulating film can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2$ $H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamnide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

First, a conductive film 51 to be the gate electrodes GE1, GE2, and GE3 is formed over the substrate 10 (FIG. 7A).

[Substrate 10]

The type of the substrate 10 is not limited to a certain type, and any of a variety of substrates can be used as the substrate 10. Examples of the substrate 10 include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

A base insulating film may be formed over the substrate 10 before the conductive film 51 is formed. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as a base insulating film, it is possible to suppress diffusion of impurities (typically, an alkali metal, water, hydrogen, and the like) into the oxide semiconductor layers OS1 to OS3 from the substrate 10.

Alternatively, a flexible substrate can be used as the substrate 10, and the transistors TA1, TA2, and TB1 can be provided directly on the flexible substrate. It is also possible to form the transistors TA1, TA2, and TB1 and then separate a substrate used for the formation of the transistors and attach a flexible substrate as the substrate 10. This will be described later.

[Gate Electrodes GE1, GE2, and GE3]

The conductive film 51 is a single-layer conductive film or multilayer conductive film. As the conductive film 51, a conductive film can be formed using a metal element selected from aluminum, chromium, copper, tantalum, titanium, molybdenum, and tungsten; an alloy containing any of these metal elements as a component; an alloy containing any of these metal elements in combination; or the like. Alternatively, one or more metal elements selected from manganese and zirconium can be used. Alternatively, an alloy or a nitride that contains aluminum and one or more elements selected from titanium, tantalum, tungsten, molybdenum, chromium, neodymium, and scandium can be used. Alternatively, a light-transmitting metal oxide such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used.

An aluminum film containing silicon can be formed as the conductive film 51, for example. For the conductive film 51, for example, a two-layer structure where a titanium film is formed over an aluminum film, a titanium film is formed over a titanium nitride film, a tungsten film is formed over a titanium nitride film, or a tungsten film is formed over a tantalum nitride film or a tungsten nitride film can be used. Alternatively, a three-layer structure where an aluminum film is sandwiched between titanium films may be employed for the conductive film 51.

The conductive film 51 can be formed by a sputtering method, a vacuum evaporation method, a pulsed laser deposition (PLD) method, a thermal CVD method, or the like. Here, a 100-nm-thick tungsten film is formed as the conductive film 51 by a sputtering method.

Note that a tungsten film can be formed with a deposition apparatus utilizing an ALD method. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

A mask RM1 (not shown) is formed over the conductive film 51 by a photolithography process. Next, the conductive film 51 is etched using the mask RM1 to form the gate electrodes GE1 to GE3. After that, the mask RM1 is removed.

Note that the gate electrodes GE1 to GE3 can be formed by an electrolytic plating method, a printing method, an ink-jet method, or the like instead of the above formation method.

[Insulating Layer 21 (Gate Insulating Layer)]

The insulating layer 21 is formed to cover the gate electrodes GE1 to GE3 (FIG. 7B). The insulating layer 21 is a single layer or a multilayer (two or more layers). An oxide insulating film, a nitride insulating film, an oxynitride insulating film, a nitride oxide insulating film, or the like can be used as the insulating layer 21. In this specification, oxynitride refers to a substance which includes more oxygen than nitrogen, and nitride oxide refers to a substance which includes more nitrogen than oxygen.

As the insulating layer 21, an insulating film including silicon oxide, silicon oxynitride, silicon nitride oxide, silicon nitride, aluminum oxide, gallium oxide, a Ga—Zn-based metal oxide, or the like can be used. A film including a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide may be used as the insulating film, in which case gate leakage current of the transistor can be reduced.

Since the insulating layer 21 is included in a gate insulating layer, regions of the insulating layer 21 that are in contact with the oxide semiconductor layers OS1, OS2, and OS3 are preferably formed using an oxide insulating film or an oxynitride insulating film in order to improve the interface characteristics between the oxide semiconductor layers OS1, OS2, and OS3 and the gate insulating layer. For example, the uppermost film of the insulating layer 21 can be a silicon oxide film or a silicon oxynitride film.

The thickness of the insulating layer 21 is, for example, greater than or equal to 5 nm and less than or equal to 400 nm, preferably greater than or equal to 10 nm and less than or equal to 300 nm, further preferably greater than or equal to 50 nm and less than or equal to 250 nm.

[Oxide Semiconductor Layers OS1, OS2, and OS3]

The oxide semiconductor film 31 is formed over the insulating layer 21, and the oxide semiconductor film 32 is formed over the oxide semiconductor film 31 (FIG. 7C). A mask RM2 (not shown) is formed over the oxide semiconductor film 32 by a photolithography process. The oxide semiconductor film 31 and the oxide semiconductor film 32 are etched using the mask RM2, whereby the first layer (31) and the second layer (32) of the layer OS1 are formed. Then, the mask RM2 is removed.

The oxide semiconductor film 33 is formed to cover the insulating layer 21 and the oxide semiconductor films 31 and 32 (FIG. 8A). A mask RM3 (not shown) is formed over the oxide semiconductor film 33 by a photolithography process. The oxide semiconductor film 33 is etched using the mask RM3; thus, the layer OS1, the layer OS2, and the layer OS3 are formed. Then, the mask RM3 is removed (FIG. 8B).

In the case where the oxide semiconductor films are formed by sputtering, a power source for generating plasma can be an RF power source, an AC power source, a DC power source, or the like as appropriate. As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen to a rare gas is preferably increased. A target may be appropriately selected in accordance with the compositions of the oxide semiconductor films to be formed.

For example, in the case where the oxide semiconductor films are formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor films 31 to 33 can each be a CAAC-OS film. For the deposition of the CAAC-OS film, the following conditions are preferably used.

By suppressing entry of impurities into the film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used. Furthermore, it is preferable that the proportion of oxygen in the deposition gas be increased and the power be optimized in order to reduce plasma damage at the deposition. The proportion of oxygen in the deposition gas is preferably 30 vol % or higher, further preferably 100 vol %.

By forming the oxide semiconductor film while it is heated or performing heat treatment after the formation of the oxide semiconductor film, the hydrogen concentration of the oxide semiconductor film can be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than $5 \times 10^{18}$ atoms/cm$^3$, further preferably lower than or equal to $1 \times 10^{18}$ atoms/cm$^3$, yet preferably lower than or equal to $5 \times 10^{17}$ atoms/cm$^3$, furthermore preferably lower than or equal to $1 \times 10^{16}$ atoms/cm$^3$.

When the heat treatment is performed at a temperature higher than 350° C. and lower than or equal to 650° C., preferably higher than or equal to 450° C. and lower than or equal to 600° C. it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed.

In the case where an oxide semiconductor film, e.g., an In—Ga—Zn—O film is formed using a deposition apparatus employing ALD, for example, an In(CH$_3$)$_3$ gas and an O$_3$ gas are sequentially introduced plural times to form an In—O layer, a Ga(CH$_3$)$_3$ gas and an O$_3$ gas are introduced at a time to form a Ga—O layer, and then a Zn(CH$_3$)$_2$ gas and an O$_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

The oxide semiconductor films 32 and 33 are each a film where a channel of a transistor is formed and the thickness of each film can be greater than or equal to 3 nm and less than or equal to 200 nm, preferably greater than or equal to 3 nm and less than or equal to 100 nm, more preferably greater than or equal to 30 nm and less than or equal to 50 nm. The thickness of the oxide semiconductor film 31 is, for example, greater than or equal to 3 nm and less than or equal to 100 nm, preferably greater than or equal to 3 nm and less than or equal to 30 nm, more preferably greater than or equal to 3 nm and less than or equal to 15 nm. The thickness of the oxide semiconductor film 31 is preferably smaller than those of the oxide semiconductor films 32 and 33.

Here, In—Ga—Zn films are deposited by sputtering as the oxide semiconductor films 31, 32, and 33. The atomic ratio of metal elements (In:Ga:Zn) of a target for depositing the films is, for example, 1:3:6 for the oxide semiconductor film 31, 3:1:2 for the oxide semiconductor film 32, and 1:1:1.2 or 1:1:1 for the oxide semiconductor film 33. For example, the thicknesses of the oxide semiconductor films 31, 32, and 33 are nm, 35 nm, and 35 nm, respectively.

[Source Electrode and Drain Electrode]

A conductive film 52 is formed to cover the insulating layer 21 and the oxide semiconductor layers OS1, OS2, and OS3 (FIG. 9A). The conductive film 52 can be formed in a manner similar to that of the conductive film 51. Here, the conductive film 52 has a three-layer structure. A 50-nm-thick copper-manganese alloy film, a 400-nm-thick copper film, and a 100-nm-thick copper-manganese alloy film are stacked in this order by a sputtering method.

A mask RM4 (not shown) is formed over the conductive film 52 by a photolithography process and the conductive film 52 is etched using the mask RM4, whereby the electrodes SE1, DE1, SE2, DE2, SE3, and DE3 are formed. Then, the mask RM4 is removed (FIG. 9B). In the step of FIG. 9B, the channel lengths and channel widths of the transistors TA1, TA2, and TB1 are determined.

The channel length of a transistor operated at high speed, such as a transistor used in a driver circuit or the like in an active matrix display device, is preferably short like in the transistors TA1 and TA2 or the transistors TA3, TA4, and TC1. The channel length of such a transistor is preferably less than 2.5 μm, for example, less than or equal to 2.2 μm. The channel length of the transistor in this embodiment depends on the distance between a source electrode and a drain electrode, and the minimum value of the channel length is limited by processing accuracy of the conductive film 52. The channel length of the transistor in this embodiment can be 0.5 μm or more, or 1.0 μm or more, for example.

[Insulating Layers 22 and 23]

The insulating layer 22 is formed to cover the electrodes SE1, DE1, SE2, DE2, SE3, and DE3, the oxide semiconductor layers OS1, OS2, and OS3, and the insulating layer 21, and the insulating layer 23 is formed over the insulating layer 22 (FIG. 9C). The insulating layers 22 and 23 can be formed in a manner similar to that of the insulating layer 21.

A two-layer insulating film can be formed as the insulating layer 22, for example. Here, the first film of the insulating layer 22 is referred to as an insulating film 22a and the second film is referred to as an insulating film 22b.

As the insulating film 22a, an oxide insulating film including silicon oxide or the like can be formed, for example. Alternatively, an oxide insulating film containing nitrogen and having a small number of defects can be formed. Typical examples of such an oxide insulating film include a silicon oxynitride film and an aluminum oxynitride film.

In an electron spin resonance (ESR) spectrum at 100 K or lower of the oxide insulating film with a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width between the first and second signals and the split width between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

Note that the above first to third signals correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the above first to third signals is, the lower the content of nitrogen oxide in the oxide insulating film is.

When the insulating film 22a contains a small amount of nitrogen oxide, the carrier trap at the interface between the insulating film 22a and the layers OS1, OS2, and OS3 can be reduced. As a result, a shift in the threshold voltage of each of the transistors can be reduced, which leads to a smaller change in the electrical characteristics of the transistors.

In order to improve the reliability of the transistors, the insulating film 22a preferably has a nitrogen concentration measured by SIMS of lower than or equal to $6\times10^{20}$ atoms/cm$^3$. This is because in that case nitrogen oxide is unlikely to be generated in the insulating film 22a through the manufacturing process of the transistors.

A silicon oxynitride film, which is an example of an oxide insulating film containing nitrogen and having a small number of defects, can be formed by CVD as the insulating film 22a. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

An oxide insulating film containing nitrogen and having a small number of defects can be formed as the insulating film 22a by CVD under the conditions that the ratio of an oxidizing gas to a deposition gas is higher than 20 times and lower than 100 times, preferably higher than or equal to 40 times and lower than or equal to 80 times and pressure in a treatment chamber is lower than 100 Pa, preferably lower than or equal to 50 Pa.

The insulating film 22b can be formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 22b. When the insulating film 22b is formed using an oxide insulating film which contains oxygen at a higher proportion than that in the stoichiometric composition, a silicon oxynitride film can be formed as the oxide insulating film by CVD.

The conditions for depositing a silicon oxide film or a silicon oxynitride film as the insulating film 22b will be described. The substrate placed in a treatment chamber of the plasma CVD apparatus, which is vacuum-evacuated, is held at a temperature higher than or equal to 180° C. and lower than or equal to 280° C., preferably higher than or equal to 200° C. and lower than or equal to 240° C., the pressure is set greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the insulating layer 23, a film having an effect of blocking at least hydrogen and oxygen is used. Preferably, the insulating layer 23 has an effect of blocking oxygen, hydrogen, water, an alkali metal, an alkaline earth metal, or the like. Typically, a nitride insulating film such as a silicon nitride film, a silicon nitride oxide film, an aluminum nitride film, or an aluminum nitride oxide film can be used.

The insulating layer 23 may include an oxide insulating film having a blocking effect against oxygen, hydrogen, water, and the like, i.e., an aluminum oxide film, an aluminum oxynitride film, a gallium oxide film, a gallium oxynitride film, an yttrium oxide film, an yttrium oxynitride film, a hafnium oxide film, a hafnium oxynitride film, or the like.

The thickness of the insulating layer 23 may be greater than or equal to 50 nm and less than or equal to 300 nm, preferably greater than or equal to 100 nm and less than or equal to 200 nm. The insulating layer 23 that has an effect of blocking oxygen, hydrogen, water, and the like can prevent oxygen diffusion from the oxide semiconductor films 31 to 33 to the outside, and entry of hydrogen, water, and the like from the outside to the oxide semiconductor films 31 to 33.

In the case where a silicon nitride film is formed by the plasma CVD method as the insulating layer 23, a deposition gas containing silicon, nitrogen, and ammonia are preferably used as a source gas. These source gases are used, and ammonia is dissociated in the plasma and activated species are generated. The activated species break a bond between silicon and hydrogen that are contained in a deposition gas containing silicon and a triple bond between nitrogen molecules. As a result, a dense silicon nitride film having a small number of defects, in which bonds between silicon and nitrogen are promoted and bonds between silicon and hydrogen is few, can be formed. When the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to and less than or equal to 50.

Heat treatment may be performed after the insulating layer 22 is formed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, oxygen contained in the oxide insulating film which is the second layer of the insulating layer 22 can move to the oxide semiconductor films 31 to 33, so that the amount of oxygen vacancies contained in these oxide semiconductor films can be reduced. The heat treatment may be performed at 350° C. in a mixed atmosphere containing nitrogen and oxygen for one hour.

Heat treatment to release hydrogen or the like from the oxide semiconductor films 31 to 33 may be performed after the insulating layer 23 is formed. The heat treatment may be performed at 350° C. in a mixed atmosphere containing nitrogen and oxygen for one hour.

[Back Gate Electrode]

A mask RM5 (not shown) is formed over the insulating layer 23 by a photolithography process and the insulating layers 21 to 23 are etched using the mask RM5; thus, the openings CG1 and CG2 which penetrate these insulating layers are formed (FIG. 2B). The mask RM5 is removed, and a conductive film 53 is formed over the insulating layer 23 (FIG. 9C). The conductive film 53 can be formed in a manner similar to that of the conductive film 51.

A mask RM6 (not shown) is formed over the conductive film 53 by a photolithography process and the conductive film 53 is etched using the mask RM6, whereby the back gate electrodes BGE1 and BGE2 are formed. Then, the mask RM6 is removed (FIGS. 2A and 2B).

As described above, the transistors (TA1, TA2, and TB1) with different structures can be formed over one substrate with the use of the six masks RM1 to RM6. Note that in the case where a transistor including an oxide semiconductor layer with a two-layer structure (e.g., TC1) and a transistor including an oxide semiconductor layer with a single-layer structure (e.g., TB1) are formed concurrently over one substrate, only the oxide semiconductor film 32 is formed in the step of FIG. 7C.

Other structure examples of transistors are described below. Here, transistors that differ from the transistors TA1, TA2, and TB1 in the stacking order of a gate electrode, an oxide semiconductor layer, a source electrode, a drain electrode, and a back gate electrode are described.

<Transistors TE1, TE2, and TF1>

Figure 10A:
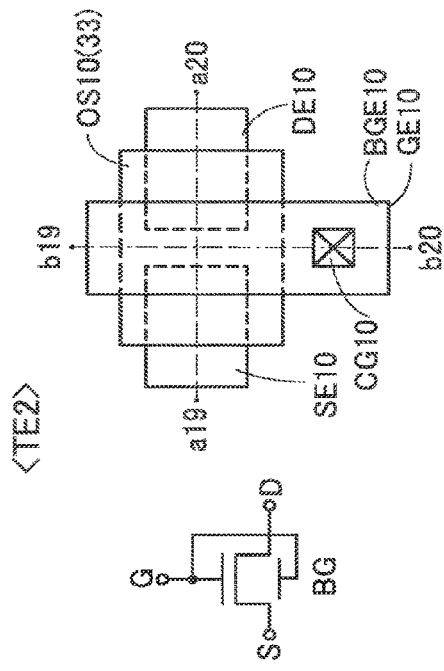
FIGS. 10A to 10C illustrate structure examples of semiconductor devices.
Figure 10B:
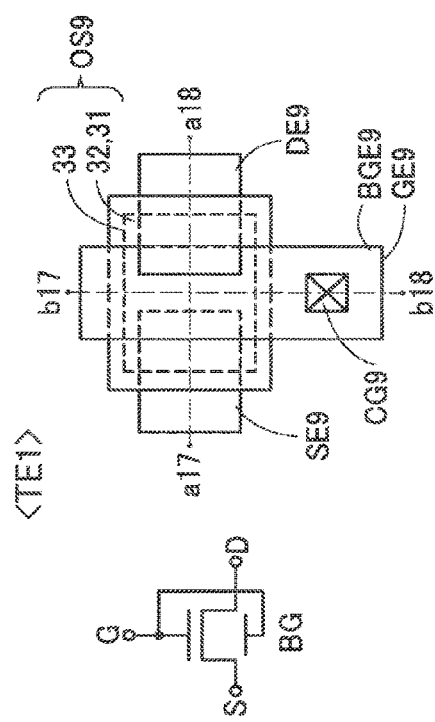
Figure 10C:
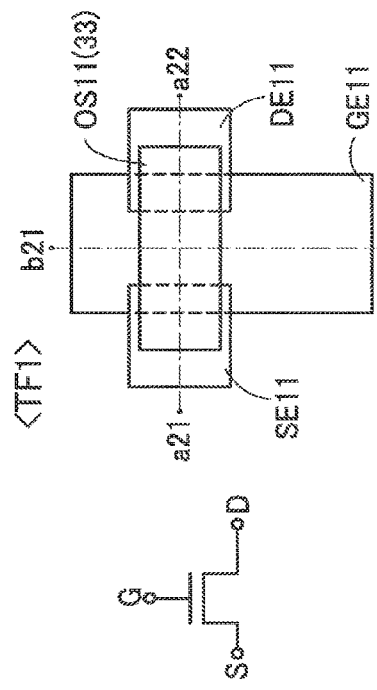

FIGS. 10A, 10B, and 10C show top views (layouts) and circuit symbols of transistors TE1, TE2, and TF1, respectively. FIGS. 11A and 11B are cross-sectional views of the transistors TE1 along line a17-a18 and b17-b18, TE2 along line a19-a20 and b19-b20, and TF1 along line a21-a22 and b21-b22.

The transistor TE1 is a variation of the transistor TA1 (FIG. 1A and FIGS. 2A and 2B). The transistor TE1 includes a gate electrode GE9, an oxide semiconductor layer OS9, a source electrode SE9, a drain electrode DE9, and a back gate electrode BGE9. The electrode BGE9 is in contact with the electrode GE9 through an opening CG9. In the transistor TE1, the layer OS9 is formed over the source electrode SE9 and the drain electrode DE9.

The transistor TE2 is a variation of the transistor TA2 (FIG. 1B and FIGS. 2A and 2B). The transistor TE2 includes a gate electrode GE10, an oxide semiconductor layer OS10, a source electrode SE10, a drain electrode DE10, and a back gate electrode BGE10. The electrode BGE10 is in contact with the electrode GE10 through an opening CG10. In the transistor TE2, the layer OS10 is formed over the source electrode SE10 and the drain electrode DE10.

The transistor TF1 is a variation of the transistor TB1 (FIG. 1C and FIGS. 2A and 2B). The transistor TF1 includes a gate electrode GE11, an oxide semiconductor layer OS11, a source electrode SE11, and a drain electrode DE11. In the transistor TF1, the layer OS11 is formed over the source electrode SE11 and the drain electrode DE11.

<Transistors TG1, TG2, and TH1>

FIGS. 12A, 12B, and 12C show top views (layouts) and circuit symbols of transistors TG1, TG2, and TH1, respectively. FIGS. 13A and 13B are cross-sectional views of the transistors TG1 along line a23-a24 and b23-b24, TG2 along line a25-a26 and b25-b26, and TH1 along line a27-a28 and b27-b28.

The transistor TG1 is a variation of the transistor TA1 (FIG. 1A and FIGS. 2A and 2B). The transistor TG1 includes a gate electrode GE12, an oxide semiconductor layer OS12, a source electrode SE12, a drain electrode DE12, and a back gate electrode BGE12.

In the transistor TG1, the back gate electrode BGE12 is positioned in the lowermost layer. The source electrode SE12 and the drain electrode DE12 are formed over the electrode BGE12 with an insulating layer 61 provided therebetween. The layer OS12 is formed over the source electrode SE12 and the drain electrode DE12. The gate electrode GE12 is formed over the layer OS12 with an insulating layer 62 provided therebetween. The electrode GE12 is in contact with the electrode BGE12 through an opening CG12 in the insulating layers 61 and 62. An insulating layer 63 is formed to cover the transistor TG1. The insulating layers 61 to 63 can be formed in a manner similar to that of the insulating layer 21.

The transistor TG2 is a variation of the transistor TA2 (FIG. 1B and FIGS. 2A and 2B), and also is a variation of the transistor TOG. The transistor TG2 includes a gate electrode GE13, an oxide semiconductor layer OS13, a source electrode SE13, a drain electrode DE13, and a back gate electrode BGE13. The electrode GE13 is in contact with the electrode BGE13 through an opening CG13 in the insulating layers 61 and 62. The transistor TG2 differs from the transistor TG1 in that the layer OS13 is a single layer (the oxide semiconductor film 33).

The transistor TH1 is a variation of the transistor TB1 (FIG. 1C and FIGS. 2A and 2B). The transistor TH1 includes a gate electrode GE14, an oxide semiconductor layer OS14, a source electrode SE14, and a drain electrode DE14.

<Transistors TG3, TG4, and TH2>

FIGS. 14A, 14B, and 14C show top views (layouts) and circuit symbols of transistors TG3, TG4, and TH2, respectively. FIGS. 15A and 15B are cross-sectional views of the transistors TG3 along line a29-a30 and b29-b30. TG4 along line a31-a32 and b31-b32, and TH2 along line a33-a34 and b33-b34.

The transistor TG3 is a variation of the transistor TG1 (FIG. 12A and FIGS. 13A and 13B). The transistor TG3 includes a gate electrode GE15, an oxide semiconductor layer OS15, a source electrode SE15, a drain electrode DE15, and a back gate electrode BGE15. The electrode GE15 is in contact with the electrode BGE15 through an opening CG15. The transistor TG3 differs from the transistor TG1 in that the source electrode SE15 and the drain electrode DE15 are formed over the layer OS15.

The transistor TG4 is a variation of the transistor TG2 (FIG. 12B and FIGS. 13A and 13B). The transistor TG4 includes a gate electrode GE16, an oxide semiconductor layer OS16, a source electrode SE16, a drain electrode DE16, and a back gate electrode BGE16. The electrode GE16 is in contact with the electrode BGE16 through an opening CG16. The transistor TG4 differs from the transistor TG2 in that the source electrode SE16 and the drain electrode DE16 are formed over the layer OS16.

The transistor TH2 is a variation of the transistor TH1 (FIG. 12C and FIGS. 13A and 13B). The transistor TH2 includes a gate electrode GE17, an oxide semiconductor layer OS17, a source electrode SE17, and a drain electrode DE17. The transistor TH2 differs from the transistor TH1 in that the source electrode SE17 and the drain electrode DE17 are formed over the layer OS17.

Although the structure examples and formation methods of the transistors are described above with reference to FIGS. 1A to 15B, it is needless to say that the transistor of this embodiment is not limited to the transistors shown in the drawings. Modes and details of the above structure examples can be changed in various ways.

Embodiment 2

A semiconductor device including a plurality of circuits with different functions can be formed using any of the transistors of Embodiment 1. In this embodiment, as an example of such a semiconductor device, an active matrix display device is described.

<Configuration Example of Display Device>

Figure 16:
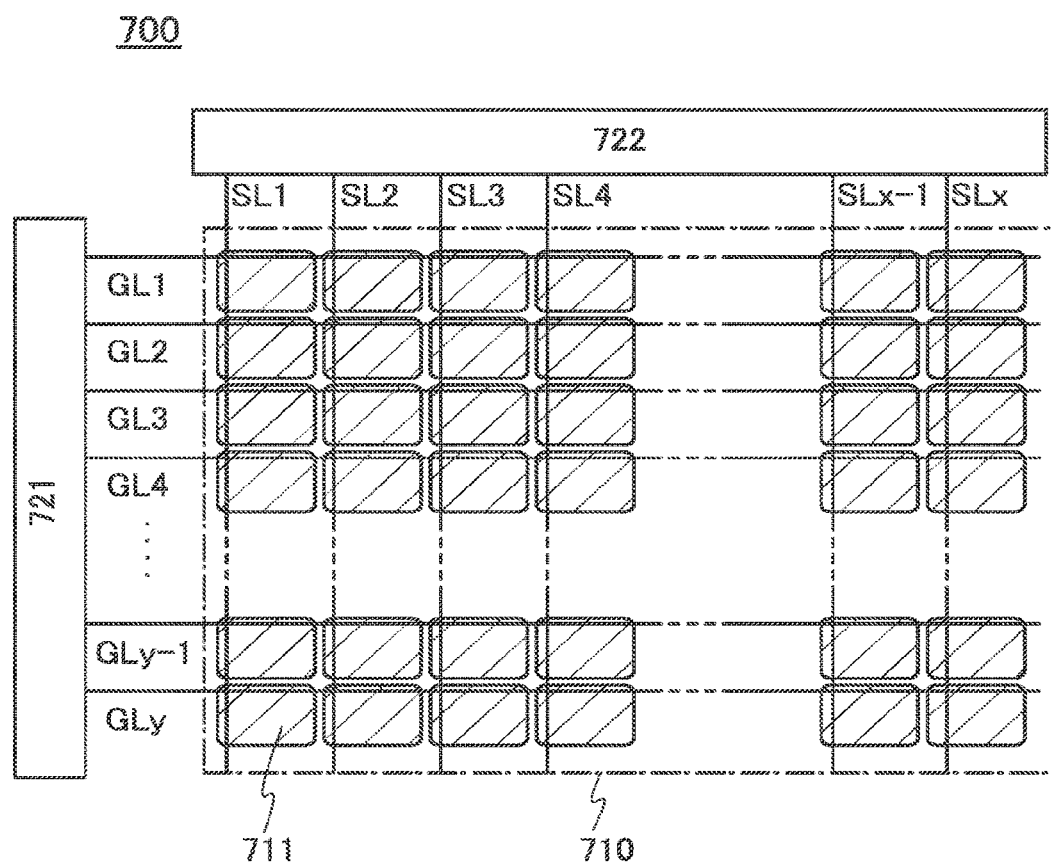
FIG. 16 illustrates a configuration example of a display device.

FIG. 16 is a block diagram illustrating a configuration example of an active matrix display device. As shown in FIG. 16, an active matrix display device 700 (hereinafter referred to as a display device 700) includes a pixel portion 710, a driver circuit 721, and a driver circuit 722. Note that in the description below, the driver circuit 721 and the driver circuit 722 are collectively referred to as a driver circuit portion 720 in some cases.

The pixel portion 710 is provided with y wirings GL (y is a natural number), x wirings SL (x is a natural number), and a plurality of pixels 711. The wiring GL is provided every row. The wiring GL in the first row is denoted by "GL1". The wiring SL is provided every column. The wiring SL in the first column is denoted by "SL1". The pixels 711 are arranged in an array corresponding to the arrangement of the wirings GL and the wirings SL. Each pixel 711 is connected to the wiring GL in the corresponding row and the wiring SL in the corresponding column. For example, the pixel 711 in the second row and the third column is connected to the wiring GL2 and the wiring SL3.

The kinds and number of the wirings in the pixel portion 710 can be determined by the structure, number, and position of the pixels 711. In the pixel portion 710 illustrated in FIG. 16, the pixels 711 are arranged in a matrix of x columns and y rows, and the wirings SL1 to SLx and the wirings GL1 to GLy are provided in the pixel portion 710.

The wirings SL are connected to the driver circuit 722. The wirings GL are connected to the driver circuit 721. The driver circuit 721 has a function of generating a signal for selecting the pixel 711 to which a video signal is to be input, a function of outputting the signal to the wiring GL at a predetermined timing, and the like. The driver circuit 722 has a function of generating a video signal, a function of outputting the video signal to the wiring SL at a predetermined timing, and the like.

Part or the whole of the driver circuit 721 can be provided over the same substrate as the pixel portion 710. Part or the whole of the driver circuit 722 can be provided over the same substrate as the pixel portion 710. When the driver circuit portion 720 includes a circuit that is integrated on a substrate where the pixel portion 710 is provided and a circuit that is formed over a substrate different from the substrate where the pixel portion 710 is provided, wirings and connection terminals for electrically connecting these circuits need to be provided together with the pixel portion 710. Accordingly, part of the display device is occupied, which might limit the flexibility in design such as the size of an electronic device and the position of the display device. In addition, it is preferable to reduce the number of external connection terminals for lower power consumption and reduced manufacturing cost of the display device 700. For these reasons, circuits of the driver circuit portion 720 are preferably formed in the same process and over the same substrate as the pixel portion 710.

Furthermore, the display device 700 is required to have higher definition. In such a case, an increase in the number of pixels in the pixel portion 710 is accompanied by increases in the number of the wirings GL and the number of the wirings SL. The increase in the number of pixels requires high-speed operation of the driver circuit portion 720. In this embodiment, for example, the whole driver circuit 722 is a circuit (e.g., an IC chip) that is formed over a substrate different from the substrate where the pixel portion 710 is provided, and the IC chip including the driver circuit 722 is connected to the wirings SL.

Thus, in this embodiment, a configuration example of a circuit that is used in the driver circuit portion 720 and can be formed together with the pixel portion, an example of a driving method thereof, and the like are described.

<Configuration Example of Sequential Circuit>

FIG. 17A is a circuit diagram illustrating a structure example of a sequential circuit, and FIG. 17B is a block diagram of the sequential circuit.

A sequential circuit SR includes transistors M1 to M15, a capacitor C1, and a capacitor C2. In the circuit SR, signals CLK1, CLK2, CLK3, PWC1, LIN, IN_RES, and RIN are input signals, and signals SROUT and OUT are output signals. In addition, VDD is a high-level power supply potential, and VSS is a low-level power supply potential.

In FIG. 17A, the transistors M1 to M15 are each illustrated as one transistor; however, in an actual circuit, each of M1 to M15 may include a plurality of transistors connected in parallel or in series in some cases. Furthermore, as each of the capacitors, a MOS capacitor formed by connecting a source and a drain of a transistor can be used. The same applies to other circuit diagrams.

In the example of FIG. 17A, the transistors M5 to M7 are each a transistor without a back gate. The other transistors (M1 to M4 and M8 to M15) are each a transistor with a back gate connected to a gate. For example, the transistor TA1 or TA2 (FIGS. 1A to 1C and FIGS. 2A and 2B) can be used as each of the transistors M1 to M4 and M8 to M15, and the transistor TA1 or TA2 without a back gate electrode can be used as each of the transistors M5 to M7.

Alternatively, all the transistors M1 to M15 can each be a transistor with a back gate connected to a gate. In the circuit SR, it is preferable that at least the transistors (M1 and M2) connected to an output terminal of the signal OUT each be a transistor with a back gate connected to a gate. It is further preferable that the transistors M1 and M2 each be a transistor in which an oxide semiconductor layer has a multilayer structure including the oxide semiconductor film 32 as in the transistor TA1. In such a case, even when the transistors M1 and M2 are minute transistors with channel lengths of less than 2.5 μm (furthermore, less than 2.2 μm), the signal OUT with a required potential level can be output surely.

In this embodiment, two terminals (electrodes) functioning as a source and a drain of a transistor are distinguished from each other in some cases for easy understanding of the configurations and operations of circuits. The functions of the source and the drain of the transistor may be interchanged with each other depending on the voltage applied to the transistor. A distinction between a source and a drain of a transistor is not limited to the distinction between the source and the drain of the transistor in this embodiment. Here, the circuit includes OS transistors; therefore, a terminal (electrode) to which a high-level signal and a high-level power supply potential are mainly input is referred to as a drain, and a terminal (electrode) to which a low-level signal and a low-level power supply potential are mainly input is referred to as a source.

A drain of the transistor M1 is connected to a wiring to which the signal PWC1 is supplied, a source thereof is connected to the output terminal of the signal OUT, and a gate thereof is connected to a drain of the transistor M15. A drain of the transistor M2 is connected to the output terminal of the signal OUT, and a source thereof is connected to a wiring to which VSS is supplied. The transistor M10 and the transistor M11 are connected in series, and their gates are connected to a gate of the transistor M2. A drain of the transistor M10 is connected to a source of the transistor M3, and a source of the transistor M11 is connected to the wiring to which VSS is supplied.

Drains of the transistors M3, M5, M7, and M8 and gates of the transistors M4 and M15 are connected to a wiring to which VDD is supplied. Sources of the transistors M2, M11, M13, and M14 are connected to the wiring to which VSS is supplied. A drain of the transistor M9 is connected to a wiring to which CLK1 is supplied, a gate of the transistor M6 is connected to a wiring to which CLK2 is supplied, and a gate of the transistor M5 is connected to a wiring to which CLK3 is supplied. The transistor M5 and the transistor M6 are connected in series.

Gates of the transistors M3, M12, and M13 are connected to a wiring to which the signal LIN is supplied. The transistor M12 and the transistor M13 are connected in series, and a drain of the transistor M12 is connected to the gate of the transistor M2. Gates of the transistors M10, M11, and M14 and sources of the transistors M6, M7, and M8 are also connected to the gate of the transistor M2.

A gate of the transistor M8 is connected to a wiring to which the signal INI_RES is supplied, and a gate of the transistor M7 is connected to a wiring to which the signal RIN is supplied. A source of the transistor M4 is connected to the source of the transistor M3, and a drain of the transistor M4 is connected to a gate of the transistor M9. A source of the transistor M15 is connected to the source of the transistor M3, and the drain of the transistor M15 is connected to the gate of the transistor M1. A source of the transistor M9 and a drain of the transistor M14 are connected to an output terminal of the signal SROUT. The source of the transistor M1 and the drain of the transistor M2 are connected to the output terminal of the signal OUT.

One terminal of the capacitor C1 is connected to the wiring to which VSS is supplied, and the other terminal of the capacitor C1 is connected to the gate of the transistor M2. One terminal of the capacitor C2 is connected to the gate of the transistor M1, and the other terminal of the capacitor C2 is connected to the output terminal of the signal OUT. The capacitors C1 and C2 are provided as appropriate.

Figure 18:
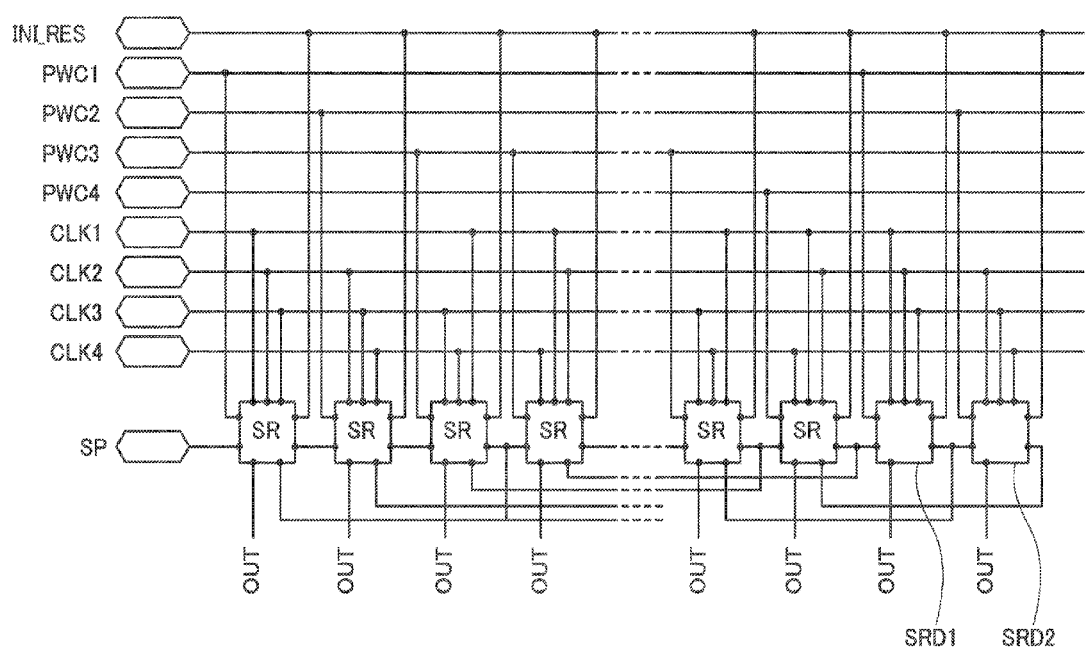
FIG. 18 illustrates a configuration example of a shift register.

A shift register having a function of outputting pulse signals can be formed by connecting a plurality of unit circuits to each other. The sequential circuit SR in FIG. 17A is used as the unit circuit. FIG. 18 illustrates an example of such a shift register.

A shift register 750 illustrated in FIG. 18 includes y sequential circuits SR (y is a natural number of 2 or more). Each of the y sequential circuits SR has the same structure as the sequential circuit SR illustrated in FIG. 17A.

As shown in FIG. 17B and FIG. 18, the output signal SROUT of the circuit SR in the previous stage is input as the signal LIN to the circuit SR in each stage. A start pulse signal SP of the driver circuit portion 720, for example, is input as the signal LIN to the circuit SR in the first stage. The output signal SROUT of the circuit SR in the second subsequent stage is input as the signal RIN to the circuit SR in each stage. Accordingly, in the shift register 750, two dummy sequential circuits SRD1 and SRD2 are additionally provided to follow the sequential circuit SR in the last stage.

The circuit SRD1 is provided to output the signal RIN to the circuit SR in the (y−1)-th stage, and the circuit SRD2 is provided to output the signal RIN to the circuit SR in the y-th stage. Therefore, the circuits SRD1 and SRD2 each have a structure partly different from that of the circuit SR. The circuits SRD1 and SRD2 are not provided with the transistor M7. That is, the structure of each of the circuits SRD1 and SRD2 is different from the structure of the sequential circuit SR shown in FIG. 17A in that a function of controlling the supply of VDD to the gate of the transistor M2 in accordance with the signal RIN is not provided.

As shown in FIG. 18, the four clock signals CLK1 to CLK4 are input to the shift register 750. Three clock signals are input to the circuit SR in each stage as shown in the drawing. Specifically, the signals CLK1, CLK2, and CLK3 are input to the circuit SR in the (4m+1)-th stage. The signals CLK2, CLK3, and CLK4 are input to the circuit SR in the (4m+2)-th stage. The signals CLK3, CLK4, and CLK1 are input to the circuit SR in the (4m+3)-th stage. The signals CLK4, CLK1, and CLK2 are input to the circuit SR in the (4m+4)-th stage. Here, m is an integer which is greater than or equal to 0, while the total number of the circuits SR is y.

The shift register 750 is formed using transistors having the same conductivity type, and therefore can be formed over the same substrate as the pixel portion 710 with few limitations. The shift register 750 can be formed over the same substrate and in the same formation process as the pixel portion 710. The shift register 750 can be used as part or the whole of the driver circuit 721. Alternatively, the shift register 750 can be used as part of the driver circuit 722.

<Configuration Example of Distribution Circuit (Demultiplexer)>

Figures 19A, 19B:
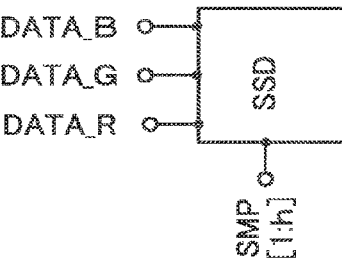
FIGS. 19A and 19B illustrate a configuration example of a distribution circuit.

FIG. 19A is a circuit diagram illustrating a structure example of a distribution circuit (demultiplexer), and FIG. 19B is a block diagram of the distribution circuit. A distribution circuit 760 has a function of distributing one signal to a plurality of wirings in accordance with a sampling signal (control signal). The distribution circuit 760 is provided in the last stage of the driver circuit 722, and the wirings SL are connected to outputs of the distribution circuit 760. The distribution circuit 760 has a function of sequentially selecting n wirings SL from the x wirings SL and bringing the n wirings into electrical conduction.

Figure 20:
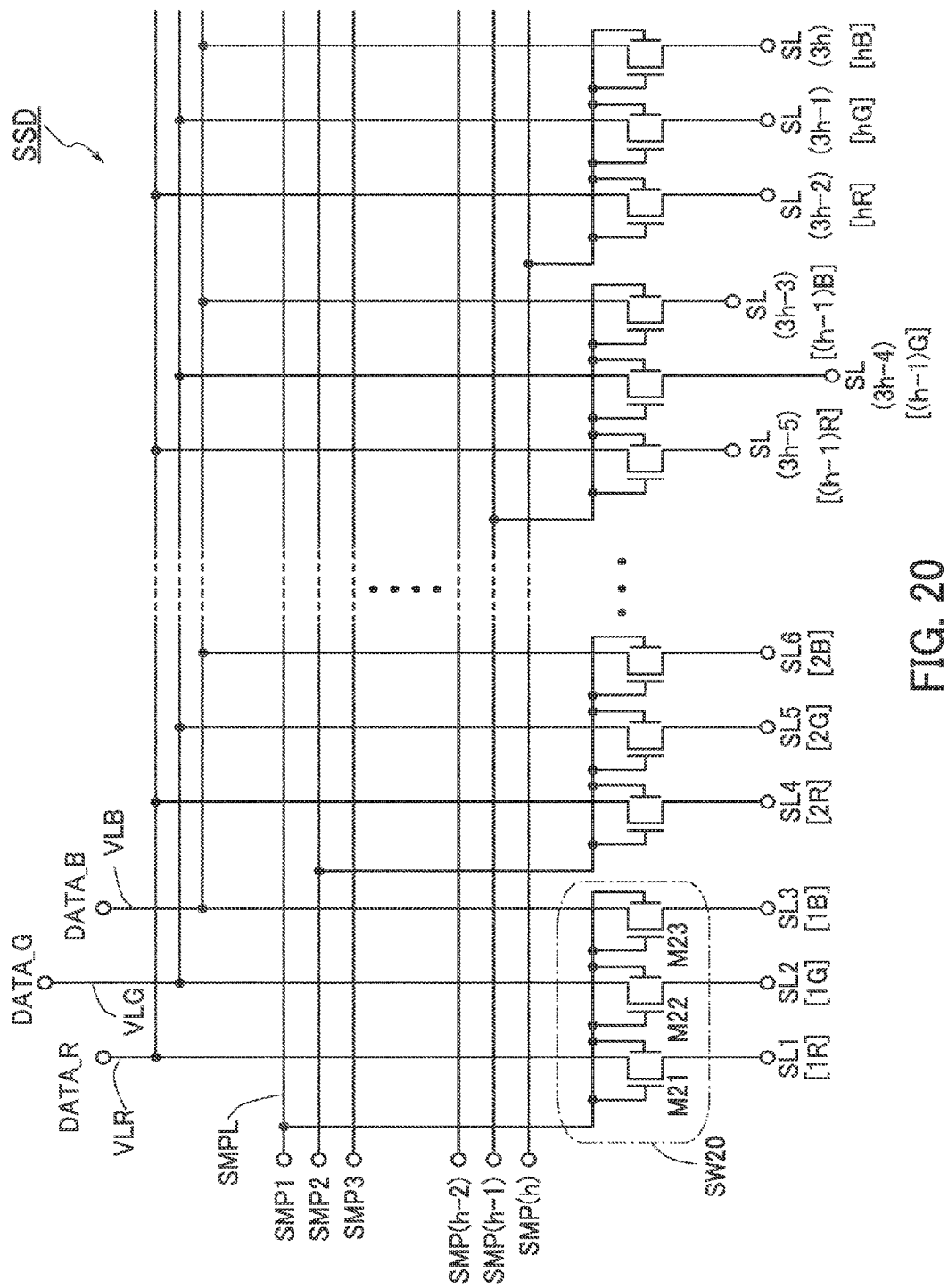
FIG. 20 illustrates a configuration example of a distribution circuit.
Figures 21A, 21B:
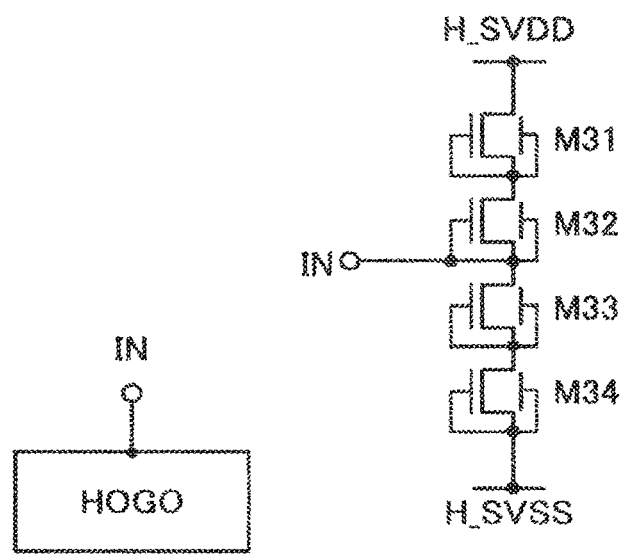

As shown in FIG. 19A, the distribution circuit 760 includes m distribution circuits SSD. The circuit SSD is a unit circuit of the distribution circuit 760. FIG. 19B is a block diagram of the circuit SSD, and FIG. 20 is a circuit diagram thereof. A protective circuit HOGO is connected to an output of the circuit SSD. FIG. 21A is a block diagram of the circuit HOGO, and FIG. 21B is a circuit diagram thereof.

FIG. 19A illustrates an example of the distribution circuit 760 used in a display device in which one image is displayed by combination of a video signal DATA_R for red (R), a video signal DATA_G for green (G), and a video signal DATA_B for blue (B). In the example of FIG. 19A, the distribution circuit 760 enables video signals to be supplied from one video signal line to h wirings SL (h is an integer of 2 or more). Thus, providing the distribution circuit 760 in the driver circuit 722 can reduce the number of external terminals for supplying video signals to the wirings SL.

The distribution circuit 760 includes the m circuits SSD and h wirings SMPL that supply sampling signals SMP. The circuit SSD has H (=3×h) outputs to which the wirings SL in different columns are connected. Three video signal lines for R, G, and B and the h wirings SMPL are connected to inputs of the circuit SSD. In addition, the protective circuit HOGO is provided for each circuit SSD; one protective circuit HOGO is connected to H wirings SL.

As shown in FIG. 20, a unit circuit of the circuit SSD is a switch circuit SW20 including three transistors (M21, M22, and M23), and h switch circuits SW20 are provided. A configuration of the circuit SW20 in the first stage is described below. The circuits SW in the other stages have similar configurations.

In the circuit SW20 in the first stage, the transistor M21 is a switch that controls a conduction state between a video signal line (VLR) supplying DATA_R and the wiring SL1. The transistor M22 is a switch that controls a conduction state between a video signal line (VLG) supplying DATA_G and the wiring SL2. The transistor M23 is a switch that controls a conduction state between a video signal line (VLB) supplying DATA_B and the wiring SL3. When three wirings SL needed to supply DATA_R, DATA_G, and DATA_B are regarded as a unit wiring group, the three wirings SL connected to SW20 in the first stage correspond to a wiring group in the first column and can be called SL[1R], SL[1G], and SL[1B], respectively.

Gates of the transistors M21 to M23 are connected to the wiring SMPL to which a signal SMP1 is input. The transistors M21 to M23 are turned on concurrently in accordance with the signal SMP1, so that DATA_R, DATA_G, and DATA_B are input to the wirings SL1, SL2, and SL3, respectively. For example, a sampling signal for turning on the circuit SW20 is supplied to each of the h wirings SMPL.

Video signals are supplied to the wirings SL in accordance with the switching operation of the transistors M21 to M23. Accordingly, the transistors M21 to M23 preferably have high operation speed and high on-state current. Therefore, as shown in FIG. 20, the transistors M21 to M23 are each preferably provided with a back gate connected to its gate. In addition, the transistors M21 to M23 are preferably minute transistors with channel lengths of less than 2.5 μm. Any of the transistors TA1 and TA2 shown in FIGS. 1A to 1C and FIGS. 2A and 2B and the transistor TC1 shown in FIGS. 5A to 5C and FIGS. 6A and 6B, for example, can be used as each of the transistors M21 to M23. Particularly in the driver circuit portion 720, the transistors M21 to M23 are required to operate at high speed. Thus, to provide high field-effect mobility, it is particularly preferable to use a transistor in which an oxide semiconductor layer has a multilayer structure including the oxide semiconductor film 32 as in TA1 and TC1.

Here, the configuration of the distribution circuit is described taking as an example the case where one color image based on three kinds of video signals (DATA_R, DATA_G, and DATA_B) is displayed; however, in one embodiment of the present invention, the number and colors of video signals are not limited to those described here. For example, it is possible to display a color image based on four kinds of video signals (DATA_R, DATA_G, DATA_B, and DATA_W) for red, green, blue, and white. In that case, four video signal lines corresponding to the four kinds of video signals (DATA_R, DATA_G, DATA_B, and DATA_W) are connected to inputs of the circuit SSD. In addition, four wirings SL to which these video signals are supplied are connected to the outputs of the circuit SSD.

[Configuration Example of Protective Circuit]

The protective circuit HOGO can be formed using a diode-connected transistor, a resistor, or the like. In the example of FIG. 21B, the circuit HOGO includes four transistors M31 to M34 connected in series. Each of the transistors M31 to M34 is a diode-connected transistor and has a back gate connected to its gate. Thus, the transistors M31 to M34 can have high on-state current. The transistor TA1 (FIG. 1A) or the transistor TA2 (FIG. 1B), for example, can be used as each of the transistors M31 to M34. Furthermore, protective circuits similar to the circuit HOGO can be connected to the wirings GL.

Configuration examples of pixel portions of an organic electroluminescent display device (OLED) and a liquid crystal display device (LCD) are described below.

<Configuration Example of Pixel of OLED>

Figure 22A:
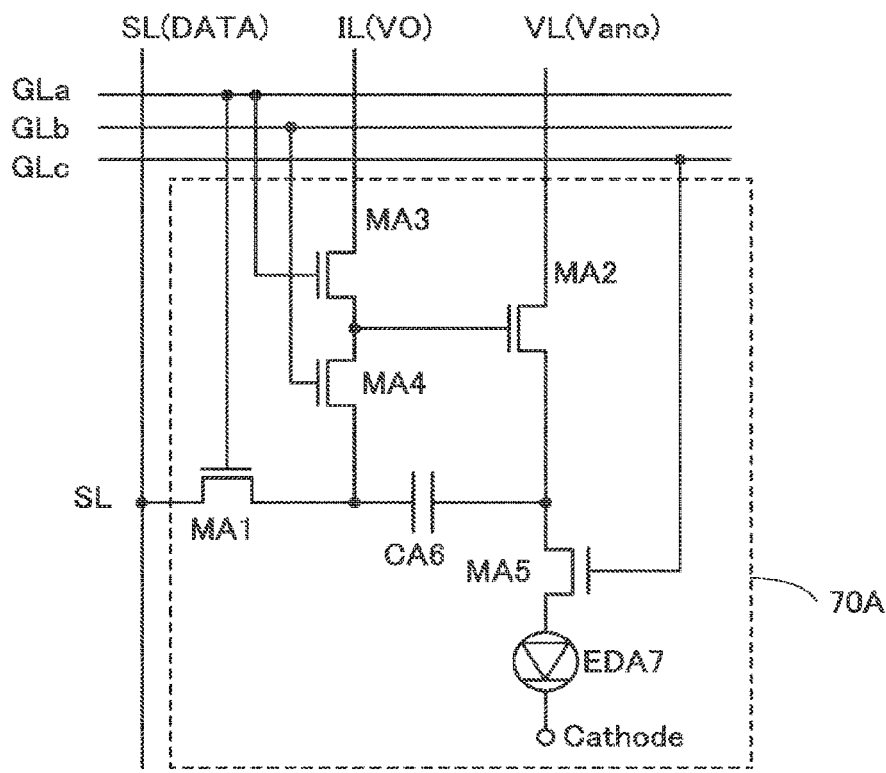
FIGS. 22A and 22B illustrate a configuration example of a pixel and an example of a driving method.

FIG. 22A is a circuit diagram illustrating a configuration example of a pixel of an OLED.

As shown in FIG. 22A, a pixel 70A includes five transistors MA1 to MA5, a capacitor CA6, and a light-emitting element EDA7. In FIG. 22A, the transistors MA1 to MA5 are OS transistors. For example, transistors without back gates like the transistor TB1 (FIG. 1C) and the transistor TD1 (FIG. 5C) are used.

The pixel 70A may be provided with a transistor having a back gate connected to its gate. For example, as in a pixel 70B shown in FIG. 23, the four transistors MA1, MA2, MA3, and MA5, excluding the transistor MA4, can each be a transistor with a back gate. In that case, the transistor TA2 (FIG. 1B) or the transistor TB2 (FIG. 5B), for example, can be used as each of these transistors. Alternatively, for example, a transistor having the structure of the transistor TD1 (FIG. 5C) further provided with a back gate can be used.

The transistor MA1 has a function of controlling conduction between the wiring SL and one electrode of the capacitor CA6. The other electrode of the capacitor CA6 is connected to one of a source and a drain of the transistor MA2. The transistor MA3 has a function of controlling conduction between a wiring IL and a gate of the transistor MA2. The transistor MA4 has a function of controlling conduction between the capacitor CA6 and the gate of the transistor MA2. The transistor MA5 has a function of controlling conduction between the one of the source and the drain of the transistor MA2 and an anode of the light-emitting element EDA7. The transistor MA2 has a function of controlling conduction between a wiring VL and the anode of the light-emitting element EDA7.

The light-emitting element EDA7 includes the anode, a cathode, and an EL layer provided between the anode and the cathode. The EL layer is formed using a single layer or plural layers, at least one of which is a light-emitting layer containing a light-emitting substance. From the EL layer, electroluminescence is obtained by current supplied when a potential difference between the cathode and the anode, using the potential of the cathode as a reference potential, is higher than or equal to a threshold voltage V the of the light-emitting element EDA7. As electroluminescence, there are luminescence (fluorescence) at the time of returning from a singlet-excited state to a ground state and luminescence (phosphorescence) at the time of returning from a triplet-excited state to a ground state.

The luminance of the light-emitting element EDA7 is controlled by drain current of the transistor MA2. In the pixel 70A, the gate potential of the transistor MA2 is controlled by a video signal DATA input from the wiring SL, whereby the luminance of the light-emitting element EDA7 is controlled.

Figure 22B:
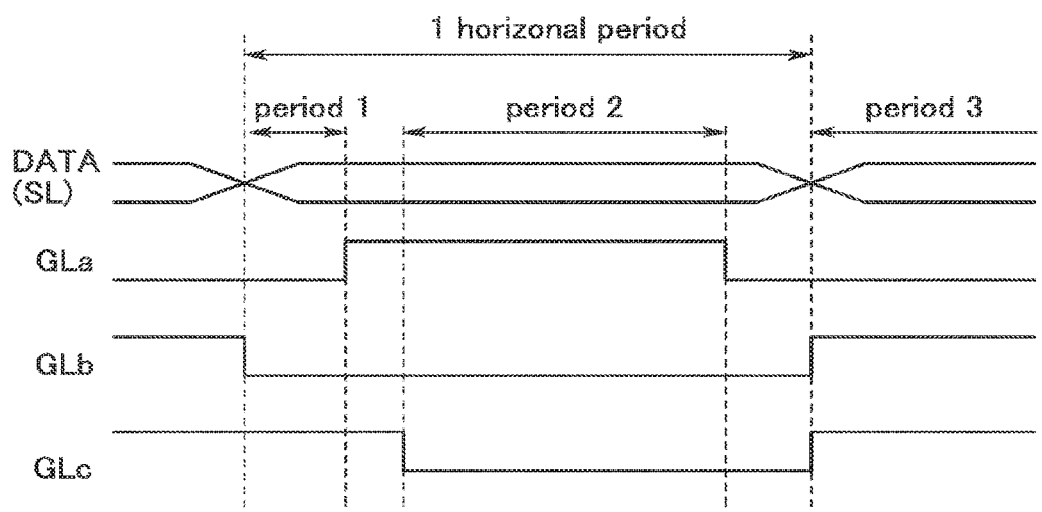

FIG. 22B is a timing chart illustrating an operation example of the pixel 70A. The on/off states of the transistors MA1, MA3, MA4, and MA5 are determined by the potentials of wirings GLa, GLa, GLb, and GLc, respectively. Signals are input to the wirings GLa, GLb, and GLc from the driver circuit 721. The video signal DATA is input to the wiring SL from the driver circuit 722. A potential Vano is supplied to the wiring VL. A potential VO is supplied to the wiring IL.

In a period 1, the transistor MA5 is on. In a period 2, the transistors MA1 and MA3 are on, and the transistors MA4 and MA5 are off. Note that in the transition from the period 1 to the period 2, it is preferable that the potential of the wiring GLc be switched from a high level to a low level after the potential of the wiring GLa is switched from a low level to a high level. In a period 3, the transistors MA4 and MA5 are on, and the transistors MA1 and MA3 are off. In the period 3, the light-emitting element EDA7 emits light with a luminance corresponding to the potential level of the video signal DATA having been input to the wiring SL in the period 2.

Figure 23:
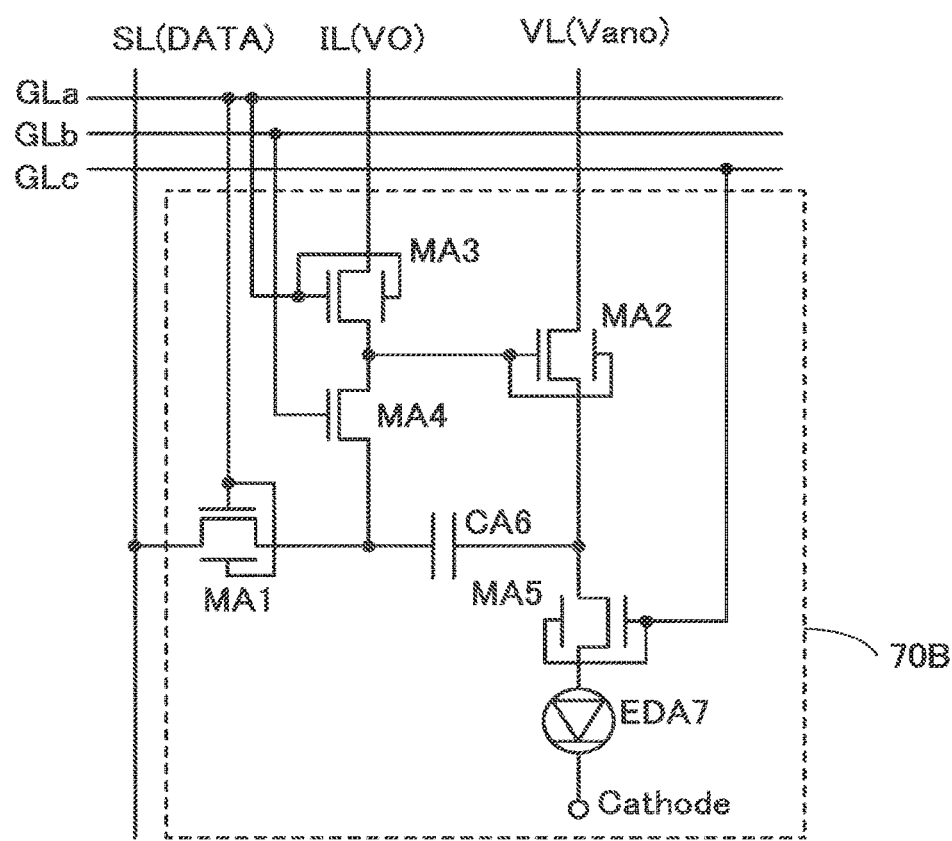
FIG. 23 illustrates a configuration example of a pixel.

The pixel of the OLED is not limited to the pixel 70A (FIG. 22A) or the pixel 70B (FIG. 23). Other configuration examples of the pixel are shown in FIGS. 24A and 24B.

Figure 24A:
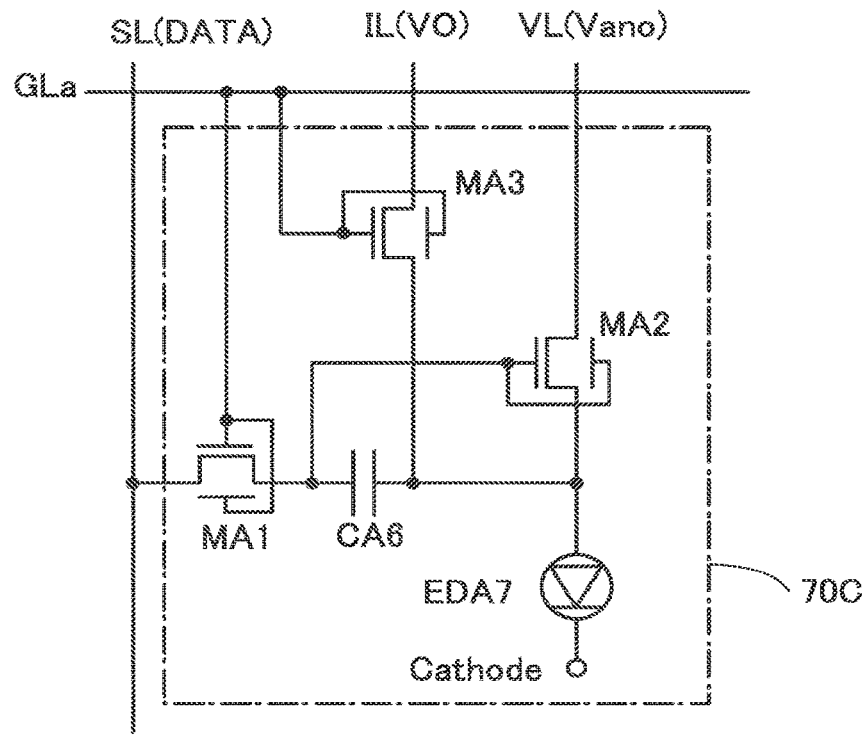
FIGS. 24A and 24B each illustrate a configuration example of a pixel.

A pixel 70C shown in FIG. 24A includes three transistors (MA1, MA2, and MA3), the capacitor CA6, and the light-emitting element EDA7. Here, an example in which the three transistors (MA1, MA2, and MA3) are each a transistor with a back gate connected to its gate is shown. In the pixel 70C, at least one of the three transistors (MA1, MA2, and MA3) can be a transistor without a back gate.

Figure 24B:
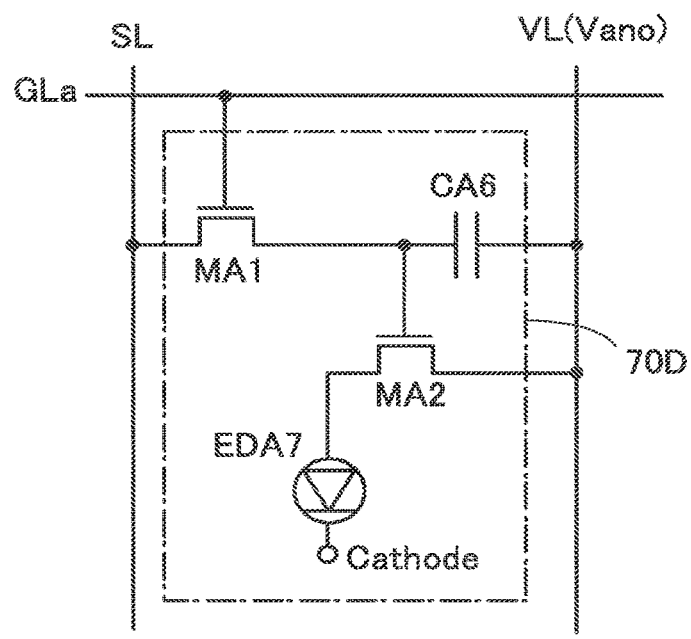

A pixel 70D shown in FIG. 24B includes two transistors (MA1 and MA2), the capacitor CA6, and the light-emitting element EDA7. Here, an example in which the transistors (MA1 and MA2) are each a transistor without a back gate is shown. In the pixel 70D, one or both of the two transistors (MA1 and MA2) can be provided with a back gate.

<Configuration Example of Pixel of LCD>

Figure 25:
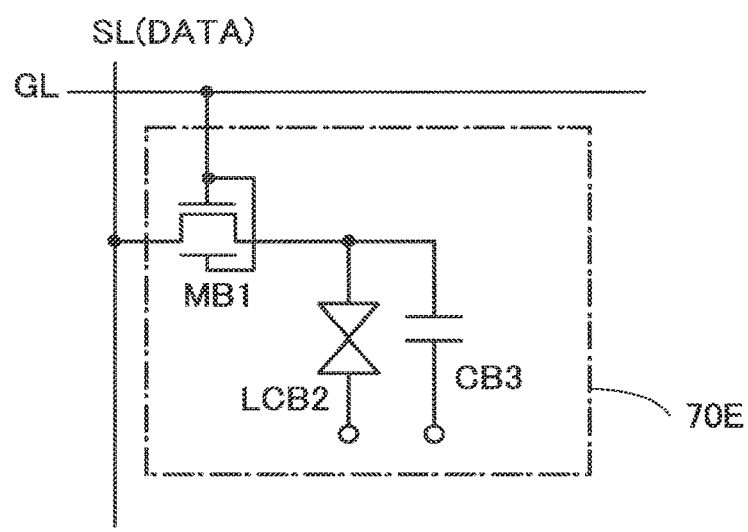
FIG. 25 illustrates a configuration example of a pixel.

FIG. 25 is a circuit diagram illustrating a configuration example of a pixel of an LCD.

A pixel 70E includes a transistor MB1, a liquid crystal element LCB2, and a capacitor CB3. A gate of the transistor MB1 is connected to the wiring GL. The transistor MB1 has a function of controlling conduction between the wiring SL and the liquid crystal element LCB2. The liquid crystal element LCB2 includes a pixel electrode, a common electrode, and a liquid crystal material to which an electric field formed between the pixel electrode and the common electrode is applied. The voltage (potential difference) between the pixel electrode and the common electrode is determined by the potential of the video signal DATA input from the wiring SL. The capacitor CB3 has a function of holding the voltage between the pixel electrode and the common electrode.

The transistor MB1 can be an OS transistor, for example. In the example of FIG. 25, the transistor MB1 is a transistor with a back gate connected to its gate. As the transistor MB1, for example, the transistor TB1 (FIG. 1C), the transistor TB2 (FIG. 5B), the transistor TD1 (FIG. 5C), or the like can be used.

Alternatively, the transistor MB1 can be a transistor without a back gate. In that case, as the transistor MB1, the transistor TB1 (FIG. 1C), the transistor TD1 (FIG. 5C), or the like can be used.

In the case where any of the transistors in the pixels 70A, 70B, 70C, 70D, and 70E is provided with a back gate, the back gate may be connected to a gate or may be supplied with a signal or potential different from that of the gate.

<Structure Example of OLED>

Figure 26:
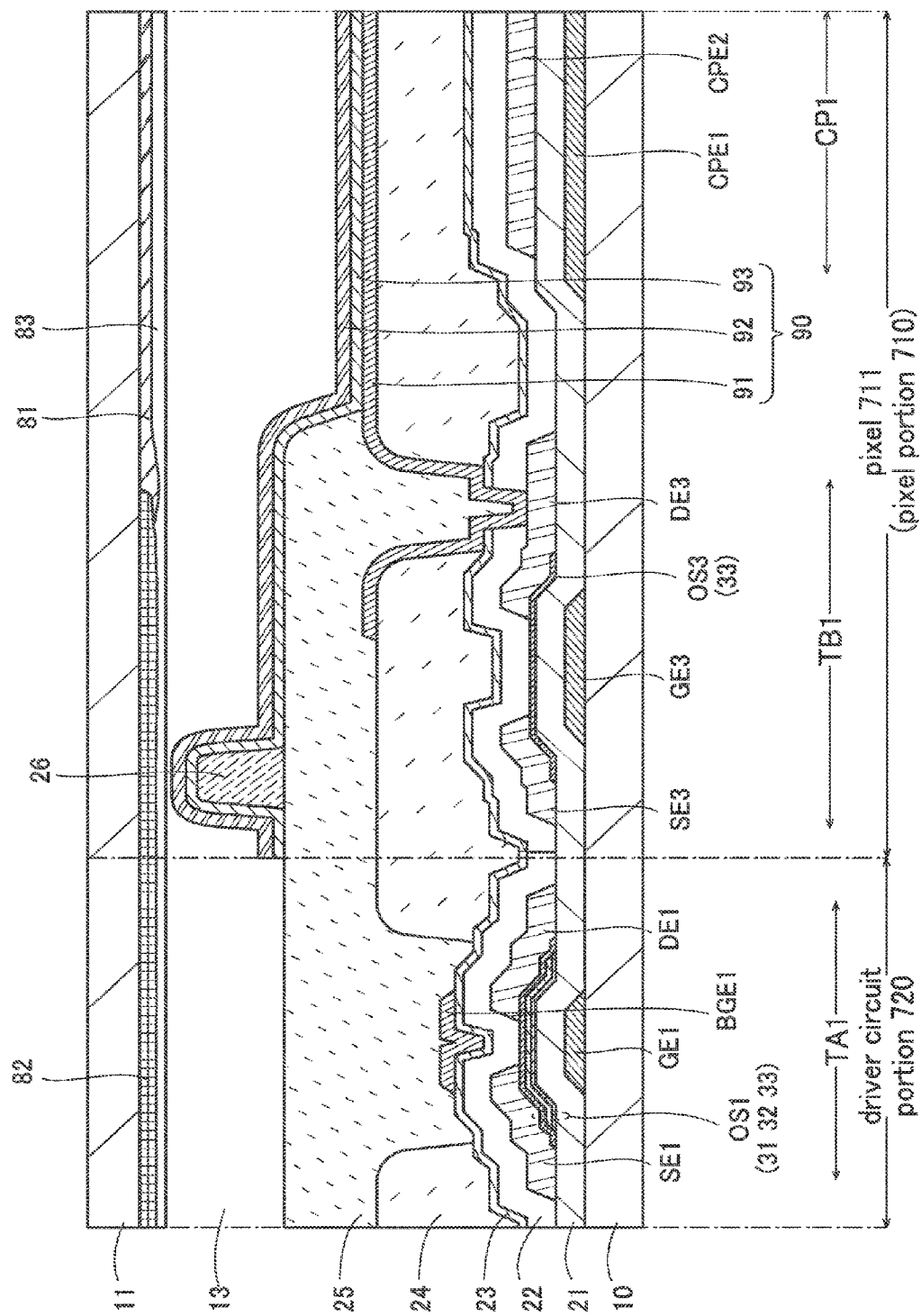
FIG. 26 illustrates a structure example of a display device.

FIG. 26 illustrates a structure example of an OLED as the display device 700. Note that FIG. 26 is a drawing for describing a device structure of a pixel portion and a driver circuit portion of the OLED, and is not a cross-sectional view of a specific portion of the OLED.

Here, the transistor TA1, the transistor TB1, and a capacitor CP1 are formed over the substrate 10. The transistor TA1 is included in the driver circuit portion 720. The transistor TB1 is included in the pixel 711. The capacitor CP1 is formed in the pixel 711. The capacitor CP1 includes a pair of electrodes CPE1 and CPE2 and the insulating layer 21 serving as a dielectric. The electrode CPE1 is formed using the conductive film 51 used for forming the gate electrode GE3 of the transistor TB1, and the like. The electrode CPE2 is formed using the conductive film 52 used for forming the source electrode SE3 of the transistor TB1, and the like. Depending on the configuration of the pixel 711, the electrode CPE1 and the gate electrode GE3 may be a continuous film, and the electrode CPE2 and the source electrode SE3 or the drain electrode DE3 may be a continuous film. Furthermore, depending on the circuit configuration, the gate electrode GE1 and the like may be formed as wirings.

An insulating layer 24 and an insulating layer 25 are formed to cover the transistor TA1, the transistor TB1, and the capacitor. A light-emitting element 90 is formed over the insulating layer 25. The light-emitting element 90 includes an electrode 91, an electrode 92, and an EL layer 93.

The electrode 91 is formed over the insulating layer 24 and is in contact with the electrode DE3 through an opening formed in the insulating layer 24. The insulating layer 25 is formed to cover the electrode 91 and the insulating layer 24, and an insulating layer 26 is formed over the insulating layer 25. The EL layer 93 and the electrode 92 are formed to cover the insulating layer 26. The electrode 91 is a conductive film separately provided for each pixel 711, and the electrode 92 is one conductive film shared by the pixels in the pixel portion 710.

As the electrode 91, for example, a metal film having a high light-reflecting property with respect to visible light is preferably used. As the metal film, for example, aluminum, silver, or an alloy of any of these can be used.

As the electrode 92, for example, a conductive film that transmits visible light is preferably used. For example, a material including one of indium (In), zinc (Zn), and tin (Sn) is preferably used for the conductive film. For the electrode 92, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. It is particularly preferable to use indium tin oxide to which silicon oxide is added for the electrode 92, in which case a crack or the like is unlikely to be caused in the electrode 92 when the display device is bent.

The EL layer 93 can be formed using a light-emitting material in which holes and electrons injected from the electrode 91 and the electrode 92 can be recombined to cause light emission. In addition to the light-emitting material, a functional layer such as a hole-injection layer, a hole-transport layer, an electron-transport layer, or an electron-injection layer may be formed as needed.

The insulating layers 24 and 25 preferably function as planarization films. The insulating layer 26 can function as a spacer that maintains a gap between the substrate 10 and a substrate 11. Each of the insulating layers 24 to 26 is preferably formed using a photosensitive resin material such as photopolymer, photosensitive acrylic, or photosensitive polyimide. Each of the insulating layers 24 to 26 may be formed using an inorganic insulating material that can be formed by a CVD method, a sputtering method, or the like, such as silicon oxide.

The substrate 11 is fixed with a sealant (not shown) to face the substrate 10. Peripheral portions of the substrate 10 and the substrate 11 are provided with the sealant. As the substrate 11, a substrate similar to the substrate 10 can be used. The substrate 11 is provided with a color filter layer 81, a light-blocking layer 82, and an overcoat layer 83. The color filter layer 81 is an optical filter layer for converting the light (e.g., white light) emitted by the EL layer 93 into light of a different color. The substrate 10 may be provided with the color filter layer 81.

In the case where the EL layer 93 is provided for each display color (e.g., red, green, and blue) of the pixel 711, that is, so-called side-by-side patterning is employed, the color filter layer 81 is not necessarily provided.

The light-blocking layer 82 has a function of blocking light that passes through the substrate 11 and enters the OLED. The light-blocking layer 82 can have either a single-layer structure or a stacked-layer structure including two or more layers. Examples of a film included in the light-blocking layer 82 include a film containing a macromolecular material in which chromium, titanium, nickel, or carbon black is dispersed, or the like. The light-blocking layer 82 is formed to cover the driver circuit portion 720 and a region of the pixel 711 that does not contribute to display.

The overcoat layer 83 has functions of planarizing the surface of the substrate 11 and preventing diffusion of impurities (such as water and/or oxygen). The overcoat layer 83 can be formed using, for example, a polyimide resin, an epoxy resin, an acrylic resin, or the like.

Further, the substrate 11 may be provided with a drying agent to prevent the light-emitting element 90 from deteriorating. For a similar reason, a space 13 between the substrate 10 and the substrate 11 is preferably filled with an inert gas such as a nitrogen gas or an argon gas or a solid substance such as a resin material. Filling the space 13 with a substance with a high refractive index (e.g., a resin) can increase the efficiency of light extraction from the light-emitting element 90.

<Structure Example of LCD>

Figure 27:
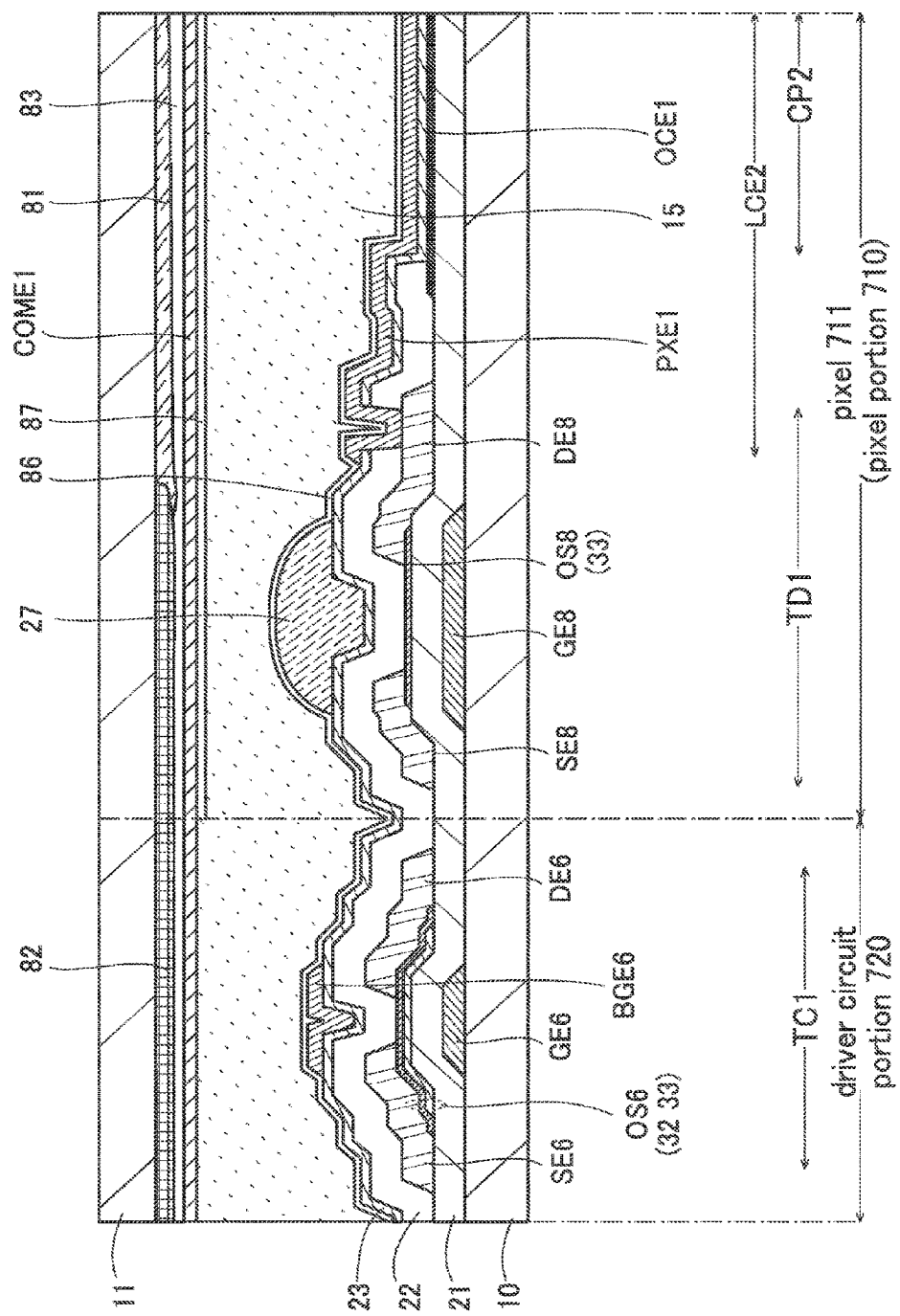
FIG. 27 illustrates a structure example of a display device.

FIG. 27 illustrates a structure example of an LCD as the display device 700. Like FIG. 26, FIG. 27 is a drawing for describing a stacked-layer structure of a device structure of a pixel portion and a driver circuit portion of the LCD, and is not a cross-sectional view of a specific portion of the LCD.

Here, the transistor TC1, the transistor TD1, and a capacitor CP2 are formed over the substrate 10. The transistor TC1 is included in the driver circuit portion 720. The transistor TD1 is included in the pixel 711. The capacitor CP2 is formed in the pixel 711. The capacitor CP2 is a device including a pair of electrodes PXE1 and OCE1 and the insulating layer 21 serving as a dielectric.

The electrode PXE1 is connected to the transistor TD1. Here, the back gate electrode BGE6 of the transistor TC1 is formed using the same conductive film and in the same step as the electrode PXE1. The electrode OCE1 is a conductive film formed using the oxide semiconductor film 33. In the case where a nitride insulating film is formed as the insulating layer 23, heating in a state where the oxide semiconductor film 33 is in contact with the insulating layer 23 reduces the resistance of the oxide semiconductor film 33, thereby forming the electrode OCE1. In the case where the electrode OCE1 is formed, before the formation of the insulating layer 23, an opening is formed in a region of the insulating layer 22 where the capacitor CP2 is to be formed.

An insulating layer 27 is formed over the insulating layer 23. Like the insulating layers 24 to 26, the insulating layer 27 is preferably formed using an organic resin film. The insulating layer 27 is formed to cover the transistor TD1 formed in the pixel 711. For the insulating layer 27, for example, polyimide, acrylic, polyamide, epoxy, or the like can be used. The thickness of the insulating layer 27 is preferably greater than or equal to 500 nm and less than or equal to 10 µm.

When a thick organic resin film (greater than or equal to 500 nm) is formed as the insulating layer 27, an electric field generated by application of negative voltage to the gate electrode GE8 does not affect a surface of the insulating layer 27; thus, positive charges are less likely to be accumulated on the surface of the insulating layer 27. In addition, even when positively charged particles in the air are adsorbed on the surface of the insulating layer 27, the electric field of the positively charged particles adsorbed on the surface of the insulating layer 27 are less likely to affect the interface between the oxide semiconductor layer OS8 and the insulating layer 21, because the insulating layer 27 is thick (greater than or equal to 500 nm). With such a structure, practically, no positive bias is applied to the interface between the layer OS8 and the insulating layer 21; thus, variation in the threshold voltage of the transistor TD1 can be reduced. Therefore, a highly reliable LCD can be provided.

The substrate 11 is provided with a counter electrode COME1 that covers the color filter layer 81, the light-blocking layer 82, and the overcoat layer 83 and an alignment layer 87 that covers the electrode COME1. In addition, an alignment layer 86 is formed over the substrate 10. The alignment layers 86 and 87 are provided as appropriate.

The substrate 11 is fixed with a sealant (not shown) to face the substrate 10. Peripheral portions of the substrate 10 and the substrate 11 are provided with the sealant. Therefore, part or the whole of the driver circuit portion 720 is covered with the sealant in some cases. A liquid crystal material 15 is sealed between the substrate 10 and the substrate 11. The liquid crystal material 15, the electrode PXE1, and the electrode COME1 form a liquid crystal element LCE2. The substrate 10 or the substrate 11 is provided with an insulating layer functioning as a spacer for maintaining a gap between the substrates.

Although the OLED and the LCD including the light-emitting element and the liquid crystal element, respectively, as display elements are shown here, one embodiment of the present invention is not limited thereto. For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included.

Examples of display devices including EL elements include an EL display device. Examples of display devices including electron emitters are a field emission display (FED) and an SED-type flat panel display (SED: surface-conduction electron-emitter display). Examples of display devices including liquid crystal elements include a liquid crystal display device (e.g., a transmissive liquid crystal display device, a transflective liquid crystal display device, a reflective liquid crystal display device, a direct-view liquid crystal display device, or a projection liquid crystal display device). An example of a display device including electronic ink or electrophoretic elements is electronic paper. In the case of a transflective liquid crystal display device or a reflective liquid crystal display device, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Embodiment 3

As mentioned in Embodiment 1, after part or the whole of a semiconductor device is completed, the semiconductor device can be separated from a substrate used for manufacture of the semiconductor device and transferred to another substrate. When such a manufacturing method is used, a transistor can be transferred to a substrate having low heat resistance or a flexible substrate.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties or a transistor with low power consumption can be formed, a device with high durability and high heat resistance can be provided, or a reduction in weight or thickness can be achieved.

Such a manufacturing method of a semiconductor device is described below with reference to drawings. Here, a method for manufacturing the display device 700 as a semiconductor device is described as an example.

<Manufacturing Method Example 1>

A manufacturing method of the display device 700 of one embodiment of the present invention will be described with reference to FIGS. 28A to 28D and FIGS. 29A and 29B.

Figure 28A:
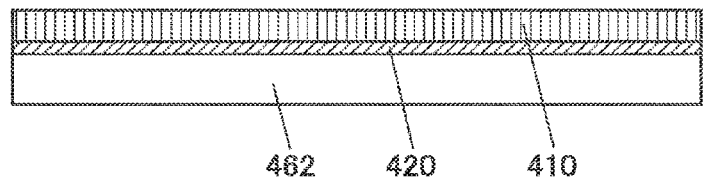
FIGS. 28A to 28D illustrate an example of manufacturing a semiconductor device.

An insulating film 420 is formed over a substrate 462, and an element layer 410 is formed over the insulating film 420 (FIG. 28A). A semiconductor element such as a transistor is formed in the element layer 410. A display element or part of the display element such as a pixel electrode may also be formed in the element layer 410.

It is necessary that the substrate 462 have at least heat resistance high enough to withstand heat treatment performed later. For example, a glass substrate, a ceramic substrate, a quartz substrate, or a sapphire substrate may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

For the insulating film 420, an organic resin film of an epoxy resin, an aramid resin, an acrylic resin, a polyimide resin, a polyamide resin, a polyamide-imide resin, or the like can be used. Among them, a polyimide resin is preferably used because it has high heat resistance. For example, in the case where a polyimide resin is used for the insulating film 420, the thickness of the polyimide resin is greater than or equal to 3 nm and less than or equal to 20 µm, preferably greater than or equal to 500 nm and less than or equal to 2 µm. In the case where a polyimide resin is used for the insulating film 420, the insulating film 420 can be formed by a spin coating method, a dip coating method, a doctor blade method, or the like. In the case where a polyimide resin is used for the insulating film 420, for example, the insulating film 420 with a desired thickness can be obtained by removing an excess part of the polyimide resin film by a doctor blade method.

Note that formation temperatures of the element layer 410 are preferably higher than or equal to room temperature and lower than or equal to 300° C. For example, the deposition temperature of an insulating film or a conductive film which is formed in the element layer 410 using an inorganic material is higher than or equal to 150° C. and lower than or equal to 300° C., preferably higher than or equal to 200° C. and lower than or equal to 270° C. Furthermore, an insulating film or the like formed in the element layer 410 using an organic resin material is preferably formed at a temperature higher than or equal to room temperature and lower than or equal to 100° C.

A CAAC-OS film described later is preferably used as an oxide semiconductor film of the transistor included in the element layer 410. In the case where the CAAC-OS film is used as the oxide semiconductor film of the transistor, for example, when the display device 700 is bent, a crack or the like is less likely to be caused in the channel formation region, resulting in high resistance against bending.

Indium tin oxide to which silicon oxide is added is preferably used for a conductive film included in the element layer 410 because a crack is less likely to be caused in the conductive film when the display device 700 is bent.

Figure 28B:
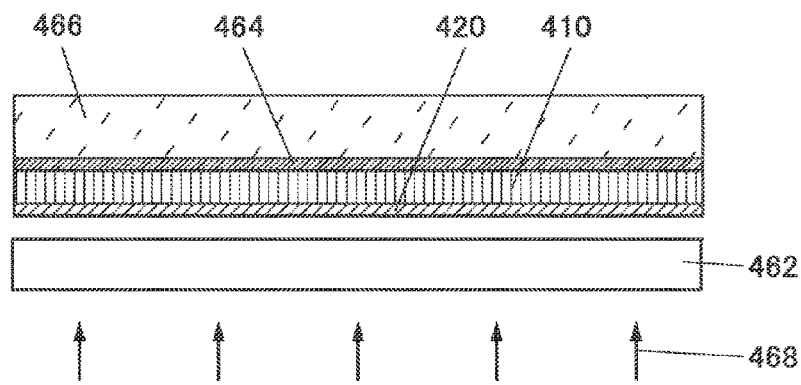

Next, the element layer 410 and a temporary supporting substrate 466 are attached with an adhesive 464 for separation, and then the insulating film 420 and the element layer 410 are separated from the substrate 462. Thus, the temporary supporting substrate 466 is provided with the insulating film 420 and the element layer 410 (FIG. 28B).

As the temporary supporting substrate 466, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used.

An adhesive with which the temporary supporting substrate 466 and the element layer 410 can be chemically or physically separated when necessary, such as an adhesive that is soluble in water or a solvent or an adhesive which is capable of being plasticized upon irradiation of UV light or the like, is used as the adhesive 464 for separation.

Any of various methods can be used as appropriate as the process for transferring the components to the temporary supporting substrate 466. For example, the substrate 462 and the insulating film 420 can be separated from each other in such a manner that the insulating film 420 is irradiated with laser light 468 from a side of the substrate 462 where the insulating film 420 is not formed, i.e., from the bottom side in FIG. 28B to make the insulating film 420 weak. Furthermore, a region where adhesion between the substrate 462 and the insulating film 420 is low and a region where adhesion between the substrate 462 and the insulating film 420 is high may be formed by adjustment of the irradiation energy density of the laser light 468, and then the substrate 462 and the insulating film 420 may be separated.

Although the method in which separation is caused at the interface between the substrate 462 and the insulating film 420 is described, one embodiment of the present invention is not limited thereto. For example, separation may be caused at the interface between the insulating film 420 and the element layer 410.

The insulating film 420 may be separated from the substrate 462 by filling the interface between the substrate 462 and the insulating film 420 with a liquid. Alternatively, the element layer 410 may be separated from the insulating film 420 by filling the interface between the insulating film 420 and the element layer 410 with a liquid. As the liquid, water, a polar solvent, or the like can be used, for example. The interface along which the insulating film 420 is separated, specifically, the interface between the substrate 462 and the insulating film 420 or the interface between the insulating film 420 and the element layer 410 is filled with a liquid, whereby an influence of static electricity and the like generated owing to the separation on the element layer 410 can be reduced.

Figure 28C:
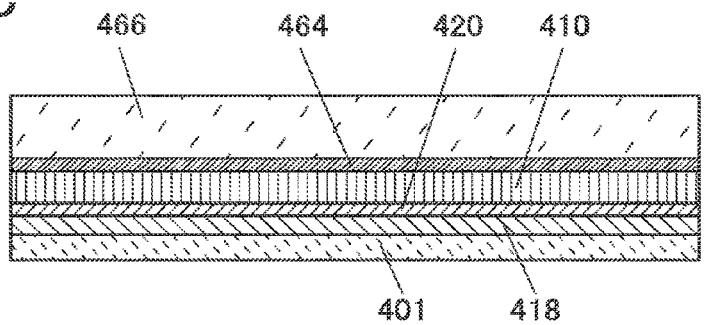

Next, a substrate 401 is attached to the insulating film 420 using an adhesive layer 418 (FIG. 28C).

Figure 28D:
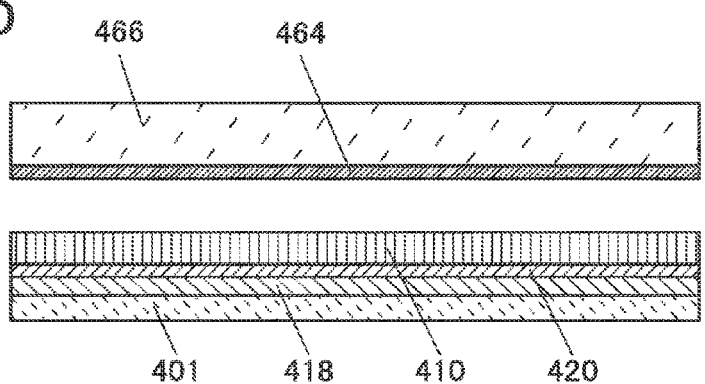

Then, the adhesive 464 for separation and the temporary supporting substrate 466 are removed from the element layer 410 by dissolving or plasticizing the adhesive 464 for separation (FIG. 28D).

Note that the adhesive 464 for separation is preferably removed by water, a solvent, or the like to expose the surface of the element layer 410.

Through the above process, the element layer 410 can be formed over the substrate 401.

Figure 29A:
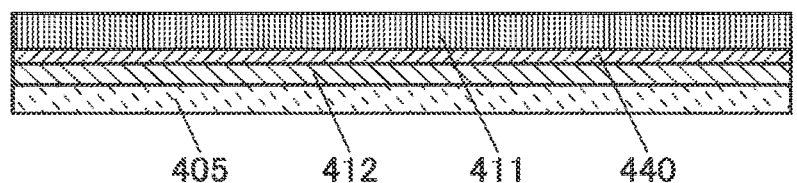
FIGS. 29A and 29B illustrate an example of manufacturing a semiconductor device.

Next, an adhesive layer 412, an insulating film 440 over the adhesive layer 412, and an element layer 411 are formed over a substrate 405 by a process similar to that illustrated in FIGS. 28A to 28D (FIG. 29A). The insulating film 440 included in the element layer 411 can be formed using a material similar to that of the insulating film 420, here, using an organic resin film.

Figure 29B:
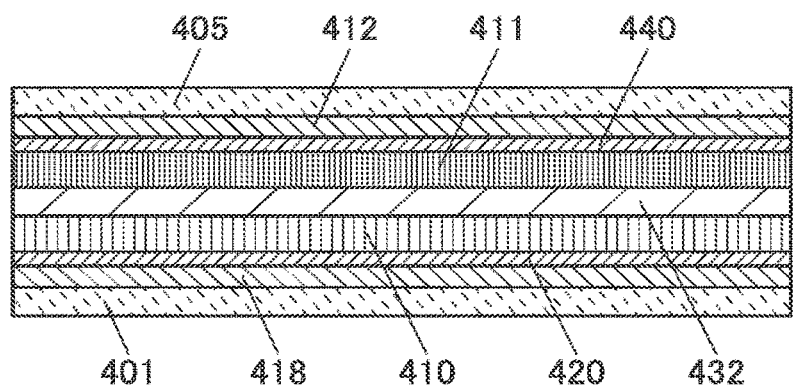

Then, a space between the element layer 410 and the element layer 411 is filled with a sealing layer 432, so that the element layer 410 and the element layer 411 are attached to each other (FIG. 29B).

With the sealing layer 432, for example, solid sealing is possible. Note that the sealing layer 432 preferably has flexibility. For example, for the sealing layer 432, a glass material such as a glass frit, or a resin material such as a resin that is curable at room temperature (e.g., a two-component-mixture-type resin), a light curable resin, or a thermosetting resin can be used.

In the above-described manner, the display device 700 can be manufactured.

<Manufacturing Method Example 2>

Another method for manufacturing the display device 700 which is one embodiment of the present invention will be described with reference to FIGS. 30A to 30D. Note that an inorganic insulating film is used as each of the insulating films 420 and 440 in FIGS. 30A to 30D.

Figure 30A:
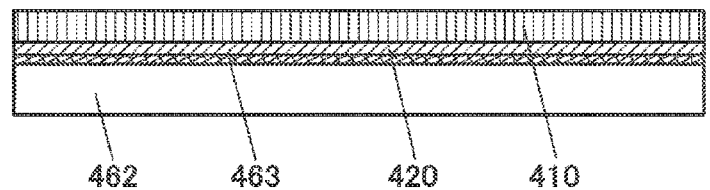
FIGS. 30A to 30D) illustrate an example of manufacturing a semiconductor device.

First, a separation layer 463 is formed over the substrate 462. Then, the insulating film 420 is formed over the separation layer 463, and the element layer 410 is formed over the insulating film 420 (FIG. 30A).

The separation layer 463 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements, for example. In the case of a layer containing silicon, a crystal structure of the layer containing silicon may be amorphous, microcrystal, polycrystal, or single crystal.

The separation layer 463 can be formed by a sputtering method, a PECVD method, a coating method, a printing method, or the like. Note that a coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer 463 is formed to have a stacked-layer structure including a layer containing tungsten and a layer containing an oxide of tungsten, the layer containing an oxide of tungsten may be formed as follows: the layer containing tungsten is formed first and an insulating layer formed of an oxide is formed thereover, so that the layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 463 is changed by the plasma treatment or heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film. The inorganic insulating film can be formed by a sputtering method or a PECVD method, for example.

Figure 30B:
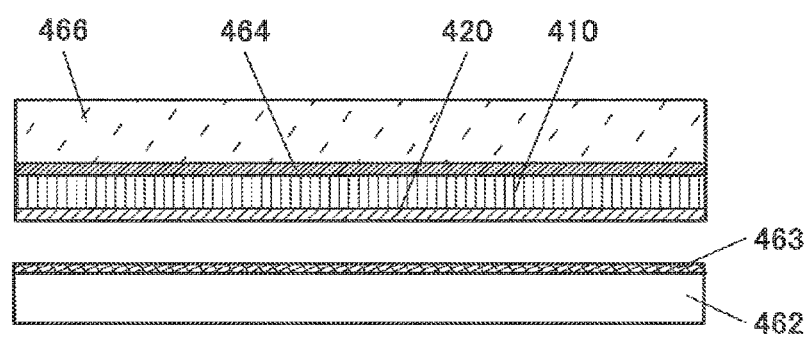

Next, the element layer 410 and the temporary supporting substrate 466 are attached with the adhesive 464 for separation, and then the insulating film 420 and the element layer 410 are separated from the separation layer 463. Thus, the temporary supporting substrate 466 is provided with the insulating film 420 and the element layer 410 (FIG. 30B).

Any of various methods can be used as appropriate as the process for transferring the components to the temporary supporting substrate 466. For example, in the case where a layer including a metal oxide film is formed at the interface between the separation layer 463 and the insulating film 420, the metal oxide film is weakened by crystallization, so that the insulating film 420 can be separated from the separation layer 463. Alternatively, in the case where the separation layer 463 is formed using a tungsten film, separation is performed in such a manner that the tungsten film is etched using a mixed solution of ammonia water and a hydrogen peroxide solution.

The insulating film 420 may be separated from the separation layer 463 by filling the interface between the separation layer 463 and the insulating film 420 with a liquid. As the liquid, water, a polar solvent, or the like can be used, for example. The interface along which the insulating film 420 is separated, specifically, the interface between the separation layer 463 and the insulating film 420 is filled with a liquid, whereby an influence of static electricity and the like generated owing to the separation on the element layer 410 can be reduced.

Figure 30C:
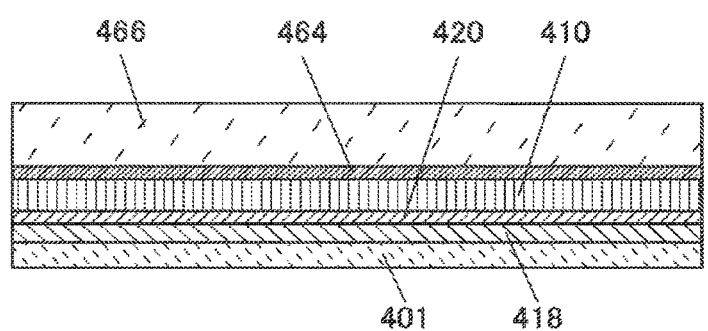
Figure 30D:
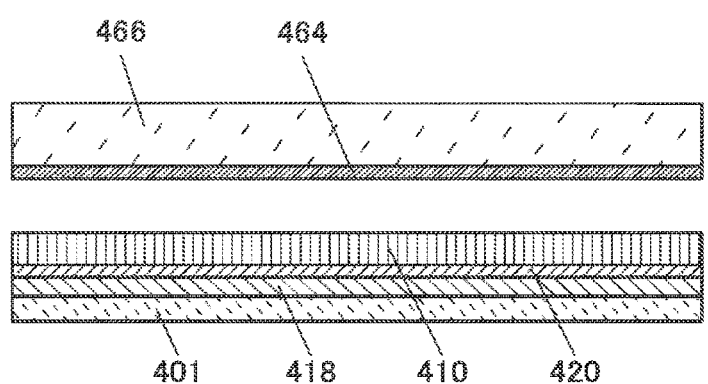

Next, the substrate 401 is attached to the insulating film 420 using the adhesive layer 418 (FIG. 30C). Then, the adhesive 464 for separation and the temporary supporting substrate 466 are removed from the element layer 410 by dissolving or plasticizing the adhesive 464 for separation (FIG. 30D). Note that the adhesive 464 for separation is preferably removed by water, a solvent, or the like to expose the surface of the element layer 410. Through the above process, the element layer 410 can be formed over the substrate 401.

Next, the substrate 405, the adhesive layer 412 over the substrate 405, the insulating film 440 over the adhesive layer 412, and the element layer 411 are formed by a process similar to that illustrated in FIGS. 30A to 30D. Then, a space between the element layer 410 and the element layer 411 is filled with the sealing layer 432, so that the element layer 410 and the element layer 411 are attached to each other.

Finally, an FPC is electrically connected to a connection terminal formed in the element layer 410 via an anisotropic conductive film. An IC chip may be mounted on the FPC.

In the above-described manner, the display device 700 can be manufactured.

Embodiment 4

In this embodiment, a display device, an electronic device including the display device, and the like are described as examples of a semiconductor device.

<External View of Display Device>

Figure 31A:
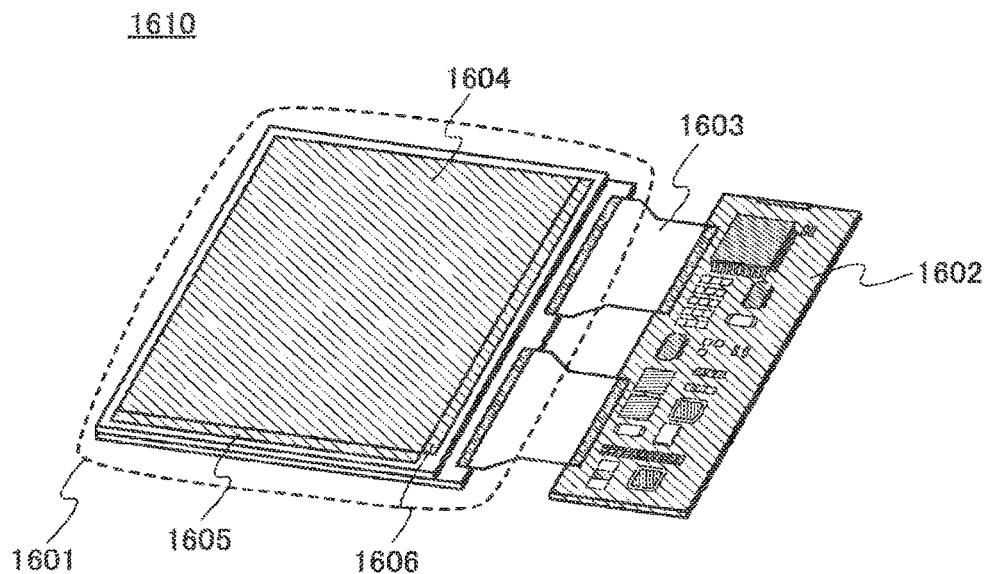
FIGS. 31A and 31B each illustrate a structure example of a display device.

FIG. 31A is a perspective view illustrating an example of an external view of a display device. As illustrated in FIG.

31A, a display device 1610 includes a panel 1601; a circuit board 1602 including a controller, a power supply circuit, an image processing circuit, an image memory, a CPU, and the like; and a connection portion 1603. The panel 1601 includes a pixel portion 1604 including a plurality of pixels, a driver circuit 1605 that selects pixels row by row, and a driver circuit 1606 that controls input of an image signal Sig to the pixels in a selected row.

A variety of signals and power supply potentials are input from the circuit board 1602 to the panel 1601 through the connection portion 1603. As the connecting portion 1603, a flexible printed circuit (FPC) or the like can be used. A chip-mounted FPC is referred to as COF tape, which achieves higher-density packaging in a smaller area. In the case where a COF tape is used as the connection portion 1603, part of circuits in the circuit board 1602 or part of the driver circuit 1605 or the driver circuit 1606 included in the panel 1601 may be formed on a chip separately prepared, and the chip may be connected to the COF tape by a chip-on-film (COF) method.

Figure 31B:
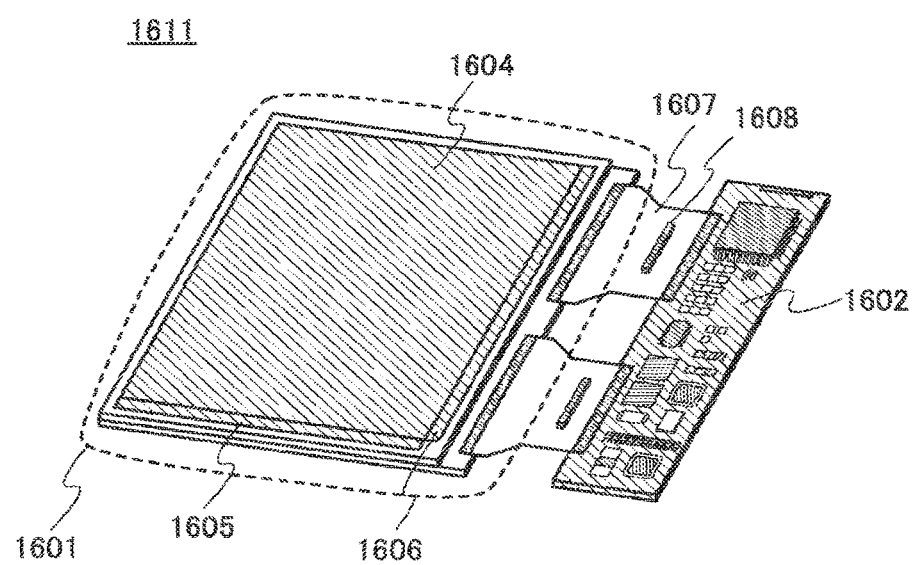

FIG. 31B is a perspective view of an example of the appearance of a display device using a COF tape 1607. As shown in FIG. 31B, in a display device 1611, a chip 1608 is a semiconductor bare chip including a terminal (e.g., bump) on its surface, i.e., IC or LSI. CR components can also be mounted on the COF tape 1607, so that the area of the circuit board 1602 can be reduced. There is a plurality of wiring patterns of a flexible substrate depending on a terminal of a mounted chip. The chip 1608 is mounted using a bonder apparatus or the like; the position of the chip is determined over the flexible substrate having a wiring pattern and thermocompression bonding is performed.

One embodiment of the present invention is not limited to the example of FIG. 31B in which one COF tape 1607 is mounted on one chip 1608. Chips may be mounted in a plurality of lines on one side or both sides of one COF tape 1607; however, for cost reduction, the number of lines is preferably one in order to reduce the number of mounted chips. It is more preferable that the number of mounted chips is one.

<Structure Example of Circuit Board>

Figure 32:
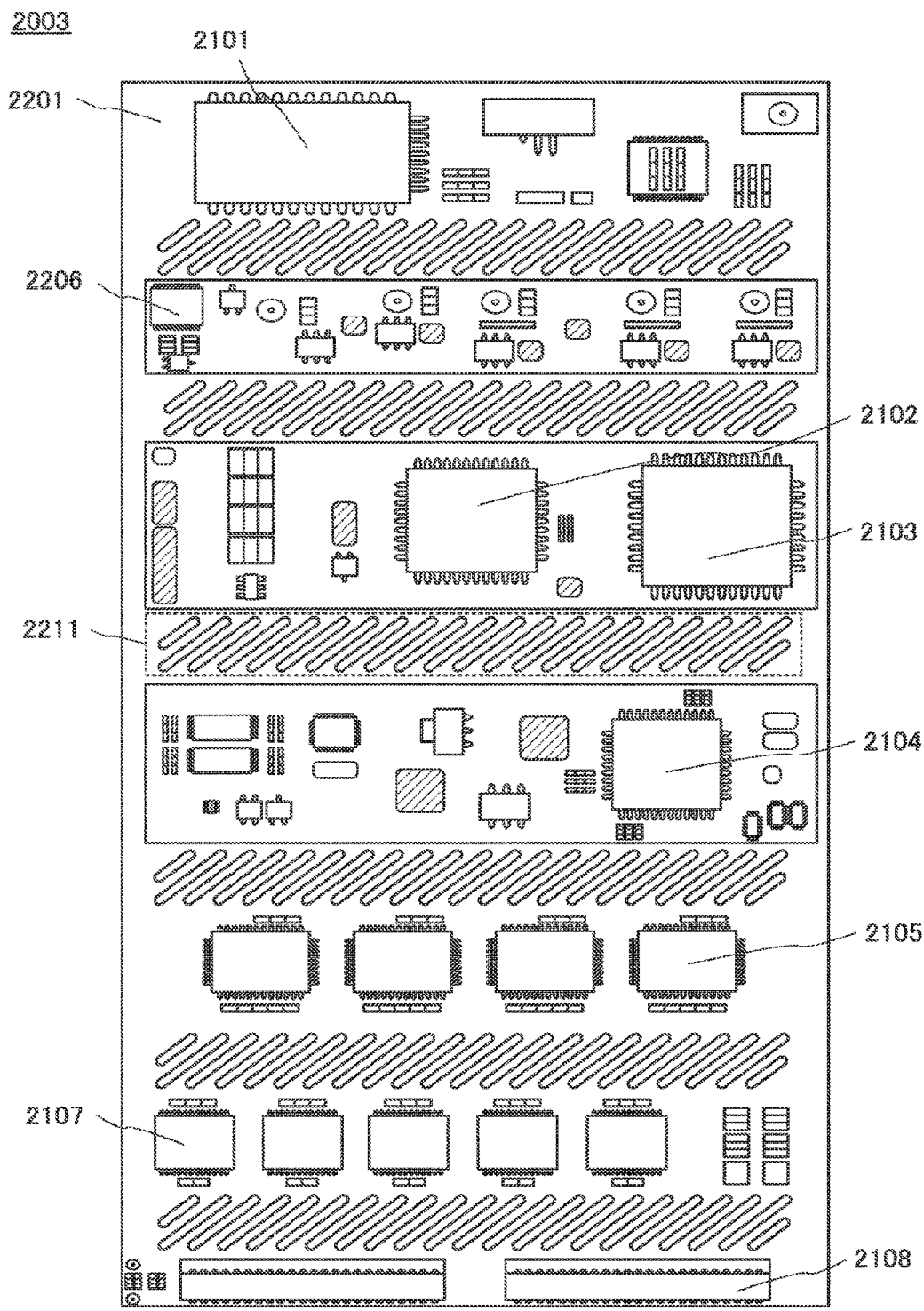
FIG. 32 illustrates a structure example of a circuit board of a display device.

FIG. 32 is an external view of a circuit board 2003. The circuit board 2003 includes, on an FPC 2201 having a slit 2211, a communication device 2101 conforming to Bluetooth (registered trademark, the same as IEEE802.15.1) standards, a microcomputer 2012, a storage device 2103, an FPGA 2104, a DA converter 2105, a charge control IC 2106, and a level shifter 2107. The circuit board 2003 is electrically connected to a display device of one embodiment of the present invention through an input-output connector 2108. The slit 2211 provided for the FPC 2201 enables the flexibility of the circuit board 2003 using the FPC 2201 to be increased.

When a flexible substrate is used in the display device, the display device can be bent along the circuit board 2003. The display device including a flexible substrate and the circuit board 2003 can be bent repeatedly along the shape of part where the display device is worn. This is why they are suitable for electronic devices that can be worn on arms, legs, and the like.

<Structure Example of Data Processing Device>

Figure 33A:
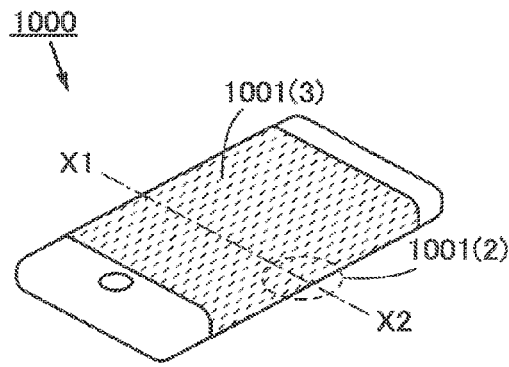
FIGS. 33A to 33E illustrate a structure example of a data processing device.
Figure 33B:
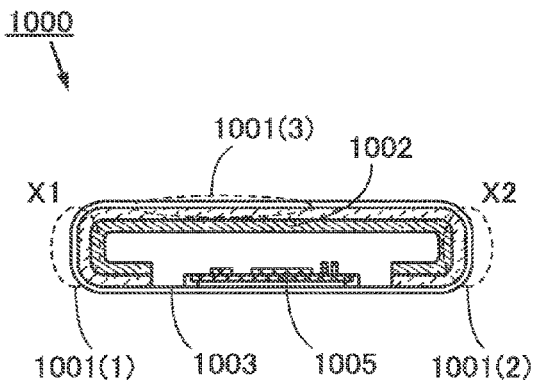
Figure 33C:
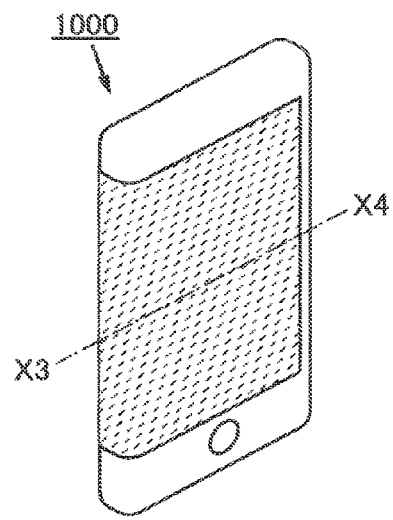
Figure 33D:
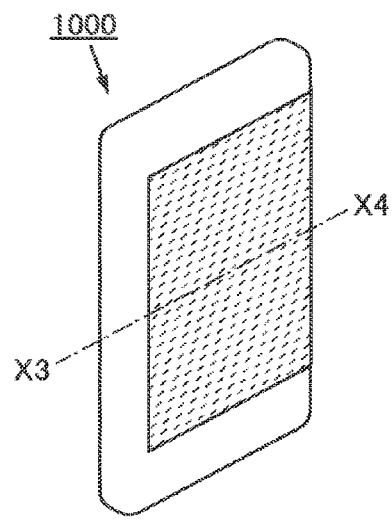
Figure 33E:
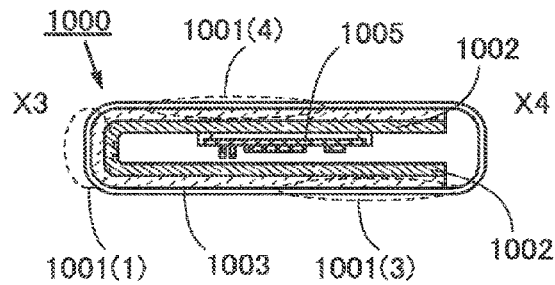

FIG. 33A is a schematic view illustrating the appearance of a data processing device 1000, and FIG. 33I is a schematic view illustrating a cross-sectional structure along line X1-X2 in FIG. 33A. FIGS. 33C and 33D are schematic views illustrating the appearance of the data processing device 1000, and FIG. 33E is a schematic view illustrating a cross-sectional structure along line X3-X4 in FIGS. 33C and 33D. FIGS. 33C and 33D are schematic views illustrating a front surface and a back surface of the data processing device 1000, respectively.

As shown in FIGS. 33C and 33D, a position input portion 1001 or a display portion 1002 can be provided not only on the front of the data processing device 1000, but also on the side and back of the data processing device 1000. The position input portion 1001 or the display portion 1002 may be provided on the top surface or the bottom surface of the data processing device 1000.

In addition to the position-input portion 1001, a hardware button, an external connection terminal, or the like may be provided on the surface of a housing 1003.

With such a structure, display can be performed not only on a surface parallel to the top surface of the housing 1003, as in conventional data processing devices, but also on a side surface of the housing 1003. In particular, a display region is preferably provided along two or more side surfaces of the housing 1003 because the variety of display is further increased.

The display region provided along the front surface of the data processing device and the display regions provided along the side surfaces of the data processing device may be independently used as display regions to display different images and the like, or two or more of the display regions may display one image or the like. For example, a continuous image may be displayed on the display region provided along the front surface of the data processing device and the display region provided along the side surface thereof and the like.

An arithmetic device 1005 is inside the housing 1003. In FIG. 33B, the arithmetic device 1005 is apart from the display portion 1002. In FIG. 33E, the arithmetic device 1005 and the display portion 1002 overlap with each other.

The position-input portion 1001 is flexible to be folded such that, for example, a first region 1001(1), a second region 1001(2) facing the first region 1001(1), and a third region 1001(3) between the first region 1001(1) and the second region 1001(2) are formed (see FIG. 33B). As another example, the position-input portion 1001 is flexible to be folded such that the first region 1001(1), the third region 1001(3), and a fourth region 1001(4) facing the third region 1001(3) are formed (see FIG. 33E).

For another example, the position-input portion 1001 is flexible to be folded such that the third region 1001(3), a fifth region 1001(5), and the fourth region 1001(4) facing the third region 1001(3) are formed.

Note that the second region 1001(2) may face the first region 1001(1) with or without an inclination. Note that the third region 1001(3) may face the fourth region 1001(4) with or without an inclination.

The display portion 1002 overlaps with at least part of the first region 1001(1), the second region 1001(2), the third region 1001(3), or the fourth region 1001(4).

The data processing device 1000 described here includes the flexible position-input portion 1001 sensing proximity or touch of an object. The position-input portion 1001 can be bent to provide the first region 1001(1), the second region 1001(2) facing the first region 1001(1), and the third region 1001(3) which is positioned between the first region 1001(1) and the second region 1001(2) and overlaps with the display portion 1002. With this structure, whether or not a palm or a finger is proximate to or touches the first region 1001(1), the second region 1001(2), or the like can be determined. As a result, a human interface with high operability can be provided. A novel data processing device with high operability can be provided.

For the substrate used in the display portion 1002, a resin that is thin enough to have flexibility can be used. Examples of the resin include polyester, polyolefin, polyamide, polyimide, aramid, epoxy, polycarbonate, and an acrylic resin. Additionally, as a normal non-flexible substrate, a glass substrate, a quartz substrate, a semiconductor substrate, or the like can be used.

<Structure Example of Electronic Device>

A semiconductor device of one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the semiconductor device of one embodiment of the present invention, cellular phones, portable game machines, portable information terminals, electronic books, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 34A to 34F illustrate specific examples of these electronic devices.

Figure 34A:
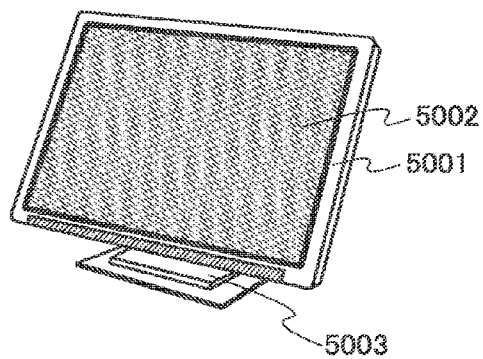
FIGS. 34A to 34F each illustrate a structure example of an electronic device.

FIG. 34A illustrates a display device including a housing 5001, a display portion 5002, a supporting base 5003, and the like. The semiconductor device of one embodiment of the present invention can be used for the display portion 5002. Note that the category of the display device includes all the display devices for displaying information, such as display devices for a personal computer, TV broadcast reception, advertisement display, and the like.

Figure 34B:
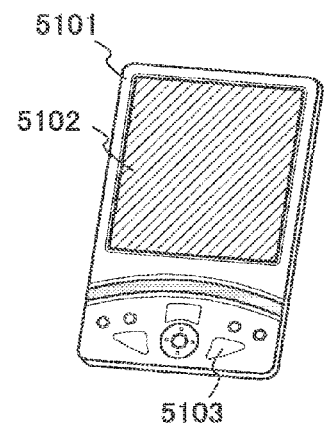

FIG. 34B illustrates a portable information terminal including a housing 5101, a display portion 5102, operation keys 5103, and the like. The semiconductor device of one embodiment of the present invention can be used for the display portion 5102.

Figure 34C:
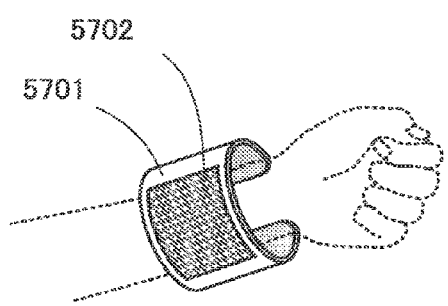

FIG. 34C illustrates a display device, which includes a housing 5701 having a curved surface, a display portion 5702, and the like. When a flexible substrate is used for the semiconductor device of one embodiment of the present invention, it is possible to use the semiconductor device for the display portion 5702 supported by the housing 5701 having a curved surface. Consequently, it is possible to provide a user-friendly display device that is flexible and lightweight.

Figure 34D:
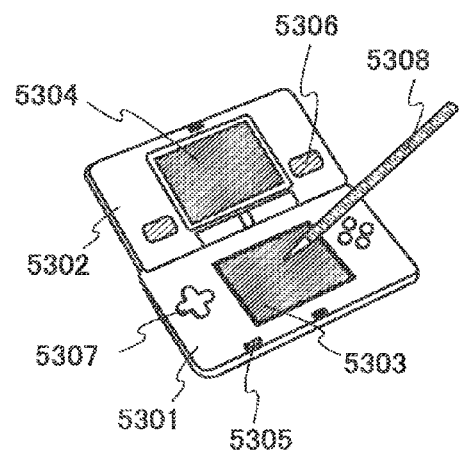

FIG. 34D illustrates a portable game machine that includes a housing 5301, a housing 5302, a display portion 5303, a display portion 5304, a microphone 5305, a speaker 5306, an operation key 5307, a stylus 5308, and the like. The semiconductor device of one embodiment of the present invention can be used for the display portion 5303 or the display portion 5304. When the semiconductor device of one embodiment of the present invention is used for the display portion 5303 or the display portion 5304, it is possible to provide a user-friendly portable game machine with quality that hardly deteriorates. Although the portable game machine in FIG. 34D has the two display portions 5303 and 5304, the number of display portions included in the portable game machine is not limited to two.

Figure 34E:
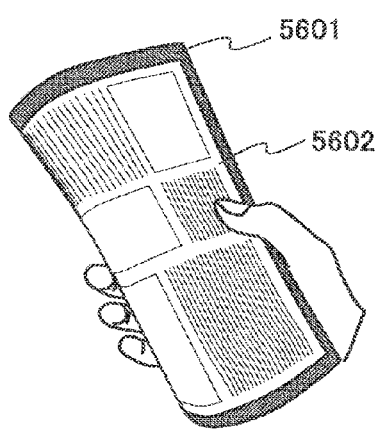

FIG. 34E illustrates an e-book reader, which includes a housing 5601, a display portion 5602, and the like. The semiconductor device of one embodiment of the present invention can be used for the display portion 5602. When a flexible substrate is used, the semiconductor device can have flexibility, so that it is possible to provide a user-friendly e-book reader that is flexible and lightweight.

Figure 34F:
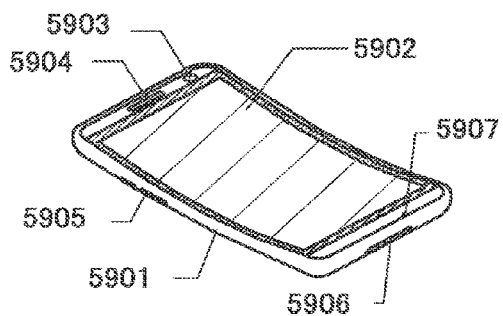

FIG. 34F illustrates a cellular phone, which includes a display portion 5902, a microphone 5907, a speaker 5904, a camera 5903, an external connection port 5906, and an operation button 5905 in a housing 5901. It is possible to use the semiconductor device of one embodiment of the present invention for the display portion 5902. When the semiconductor device of one embodiment of the present invention is provided over a flexible substrate, the semiconductor device can be used for the display portion 5902 having a curved surface, as illustrated in FIG. 34F.

Embodiment 5

In this embodiment, an oxide semiconductor film used in the OS transistor is described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. A CAAC-OS film and a microcrystalline oxide semiconductor film are described below.

<CAAC-OS>

A CAAC-OS is an oxide semiconductor having a plurality of c-axis aligned crystal parts. Note that a CAAC-OS can be referred to as an oxide semiconductor including c-axis aligned nanocrystals (CANC). In a combined analysis image (also referred to as a high-resolution TEM image) of a bright-field image and a diffraction pattern of a CAAC-OS, which is obtained using a transmission electron microscope (TEM), a plurality of crystal parts can be observed; however, a boundary between crystal parts, that is, a grain boundary is not clearly observed. Thus, in the CAAC-OS, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

According to the high-resolution TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

FIG. 35A shows a high-resolution TEM image of a cross section of the CAAC-OS film which is observed from a direction substantially parallel to the sample surface. FIG. 35B is a high-resolution TEM image obtained by enlarging the image of FIG. 35A. In FIG. 35B, atomic arrangement is highlighted for easy understanding.

FIG. 35C is local Fourier transform images of regions each surrounded by a circle (the diameter is about 4 nm) between A and O and between O and A' in FIG. 35A. C-axis alignment can be observed in each region in FIG. 35C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 36A).

From the high-resolution TEM images, alignment is found in the crystal parts in the CAAC-OS film.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, in the high-resolution TEM image of the CAAC-OS film observed in a direction substantially perpendicular to the sample surface, a crystal region with an area of 2500 $nm_2$ or more, 5 $\mu m^2$ or more, or 1000 $\mu m^2$ or more is observed in some cases.

A CAAC-OS is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, in structural analysis of the CAAC-OS by an in-plane method in which an X-ray is incident on a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS analyzed by an out-of-plane method, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is trapped therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In a transistor using the CAAC-OS film, a change in electrical characteristics due to irradiation with visible light or ultraviolet light is small.

<Microcrystalline Oxide Semiconductor Film>

A microcrystalline oxide semiconductor has a region in which a crystal part is observed and a region in which a crystal part is not clearly observed in a high-resolution TEM image. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases (see FIG. 36B).

Since there is no regularity of crystal orientation between the crystal parts as mentioned above, the nc-OS can also be referred to as an oxide semiconductor including random aligned nanocrystals (RANC) or an oxide semiconductor including non-aligned nanocrystals (NANC). The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 36A:
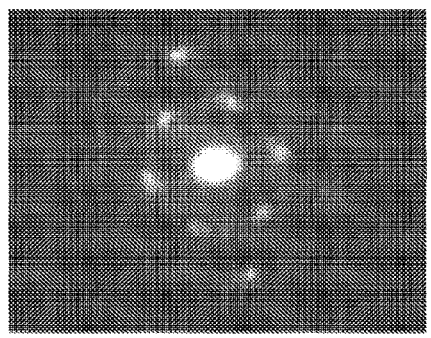
FIGS. 36A and 36B show nanobeam electron diffraction patterns of oxide semiconductor films and FIGS. 36C and 36D illustrate a structure example of a transmission electron diffraction measurement apparatus.
Figure 36B:
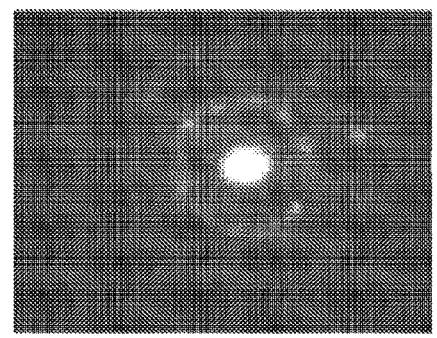
Figure 36C:
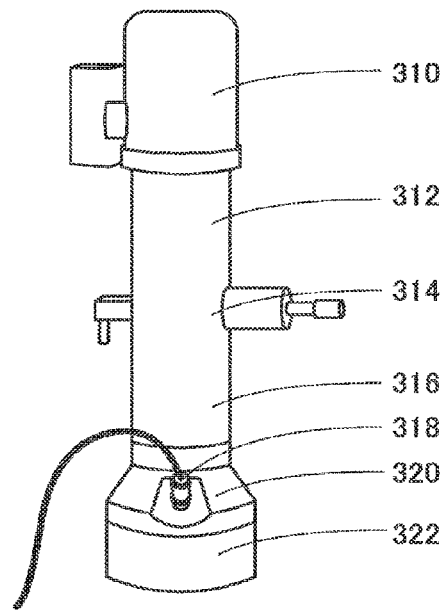

FIG. 36C illustrates a transmission electron diffraction measurement apparatus which includes an electron gun chamber 310, an optical system 312 below the electron gun chamber 310, a sample chamber 314 below the optical system 312, an optical system 316 below the sample chamber 314, an observation chamber 320 below the optical system 316, a camera 318 installed in the observation chamber 320, and a film chamber 322 below the observation chamber 320. The camera 318 is provided to face toward the inside of the observation chamber 320. Note that the film chamber 322 is not necessarily provided.

Figure 36D:
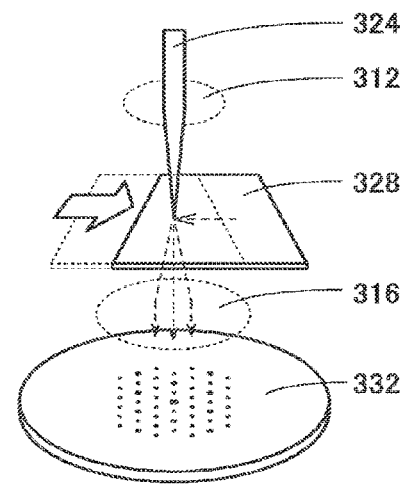

FIG. 36D illustrates an internal structure of the transmission electron diffraction measurement apparatus illustrated in FIG. 36C. In the transmission electron diffraction measurement apparatus, a substance 328 which is positioned in the sample chamber 314 is irradiated with electrons emitted from an electron gun installed in the electron gun chamber 310 through the optical system 312. Electrons passing through the substance 328 enter a fluorescent plate 332 provided in the observation chamber 320 through the optical system 316. On the fluorescent plate 332, a pattern corresponding to the intensity of the incident electron appears, which allows measurement of a transmission electron diffraction pattern.

The camera 318 is installed so as to face the fluorescent plate 332 and can take a picture of a pattern appearing in the fluorescent plate 332. An angle formed by a straight line which passes through the center of a lens of the camera 318 and the center of the fluorescent plate 332 and an upper surface of the fluorescent plate 332 is, for example, 15° or more and 80° or less, 30° or more and 75° or less, or 45° or more and 70° or less. As the angle is reduced, distortion of the transmission electron diffraction pattern taken by the camera 318 becomes larger. Note that if the angle is obtained in advance, the distortion of an obtained transmission electron diffraction pattern can be corrected. Note that the film chamber 322 may be provided with the camera 318. For example, the camera 318 may be set in the film chamber 322 so as to be opposite to the incident direction of electrons 324. In this case, a transmission electron diffraction pattern with less distortion can be taken from the rear surface of the fluorescent plate 332.

A holder for fixing the substance 328 that is a sample is provided in the sample chamber 314. The holder transmits electrons passing through the substance 328. The holder may have, for example, a function of moving the substance 328 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 328.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 324 that are a nanobeam in the substance, as illustrated in FIG. 36D. At this time, when the substance 328 is a CAAC-OS film, a diffraction pattern shown in FIG. 36A is observed. When the substance 328 is an nc-OS film, a diffraction pattern shown in FIG. 36B is observed.

Even when the substance 328 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

FIG. 37A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at high temperatures (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

FIGS. 37B and 37C are plan-view TEM images of the CAAC-OS film obtained just after the deposition and the CAAC-OS film subjected to the heat treatment at 450° C., respectively. Comparison between FIGS. 37B and 37C shows that the CAAC-OS film subjected to the heat treatment at 450° C. has more uniform film quality. That is, the heat treatment at high temperatures improves the film quality of the CAAC-OS film.

With such a measurement method, the structure of an oxide semiconductor film having a plurality of structures can be analyzed in some cases.

This application is based on Japanese Patent Application serial no. 2013-257517 filed with Japan Patent Office on Dec. 12, 2013, the entire contents of which are hereby incorporated by reference.

What is claimed is:

1. A display device comprising:
a circuit comprising a first transistor;
a first pixel and a second pixel; and
a first wire, a second wire, and a third wire, wherein the first wire, the second wire and the third wire are electrically connected to the circuit,
wherein the second wire is electrically connected to the first pixel,
wherein the third wire is electrically connected to the second pixel,
wherein the circuit is configured to distribute a signal from the first wire to the second wire and the third wire,
wherein the first transistor comprises a first oxide semiconductor film and a second oxide semiconductor film on the first oxide semiconductor film, and
wherein an atomic ratio of indium in the first oxide semiconductor film is different from an atomic ratio of indium in the second oxide semiconductor film.

2. The display device according claim 1,
wherein an atomic ratio of indium in the first oxide semiconductor film is larger than an atomic ratio of indium in the second oxide semiconductor film.

3. The display device according claim 1,
wherein the first transistor comprises a third oxide semiconductor film on an insulating layer, and
wherein the second oxide semiconductor film is interposed between the second oxide semiconductor film and the third oxide semiconductor film.

4. The display device according claim 3,
wherein an atomic ratio of indium in the first oxide semiconductor film is larger than an atomic ratio of indium in the second oxide semiconductor film and an atomic ratio of indium in the third oxide semiconductor film.

5. The display device according claim 1,
wherein the first transistor comprises a first gate electrode and a second gate electrode,
wherein the first oxide semiconductor film and the second oxide semiconductor film is interposed between the first gate electrode and the second gate electrode.

6. The display device according claim 1,
wherein each the first pixel and the second pixel comprises a second transistor,
wherein the second transistor comprises a fourth oxide semiconductor film, and
wherein the atomic ratio of indium in the fourth oxide semiconductor film is the same as the atomic ratio of indium in the second oxide semiconductor film.

7. The display device according to claim 6,
wherein a field-effect mobility of the first transistor is greater than a field-effect mobility of the second transistor.

8. A display device comprising:
a circuit comprising a first transistor;
a first pixel and a second pixel, wherein each the first pixel and the second pixel comprises a second transistor; and
a first wire, a second wire, and a third wire, wherein the first wire, the second wire and the third wire are electrically connected to the circuit,
wherein the second wire is electrically connected to the first pixel,
wherein the third wire is electrically connected to the second pixel,
wherein the circuit is configured to distribute a signal from the first wire to the second wire and the third wire,
wherein the first transistor comprises a first oxide semiconductor film and a second oxide semiconductor film on the first oxide semiconductor film,
wherein an atomic ratio of indium in the first oxide semiconductor film is different from an atomic ratio of indium in the second oxide semiconductor film,
wherein the second transistor comprises a fourth oxide semiconductor film, and
wherein the atomic ratio of indium in the fourth oxide semiconductor film is the same as the atomic ratio of indium in the second oxide semiconductor film.

9. The display device according claim 8,
wherein an atomic ratio of indium in the first oxide semiconductor film is larger than an atomic ratio of indium in the second oxide semiconductor film.

10. The display device according claim 8,
wherein the first transistor comprises a third oxide semiconductor film on an insulating layer, and
wherein the second oxide semiconductor film is interposed between the second oxide semiconductor film and the third oxide semiconductor film.

11. The display device according claim 10,
wherein an atomic ratio of indium in the first oxide semiconductor film is larger than an atomic ratio of indium in the second oxide semiconductor film and an atomic ratio of indium in the third oxide semiconductor film.

12. The display device according claim 8,
wherein the first transistor comprises a first gate electrode and a second gate electrode,
wherein the first oxide semiconductor film and the second oxide semiconductor film is interposed between the first gate electrode and the second gate electrode.

13. The display device according to claim 8,
wherein a field-effect mobility of the first transistor is greater than a field-effect mobility of the second transistor.

14. A display device comprising:
a circuit comprising a first transistor;
a first pixel and a second pixel; and
a first wire, a second wire, and a third wire, wherein the first wire, the second wire and the third wire are electrically connected to the circuit,
wherein the second wire is electrically connected to the first pixel,
wherein the third wire is electrically connected to the second pixel,
wherein the circuit is configured to distribute a signal from the first wire to the second wire and the third wire,
wherein the first transistor comprises:
a gate electrode;
a first oxide semiconductor film;
an insulating layer interposed between the gate electrode and the first oxide semiconductor film; and
a second oxide semiconductor film on the first oxide semiconductor film, and
wherein an atomic ratio of indium in the first oxide semiconductor film is different from an atomic ratio of indium in the second oxide semiconductor film.

15. The display device according claim 14,
wherein an atomic ratio of indium in the first oxide semiconductor film is larger than an atomic ratio of indium in the second oxide semiconductor film.

16. The display device according claim 14,
wherein the first transistor comprises a third oxide semiconductor film on the insulating layer, and
wherein the second oxide semiconductor film is interposed between the second oxide semiconductor film and the third oxide semiconductor film.

17. The display device according claim 16,
wherein an atomic ratio of indium in the first oxide semiconductor film is larger than an atomic ratio of indium in the second oxide semiconductor film and an atomic ratio of indium in the third oxide semiconductor film.

18. The display device according claim 14,
wherein the first transistor comprises a first gate electrode and a second gate electrode,
wherein the first oxide semiconductor film and the second oxide semiconductor film is interposed between the first gate electrode and the second gate electrode.

19. The display device according claim 14,
wherein each the first pixel and the second pixel comprises a second transistor,
wherein the second transistor comprises a fourth oxide semiconductor film, and
wherein the atomic ratio of indium in the fourth oxide semiconductor film is the same as the atomic ratio of indium in the second oxide semiconductor film.

20. The display device according to claim 19,
wherein a field-effect mobility of the first transistor is greater than a field-effect mobility of the second transistor.

* * * * *